United States Patent [19]

Vinal

[11] Patent Number: 5,384,730
[45] Date of Patent: Jan. 24, 1995

[54] COINCIDENT ACTIVATION OF PASS TRANSISTORS IN A RANDOM ACCESS MEMORY

[75] Inventor: Albert W. Vinal, Cary, N.C.

[73] Assignee: Thunderbird Technologies, Inc., Research Triangle Park, N.C.

[21] Appl. No.: 216,776

[22] Filed: Mar. 23, 1994

Related U.S. Application Data

[63] Continuation of Ser. No. 940,299, Sep. 3, 1992, abandoned, which is a continuation-in-part of Ser. No. 742,649, Aug. 7, 1991, Pat. No. 5,305,269, which is a continuation-in-part of Ser. No. 708,459, May 31, 1991, Pat. No. 5,304,874.

[51] Int. Cl.$^6$ ............................................. G11C 11/00
[52] U.S. Cl. ............................ 365/156; 365/189.05; 365/190
[58] Field of Search ............... 365/154, 156, 189.04, 365/189.05, 189.07, 190, 230.03, 230.05, 230.08

[56] References Cited

U.S. PATENT DOCUMENTS

| | | | |
|---|---|---|---|
| 3,629,612 | 12/1971 | Harbert | 365/203 |
| 3,638,202 | 1/1972 | Schroeder | 365/72 |
| 3,893,087 | 7/1975 | Baker | 365/182 |
| 4,733,112 | 3/1988 | Yamaguchi | 307/530 |
| 4,825,098 | 4/1989 | Aoyama | 365/154 |
| 4,831,287 | 5/1989 | Golab | 307/530 |
| 4,843,264 | 6/1989 | Galbraith | 307/530 |
| 4,845,672 | 7/1989 | Watanabe et al. | 365/190 |
| 4,845,676 | 7/1989 | Lohlein et al. | 365/154 |
| 4,866,674 | 9/1989 | Tran | 365/189.11 |
| 4,893,278 | 1/1990 | Ito | 365/203 |
| 4,901,284 | 2/1990 | Ochii et al. | 365/226 |
| 4,914,634 | 4/1990 | Akrout et al. | 365/233 |
| 4,975,877 | 12/1990 | Bell | 365/189.01 |
| 4,995,001 | 2/1991 | Dawson et al. | 365/154 |
| 5,163,022 | 11/1992 | Homma et al. | 365/190 |

FOREIGN PATENT DOCUMENTS

3259495 11/1991 Japan.

OTHER PUBLICATIONS

*8ns CMOS 64kx4 and 256x1 SRAMs,* S. Flannagan et al., 1990 IEEE International Solid-State Circuits Conference, pp. 134-135, 282, 100-101.
*Current-Mode Techniques for High-Speed VLSI Circuits with Application to Current Sense Amplifier for CMOS SRAMs,* E. Seevinck et al., IEEE Journal of Solid-State Circuits, vol. 26, No. 4, Apr. 1991, pp. 525-535.

*Primary Examiner*—Joseph A. Popek
*Attorney, Agent, or Firm*—Bell, Seltzer, Park & Gibson

[57] ABSTRACT

The pass transistors in a random access memory array are activated only upon coincident (simultaneous) selection of both the associated row and the associated column of the memory cell; otherwise, activation of the pass transistors is prevented. Thus, when a word line is selected, only the pass transistors in the memory cell corresponding to a simultaneously selected bit line is active, rather than all of the pass transistors pairs connected to the word line. Transient power consumption during word line selection and deselection is thereby reduced. Coincident pass transistor activation may be obtained by providing a column select line for each column of the memory array, and gating means in each cell which electrically activates the associated pass transistors only upon simultaneous selection of the associated column select line and the associated word line, and for preventing activation of the associated pass transistors otherwise. When the column select lines and gating means are used, shared bit lines may be provided in the array. A single shared bit line may be used between adjacent columns of cells since only one of the columns will be selected by the column select line. A high density memory design is therefore provided.

48 Claims, 35 Drawing Sheets

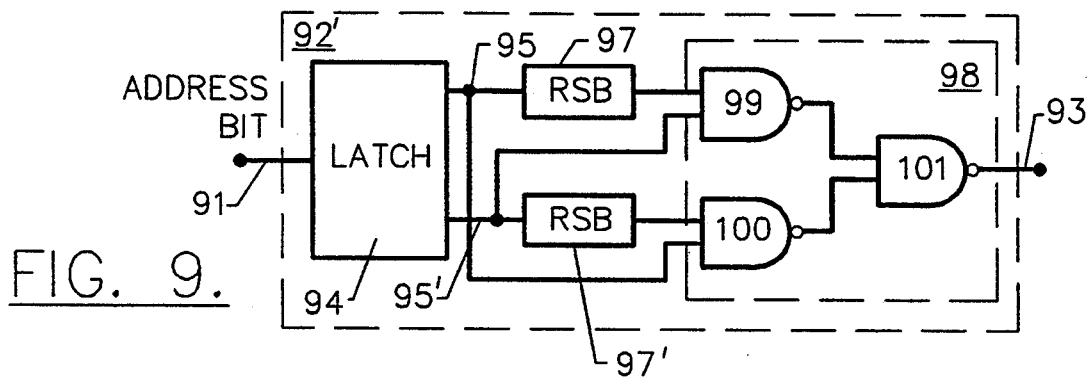
FIG. 9.
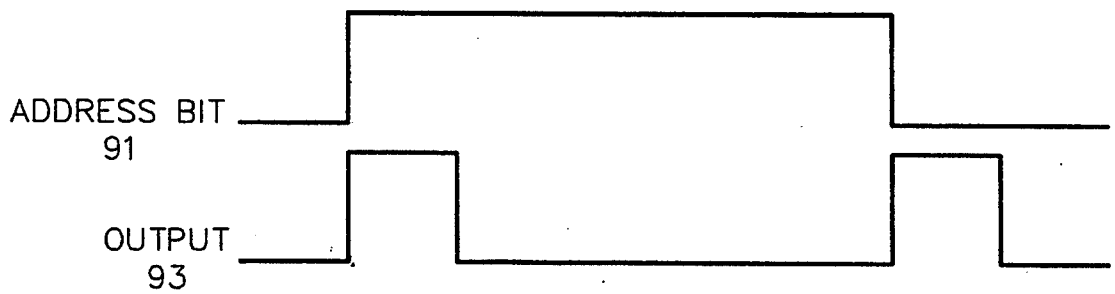
FIG. 10.
TRUTH TABLE: TDLU 92 (FIG. 8)
| LATCH OUTPUT TRANSITION | | NAND GATE OUTPUTS | | |
|---|---|---|---|---|
| 95 | 95' | 99 | 100 | 101 |
| 1→0 | 0→1 | NO PULSE | DOWN PULSE | UP PULSE |
| 0→1 | 1→0 | DOWN PULSE | NO PULSE | UP PULSE |
| NONE | NONE | NO PULSE | NO PULSE | DOWN PULSE |
FIG. 11A.
TRUTH TABLE: TDLU 92' (FIG. 9)
| LATCH OUTPUT TRANSITION | | NAND GATE OUTPUTS | | |
|---|---|---|---|---|
| 95 | 95' | 99 | 100 | 101 |
| 0→1 | 1→0 | NO PULSE | DOWN PULSE | UP PULSE |
| 1→0 | 0→1 | DOWN PULSE | NO PULSE | UP PULSE |
| NONE | NONE | NO PULSE | NO PULSE | DOWN PULSE |
FIG. 11B.

FROM FIG. 22A.

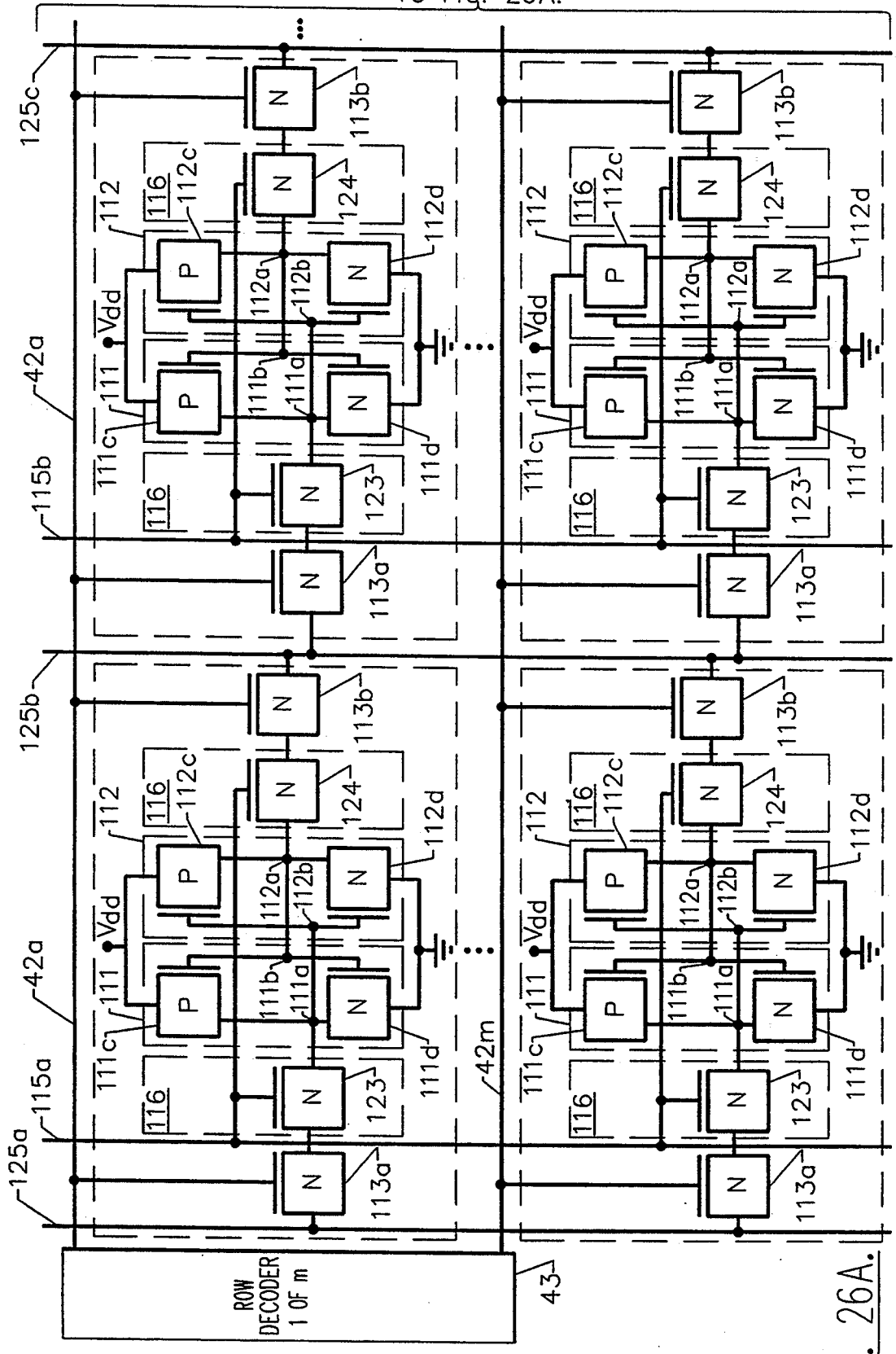

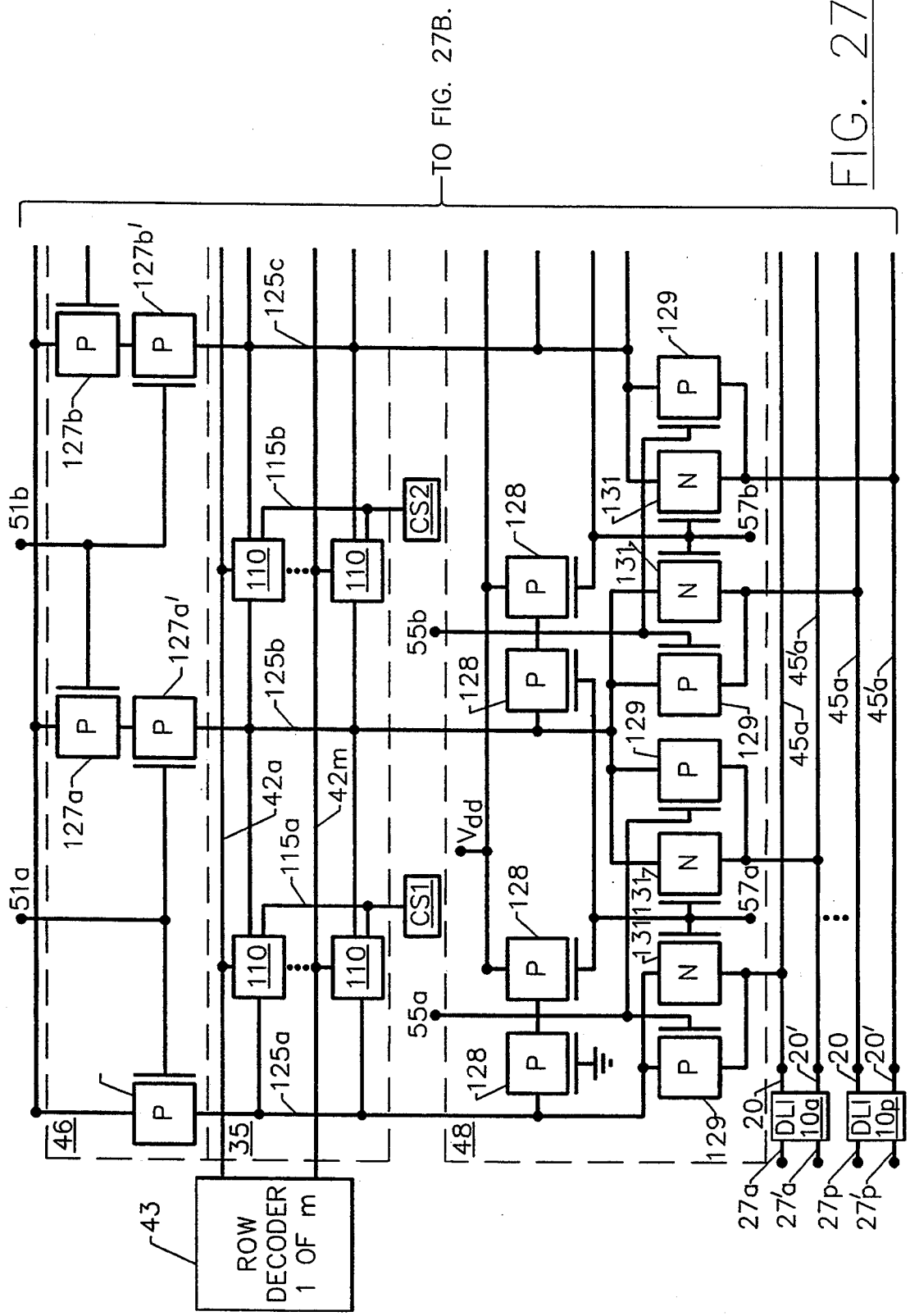

COINCIDENT ACTIVATION OF PASS TRANSISTORS IN A RANDOM ACCESS MEMORY

CROSS REFERENCE TO RELATED APPLICATIONS

This is a continuation of co-pending application Ser. No. 07/940,299 filed on Sep. 3, 1992, now abandoned which is a continuation-in-part of copending application Ser. No. 07/742,649, filed Aug. 7, 1991, now U.S. Pat. No. 5,305,269, which is itself a continuation-in-part of copending application Ser. No. 07/708,459, filed May 31, 1991, now U.S. Pat. No. 5,304,874.

FIELD OF THE INVENTION

This invention relates to semiconductor memory devices and more particularly to high speed, high density, low power random access memories.

BACKGROUND OF THE INVENTION

Read/write memories, also referred to as Random Access Memories (RAM) are widely used to store programs and data for microprocessors and other electronic devices. The availability of high speed, high density and low power RAM devices has played a crucial role in the price reduction of personal computers and in the integration of computer technology into consumer electronic devices.

A typical RAM includes a large number of memory cells arranged in an array of rows and columns. Each memory cell is typically capable of storing therein a binary digit, i.e. a binary ONE or a binary ZERO. Each row of the memory cell array is typically connected to a word line and each column of the memory cell array is typically connected to a pair of bit lines. Read and write operations are performed on an individual cell in the memory by addressing the appropriate row of the array using the word lines and addressing the appropriate cell in the addressed row using the bit lines. Depending upon the signals applied to the bit lines, a write operation may be performed for storing binary data in the RAM or a read operation may be performed for accessing binary data which is stored in the RAM. When read and write operations are not being performed, the RAM is typically placed in an idle operation for maintaining the binary data stored therein.

RAMs are typically divided into two general classes, depending upon the need to refresh the data stored in the RAM during the idle state. In particular, in a Dynamic Random Access Memory (DRAM), the data stored in the memory is lost unless the memory is periodically refreshed during the idle operation. In contrast, in a Static Random Access Memory (SRAM) there is no need to refresh the data during an idle operation, because the data stored therein is maintained as long as electrical power is supplied to the SRAM. In the present state of the art, it is generally possible to fabricate higher density DRAM arrays than SRAM arrays because the individual memory cells of a DRAM include fewer transistors than the individual cells of an SRAM. However, SRAMs tend to operate at higher speeds than DRAMs, because there is no need to refresh the data stored therein. Accordingly, both SRAMs and DRAMs are typically used in computer systems, with the SRAMs being used for high speed memory (often referred to as "cache" memory), while the DRAM is typically used for lower speed, lower cost mass memory.

Three general design criteria govern the performance of random access memories. They are density, speed and power dissipation. Density describes the number of memory cells that can be formed on a given integrated circuit chip. In general, as more cells are fabricated on a Very Large Scale Integration (VLSI) chip, cost is reduced and speed is increased.

The performance of random access memories is also limited by the power consumption thereof. As power consumption increases, more sophisticated packaging is necessary to allow the integrated circuit to dissipate the high power. Moreover, high power circuits require expensive power supplies, and limit applicability to portable or battery powered devices.

Finally, speed is also an important consideration in the operation of a random access memory because the time it takes to reliably access data from the memory and write data into the memory is an important parameter in the overall system speed. It will be understood by those having skill in the art that the parameters of speed, density and power dissipation are generally interrelated, with improvements in one area generally requiring tradeoffs in one or more of the other areas.

A typical SRAM cell is a six transistor cell. Four of the transistors form a pair of complementary inverters each of which includes an input and an output, with the input of the first complementary inverter being connected to the output of the second complementary inverter and the input of the second complementary inverter being connected to the output of the first complementary inverter. The pair of cross coupled inverters forms a latch for storing a binary digit therein as long as power is applied to the latch. The fifth and sixth transistors are a pair of "pass transistors" which provide external access to the memory cell for reading and writing operations. Typically, the controlled electrodes, (for example the source and drain electrodes) of the first pass transistor are serially connected between one of the associated bit lines and the output of the first complementary inverter, and the controlled electrodes of the second pass transistor are connected between the other associated bit line and the output of the second complementary inverter. The controlling electrodes (for example gate electrodes) of both pass transistors are connected to the associated word line. Thus, the pass transistors of all SRAM cells in a row of the array are connected to the associated word line, and the pass transistors of all SRAM cells in a column of the array are connected to the associated pair of bit lines.

In operation, when a word line is selected, one of the pass transistors in each of the cells in the selected row sink current from the associated bit line. The pass transistor in the cell which sinks the current will be dependent on the digital state of the RAM cell, but one pass transistor in each cell will sink current. After the word line is deselected, all of the bit lines are recharged up to a reference voltage, typically the power supply voltage $V_{DD}$.

Unfortunately, the above described current sinking and bit line recharging in each cell connected to a selected word line consumes an excessive amount of power during read and write operations. For example, assume there are 256 columns in an SRAM array, so 256 pass transistor pairs are connected to each row. If the sink current for each pass transistor pair is 1 mA, then 256 mA is drawn upon selection of a word line and another 256 mA is drawn upon deselection of the word line. Although this power drain is a transitory power drain, which only occurs during selection and deselection of a word line, it nonetheless effects the transient power consumption of the SRAM.

Attempts have been made to decrease the transient power consumed during a word select/deselect operation by dividing the SRAM array into a plurality of smaller arrays, thus reducing the number of pass transistor pairs connected to any single word line. Unfortunately, word decoding time increases when the array is divided. The physical size of the array also increases, resulting in a decrease in density. Additional address line capacitance is also introduced, thereby increasing the power dissipation to the array, and a corresponding loss in speed.

SUMMARY OF THE INVENTION

It is therefore an object of the present invention to provide an improved random access memory cell and an improved random access memory using same.

It is another object of the invention to provide a memory array which consumes less power than conventional arrays during word line selection/deselection.

It is yet another object of the invention to provide a high density, high speed, low transient power random access memory design.

These and other objects are provided according to the present invention by activating the pass transistors in a random access memory (RAM) cell only upon coincident (simultaneous) selection of both the associated row and the associated column of the memory cell, and preventing activation of the pass transistors in a memory cell otherwise. Coincident pass transistor activation means is provided for activating only those pass transistors in memory cells which are at an intersection of a selected row and a selected column, and for preventing activation of the pass transistors in memory cells which are not at an intersection of a selected row and a selected column of the array of memory cells. In a conventional RAM in which only one cell in the array is read or written at a given time, a pass transistor in only one of the memory cells is activated at any given time, with the pass transistors in the other memory cells being deactivated. Thus, when a word line is selected, only the pass transistors in the memory cell coupled to the simultaneously selected bit line are active, rather than all of the pass transistor pairs connected to the word line being active. Accordingly, in a RAM array having 256 columns of cells, transient power consumption during word line selection and deselection is reduced by a factor of 255. Subdivision of the array, with the resulting loss of density and speed, is not required.

Coincident pass transistor activation according to the present invention may be obtained by providing a column select line for each column of the memory array. Word decoders and column decoders simultaneously select at least one of the plurality of word lines and at least one of the plurality of column select lines. Each cell also includes gating means, which is electrically connected to at least one of the associated column select line, the associated word line and the associated pass transistors. The gating means electrically activates the associated pass transistors only upon simultaneous selection of the associated column select line and the associated word line, and prevents activation of the associated pass transistors otherwise.

The gating means in each memory cell may be implemented in many ways. Preferably, the gating means is a third complementary transistor inverter which is connected between one of the associated row select line or column select line, and a reference voltage such as ground. Thus, each cell is preferably an eight transistor cell; four transistors for the latch, two pass transistors and two transistors for the gating means. The output of the third complementary inverter is connected to the controlling electrodes (for example gates) of the pair of pass transistors. The input of the third inverter is connected to the other of the column select line or row select line. Thus, when a row is selected, the pass transistors are not activated unless the associated column is also selected. Accordingly, the gating means provides a logical AND function, in which the pass transistors are activated only upon selection of the word line and column select line of the cell. In an alternate embodiment of the gating means, the complementary inverter may be replaced by a single transistor and resistor serially connected between the word line and a reference voltage.

In yet another embodiment of the gating means of the present invention, each cell is provided with a seventh and eighth transistor. The controlled electrodes (for example source and drain) of the first pass transistor and the seventh transistor are serially connected between the associated bit line and the output of the first complementary inverter. The controlled electrodes of the second pass transistor and the eighth transistor are serially connected between the associated bit line and the output of the second complementary inverter. The controlling (for example gate) electrode of one of the first pass transistor and the seventh transistor is connected to the word line, and the controlling electrodes of the other of the first pass transistor and the seventh transistor is connected to the associated column select line. The controlling electrode of one of the second pass transistor and the eighth transistor is connected to the associated word line and the controlling electrode of the other of the second pass transistor and the eighth transistor is connected to the associated column select line. Accordingly, the pass transistors are not activated unless the seventh and eighth transistors are activated by selection of the associated bit line.

As described above, a RAM cell according to the present invention will preferably use eight transistors rather than the six transistors typically used. However, in the preferred embodiment the additional transistors are minimum geometry transistors so that the size of the individual cells does not increase appreciably. Moreover, three unexpected advantages arise as a result of the use of the coincident selection means of the present invention: (1) increased speed due to reduced capacitance; (2) increased manufacturing yields; and (3) the ability to share bit lines.

Decreased capacitance is present because during a row select operation only diffusion capacitance of the gating means per column loads the word line, rather than gate capacitance of the two pass transistors per column. The loading capacitance on the word line driver is thus decreased significantly, resulting in faster operation. Increased manufacturing yields may be obtained because the memory only selects cells at the intersection of a selected row and column. Thus, it is easier to provide redundant cells to replace defective cells because the word driver need not address all cells in a row. Increased manufacturing yields may therefore be expected.

The third unexpected advantage of the coincident selection means of the present invention is the ability of the memory columns to share adjacent bit lines. In particular, in the conventional RAM architecture described above, each column includes a pair of bit lines which are used for column addressing as well as data reading and writing. However, since the coincident selection means of the present invention includes a column select line for each column of the array, a shared bit line may be used between adjacent columns of cells, since only one of the columns will be selected by the column select line.

In a conventional RAM architecture, shared bit lines would create erroneous operation. However, when the coincident selection means of the present invention is used, shared bit lines are possible. Accordingly, the SRAM of the present invention preferably includes a single bit line between each pair of adjacent columns of memory cells for transferring binary data to and from the memory cells, with the memory cells in each pair of adjacent columns being connected to the bit line therebetween. A high density memory design is therefore provided.

The coincident selection means of the present invention including shared bit lines may be used in any RAM design. However, the coincident selection and shared bit lines of the present invention are preferably used with the Differential Latching Inverter (DLI) of copending application Ser. Nos. 07/708,459 and 07/742,649, both entitled *Differential Latching Inverter and Random Access Memory Using Same,* hereinafter referred to as the "Parent Applications". As described in the Parent Applications, the Differential Latching Inverter (DLI) is responsive to the voltage on a pair of differential inputs thereto. The Differential Latching Inverter (DLI) may be connected to a pair of bit lines in a memory array, for sensing the binary state of the state of a selected memory cell. When one of the input signals to the DLI rise above a predetermined threshold, the DLI is responsive to a small differential component between the signals applied thereto to rapidly latch the output of the inverter to one logical state or another. For example, in a memory using five volt and ground reference voltages, when an input signal to the DLI is above one volt, and an input differential of at least two millivolts is present between the input signals, the DLI rapidly latches up to a first or a second logical value depending upon which of the inputs has the higher input differential.

The Differential Latching Inverter of the Parent Applications may be implemented using a minimal number of field effect transistors, as described below, and does not require the generation of a separate reference voltage or require high gain analog linear sense amplifiers for operation. Accordingly, high speed, low power, high density sensing of signals stored in a random access memory is provided.

A basic design of a Differential Latching Inverter of the Parent Applications includes a pair of complementary field effect transistor inverters, each of which is connected between first and second reference voltages, typically the power supply voltage $V_{DD}$ and ground, with each inverter including an input and an output. According to the Parent Applications, the FETs of each of the first and second complementary inverters are designed to produce an inverter transfer function which is skewed toward one of the first or second reference voltages. In other words, the inverters do not produce a symmetrical inverter transfer function relative to the first and second reference voltages. Rather, the transfer function is skewed toward one of the reference voltages. In a preferred embodiment, the voltage transfer function is skewed towards ground by a factor of $2\frac{1}{2}$ less than a symmetrical inverter, so that a voltage threshold of about one volt causes the inverter to rapidly change state, upon sensing a voltage differential of about two millivolts.

The first and second skewed inverters of the Parent Applications are cross coupled by connecting the input of the first inverter to the output of the second inverter and the input of the second inverter to the output of the first inverter, to thereby create a latch. A first bit line is connected to the input of the first inverter and a second bit line is connected to the input of the second inverter.

The Differential Latching Inverter (DLI) of the Parent Applications exhibits three states. When one or the other input to the DLI rises above the threshold voltage and an input differential of two millivolts or greater is found between the two bit line inputs, the DLI latches to a binary ONE or binary ZERO state. In a third or reset state, in which the bit line inputs thereto are both below the DLI's threshold voltage, both outputs of the DLI are ZERO. No DC power is dissipated by the DLI in either of its three stable states, and minimal power is dissipated by the DLI when it switches from one state to another.

The skewed transfer function, first and second complementary inverters of the DLI may be produced by controlling the dimensions of the complementary FET transistors of the skewed inverters so that the product of the square channel saturation current and the ratio of channel width to length of the FETs of a first conductivity type is substantially greater than the product of the square channel saturation current and the ratio of the channel width to length of the FETs of the second conductivity type. Preferably, the products of the square channel saturation current and the ratio of channel width to length differ by a factor of ten.

In a particular embodiment of the DLI, a pair of pull-up FETs may also be provided, with the controlled electrodes (source and drain) of a first pull up FET being connected between the first reference voltage and the output of the first complementary FET inverter, and the controlled electrodes of a second pull-up FET being connected between the first reference voltage and the output of the second complementary FET inverter. The controlling electrode (gate) of the first pull-up FET is connected to the output of the second complementary FET inverter and the controlling electrode of the second pull-up FET is connected to the output of the first complementary FET inverter. These cross coupled pull-up FETs increase the latching speed of the DLI.

The output of the first and second complementary inverters may be coupled to a third and a fourth complementary FET inverter, respectively. The third and fourth inverters produce an inverter voltage transfer function which is symmetrical between the first and second reference voltages. The outputs of the differential latching inverter are the outputs of the third and fourth complementary FET inverters.

The DLI may also include a second pull up circuit, which is connected to the outputs of the first and second skewed transfer function inverters, for rapidly pulling the outputs of the first and second inverters to the first reference voltage ($V_{DD}$), and thereby pulling the outputs of the third and fourth symmetrical transfer function inverters to the second reference voltage (ground) in response to an input signal applied thereto. The input signal is applied immediately upon a successful data read, or immediately upon verification of a successful data write, to rapidly bring the DLI to the third (reset) state and prepare the DLI for a next read or write operation. External clock timing is not required. Rather, the reset set is initiated internally, upon completion of a read or write operation.

The Differential Latching Inverter of the Parent Applications may be used in a high speed, high density, low power random access memory architecture as follows. An array of memory cells is arranged in a plurality of rows and columns, with a word line connected to each row and a pair of primary bit lines connected to each column. Signal bit lines are provided, orthogonal to the primary bit lines, and a respective pair of signal bit lines is connected to at least one respective pair of the primary bit lines at one end of the primary bit lines. A DLI is connected between each pair of signal bit lines.

The primary bit lines are coupled to a first reference voltage, typically power supply voltage $V_{DD}$, during the idle operation, and a selected one of the primary bit line pairs is decoupled from the first reference voltage during a write operation. The signal bit lines are coupled to a second reference voltage, preferably ground, during an idle operation and are decoupled from the second voltage during a read or write operation. The primary bit lines and the signal bit lines are coupled together during read and write operations and decoupled from one another during an idle operation.

The primary bit lines may be coupled to the first reference voltage using a first coupling means. The signal bit lines may be coupled to a second reference voltage using a second coupling means, and the primary bit lines and the signal bit lines may be coupled together using a third coupling means. In one embodiment, the third coupling means is located at the one end of the primary bit lines, adjacent the signal bit lines, and the first coupling means is located at the opposite end of the primary bit lines, distant from the signal bit lines.

It has been found, according to the Parent Applications, that improved results are obtained when both the first and the third coupling means are located at the one end of the primary bit lines, adjacent the signal bit lines. The voltage drop due to the resistance of the primary bit lines is eliminated, and the speed of the random access memory is increased. In this configuration, the primary bit lines operate as unterminated transmission lines. Feedback between the signal bit lines and either the first coupling means or the second coupling means, or both, may also be provided to further increase speed.

Accordingly, during an idle operation each of the primary bit line pairs is referenced to $V_{DD}$ and each of the signal bit line pairs is referenced to ground. All of the DLIs are in their third or reset state. In order to read, the signal bit lines are decoupled from the second voltage reference source (ground) and the primary bit lines remain coupled to the first voltage reference source ($V_{DD}$). A word decoder selects a given row. A bit decoder couples a primary bit line pair in a selected column to its associated signal bit line pair. The amount of voltage delivered to one bit line or the other of the selected primary bit line pair drops more rapidly than the other due to the current conducted by one of the memory cell pass transistors, as controlled by the state of the selected memory cell being read. This current differential translates to a voltage differential on one or the other of the signal bit lines of the associated signal bit line pair. When the voltage differential on one of the signal bit lines exceeds the DLI's threshold voltage, the DLI will rapidly latch into one or the other state depending on the signal bit line which had the higher voltage. Accordingly, high speed sensing of data read from a random access memory is provided with minimal supporting circuitry.

The outputs of all of the DLIs may be directly connected to a pair of OR gates, with the output of one OR gate signifying that a logical ONE has been read and the output of the second OR gate signifying that a logical ZERO has been read. Connection of all of the DLIs to a single OR gate for reading is possible because all of the DLIs which are not being read are in their third or reset state with both outputs thereof at ground potential. The output of the activated DLI may be placed in a read register and provided as the memory output. Once a DLI has been latched and the data has been read, the memory is rapidly restored to the idle state by pulling the active DLI back to its idle state. The signal bit lines are recoupled to ground, the primary bit lines remain coupled to $V_{DD}$ and the signal bit lines and primary bit lines are decoupled from one another. Accordingly, a self-timing operation is provided.

In a write operation, a word decoder selects a given row, a selected pair of primary bit lines is decoupled from $V_{DD}$ by a decoded write gate, and one selected primary bit line pair is coupled to an appropriate signal bit line pair. One of the signal bit lines is clamped at a LOW level thereby forcing the associated primary bit line towards ground. This forces one side of the selected memory cell towards ground while holding the other side to greater than $V_{DD}/2$, thereby storing data into the selected RAM cell. At the same time, the data written into the selected memory cell is also read by the associated DLI as described above. The successful read causes the memory to be reset in its idle state as described above.

According to another aspect of the Parent Applications a circuit may be used with the DLI and memory architecture described above, to detect an address change at the memory input and initiate a read or write operation. The address change detection system uses a transition detection delay unit for each address bit of the memory. The transition delay unit is responsive to a change in its associated address bit to provide a clock output pulse of predetermined duration.

The transition detection delay unit comprises a latch which is coupled to the associated address bit, and a pair of Delay Ring Segment Buffers each coupled to a respective output of the latch. The design and operation of the Delay Ring Segment Buffer is described in U.S. Pat. No. 5,030,853 dated Jul. 9, 1991 entitled *High Speed Logic and Memory Family Using Ring Segment Buffer* by the present inventor Albert W. Vinal, assigned to the assignee of the Parent Applications, the disclosure of which is hereby incorporated herein by reference. The output of the delay ring segment buffer is provided to cascaded NAND gates to form the output of the transition detection delay unit.

The outputs of all of the transition detection delay units are provided to an OR gate which is preferably a Complementary Logic Input Parallel (CLIP) OR gate, as described in application Ser. No. 07/648,219 entitled *Complementary Logic Input Parallel (CLIP) Logic Circuit Family* by the present inventor Albert W. Vinal and assigned to the assignee of the Parent Applications, the disclosure of which is incorporated herein by reference. The output of the CLIP OR gate provides an indication of an address change. Accordingly, the transition detection delay unit uses simple circuitry to detect an address change, with less time delay than known address change detection circuits. Similar transition detection is employed to detect a chip select active transition and a write enable transition. The outputs of these transition detect delay units are also coupled to the CLIP OR gate, and are also used to activate the memory cycle.

Once a change in the address has been detected, or a chip select or write enable signal has been detected, internal timing of the memory may be provided by a series of Delay Ring Segment Buffers. The Delay Ring Segment Buffers provide the required timing signals to word and bit decoders and the DLIs as described above. Once the data has been read, or data has been written and verified, the timing circuitry generates a reset signal to rapidly place the memory in the idle state. Self-timing of memory operations is thereby provided.

It will be understood by those having skill in the art that the Differential Latching Inverter of the Parent Applications may be used in conjunction with other memory architectures than described herein. Similarly, the memory architecture described herein may be used with sensing circuits other than the Differential Latching Inverter. Finally, the unique control circuits such as the address detection change circuits and the timing circuits using ring segment buffers, may be used to control memories other than those described herein. However, it will be also be understood by those having skill in the art that the unique combination of the DLI, memory architecture and supporting control circuitry described herein provides a high density, high speed random access memory with very low power dissipation.

BRIEF DESCRIPTION OF THE DRAWINGS

FIG. 9 illustrates a block diagram of an alternative address change detection circuit according to the Parent Applications.

FIG. 10 illustrates a timing diagram for operation of the address change detection circuits of FIGS. 8 and 9.

FIGS. 11A and 11B are truth tables to illustrate the operation of the address change detection circuits of FIGS. 8 and 9 respectively.

FIGS. 26A and 26B, which form FIG. 26 when placed adjacent one another as indicated, illustrate the memory array of FIG. 23, including shared bit lines according to the present invention.

FIGS. 27A and 27B, which form FIG. 27 when placed adjacent one another as indicated, illustrate modifications to the first coupling circuit and third coupling circuit of FIGS. 4A and 4B to accommodate the shared bit lines of FIGS. 24, 25 or 26.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

The design and operation of the random access memory of the Parent Applications will be described by first describing the Differential Latching Inverter (DLI). The overall architecture of the memory array including the Differential Latching Inverter will then be described, followed by the operation of the memory during idle, read and write cycles. The control circuits for performing the read, write and idle operations will then be described. Then, coincident pass transistor activation and bit line sharing according to the present invention will be described.

Differential Latching Inverter

Figure 1:
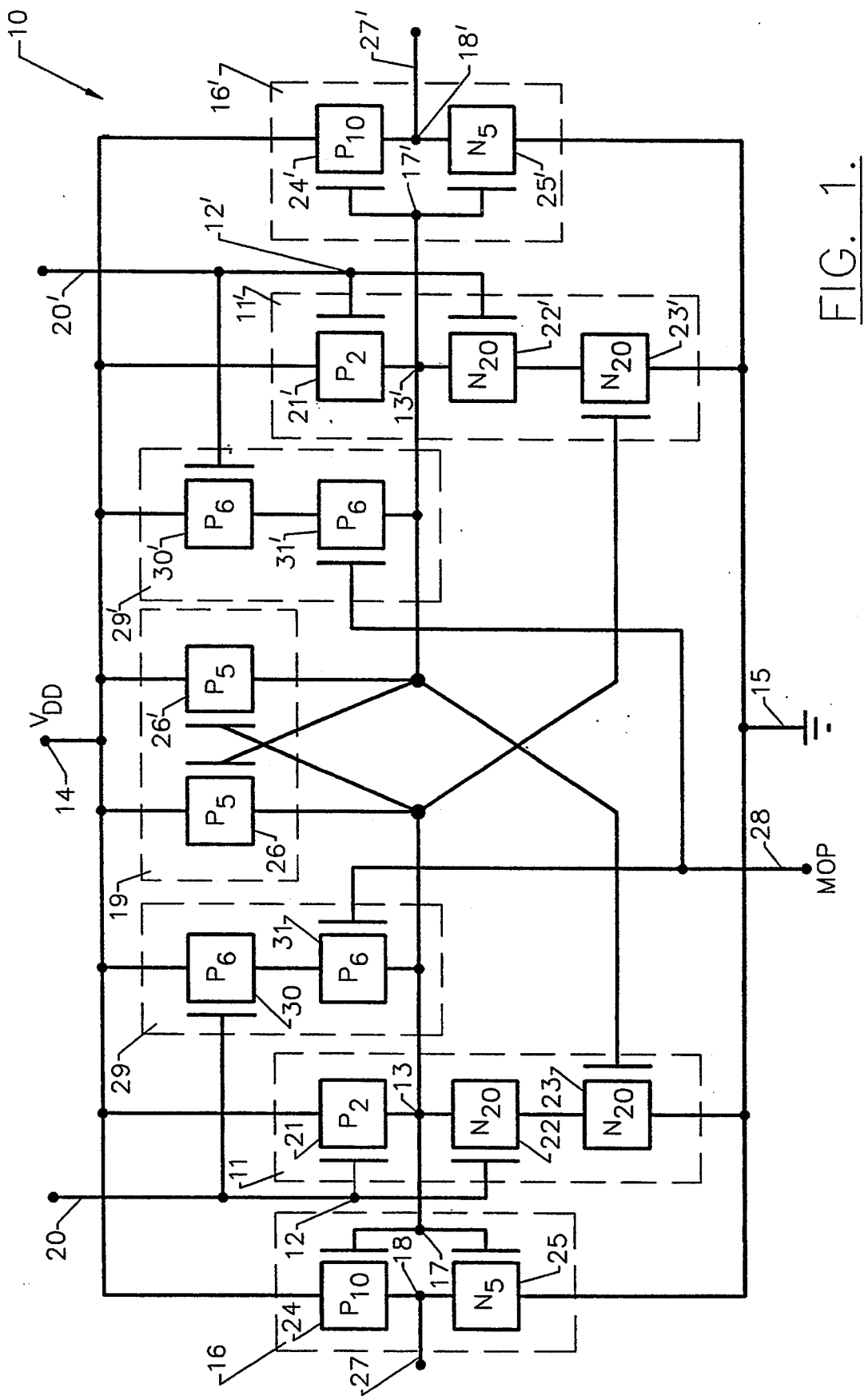
FIG. 1 illustrates a schematic circuit diagram of a Differential Latching Inverter according to the Parent Applications.

Referring now to FIG. 1, a Differential Latching Inverter (DLI) according to the Parent Applications will now be described. As shown in FIG. 1, DLI 10 includes a pair of cross coupled, skewed transfer function complementary field effect transistor inverters 11, 11'. The manner in which the skewed transfer function inverters are designed will be described below. When the input signals on one of bit lines 20 or 20' rise above the DLI's threshold voltage, and a small differential signal component, for example at least two millivolts, is present, a binary output latchup condition rapidly occurs that produces a binary ONE value at one of output terminals 27, 27' of the DLI and a binary ZERO value at the other one of output terminals 27, 27' of the DLI. The binary signal state of the selected RAM cell being read is determined by which output terminal 27, 27' of the DLI is HIGH.

The skewed inverters 11, 11' are connected between a first reference voltage 14 (here shown as power supply voltage $V_{DD}$) and a second reference voltage 15 (here shown as ground). The input 12, 12' of a respective inverter 11, 11' is connected to a respective one of a pair of bit lines 20, 20'. As also shown in FIG. 1, the skewed complementary inverters 11, 11' are cross coupled, with the output 13 of inverter 11 being connected to an input of inverter 11' and the output 13' of inverter 11' being connected to an input of inverter 11.

It will be understood by those having skill in the art that skewed complementary inverters 11, 11' may be formed using a pair of complementary (i.e. N-channel and P-channel) field effect transistors, with the inverter input being the gates of the transistors and the sources and drains of the transistors being serially connected between power supply and ground, and the inverter output being the connection node between the field effect transistors. However, a preferred embodiment of the skewed inverters 11, 11' is as illustrated in FIG. 1. As shown, each inverter comprises a first conductivity (P-channel) transistor 21, 21' and a pair of second conductivity (N-channel) transistors 22, 22' and 23, 23', respectively. The controlled electrodes of these transistors (drains and sources) are serially connected between the power supply 14 and ground 15. The gates of transistors 21 and 22 are coupled to bit line 20 and the output of the inverter 13 is the connection node between P-channel transistor 21 and N-channel transistor 22. Similar connections apply to inverter 11'. In order to cross couple the inverters, the output 13 of inverter 11 is coupled to the gate of transistor 23' and the output 13' of inverter 11' is coupled to the gate of transistor 23.

DLI 10 also includes an optional pair of symmetrical transfer function inverters 16, 16' with each symmetrical inverter 16, 16' comprising a pair of complementary transistors 24, 24' and 25, 25', connected between power supply voltage 14 and ground 15. The input 17, 17' of the symmetrical inverter 16, 16' is connected to the respective output 13, 13' of the skewed inverter 11, 11'. The outputs 18, 18' of the symmetrical inverter 16, 16' form the outputs 27, 27' of the DLI. The manner in which symmetrical inverters 16, 16' are designed will be described below.

DLI 10 also includes optional pull-up circuit 19. As shown, pull-up circuit transistors 26, 26' are connected between power supply 14 and the respective output 13, 13' of skewed inverter 11, 11'. The gates of pull up transistors 26, 26' are cross-coupled to the respective output 13, 13' of the skewed inverter 11, 11'.

Still referring to FIG. 1, an optional second set of 29, 29' of pull-up transistors is provided. Each optional second pull-up circuit 29, 29' includes a pair of transistors 30, 30' and 31, 31', serially coupled between power supply voltage 14 and a respective output 13, 13' of the skewed inverter 11, 11'. As shown, the gate of one transistor 30, 30' is connected to the respective bit line 20, 20' and the gates of the other transistors 31, 31' are coupled together to form a memory operation (MOP) input 28. The operation of this MOP input will be described in detail below. Briefly, during read or write operation, the MOP input 28 is high so that it doesn't effect operation of the DLI. However, at the conclusion of a read or write operation, the MOP input 28 is brought LOW to turn on the pull-up circuit 29, 29', and rapidly force nodes 13, 13' to $V_{DD}$, thereby forcing DLI outputs 27, 27' to ground.

Figure 2:
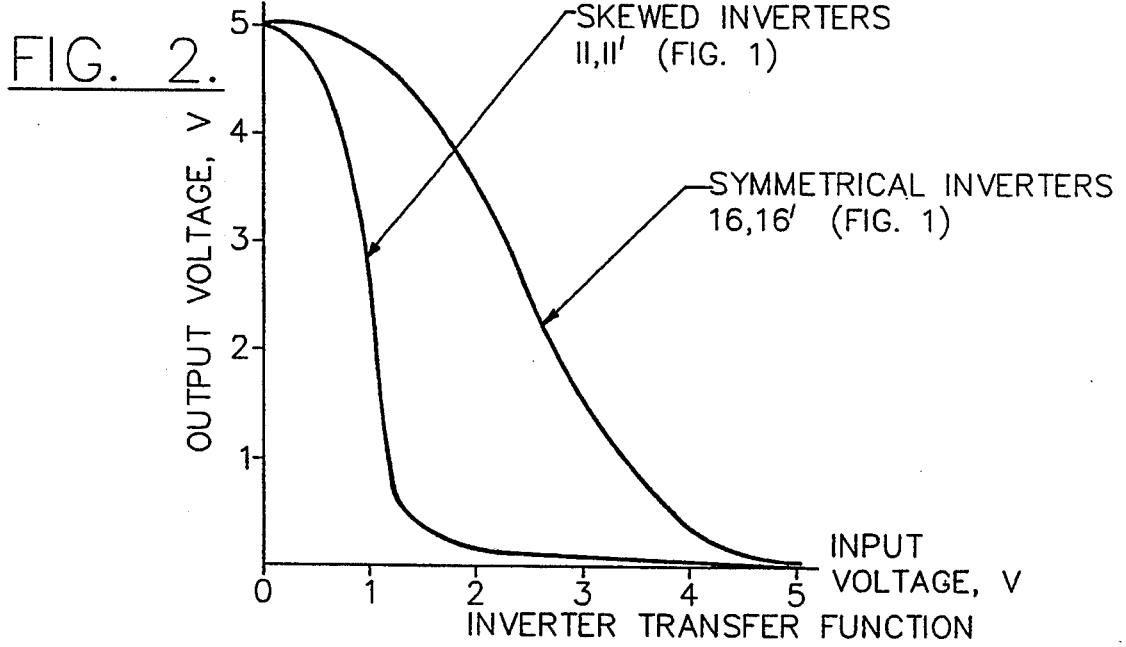
FIG. 2 illustrates the inverter transfer functions of the symmetrical inverters and the skewed inverters of the Differential Latching Inverter of FIG. 1.
Figure 3A:
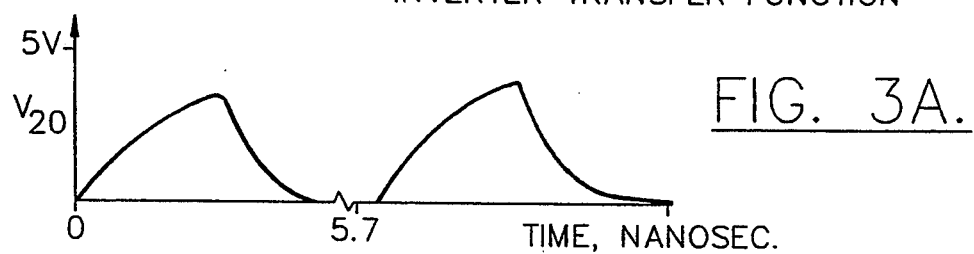
FIGS. 3A–3D illustrate timing diagrams for operation of the Differential Latching Inverter of FIG. 1.
Figure 3B:
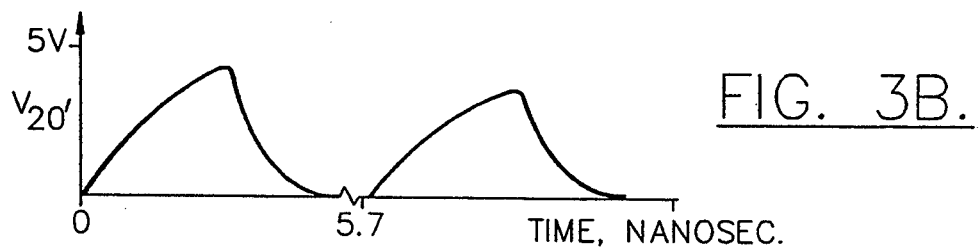
Figure 3C:
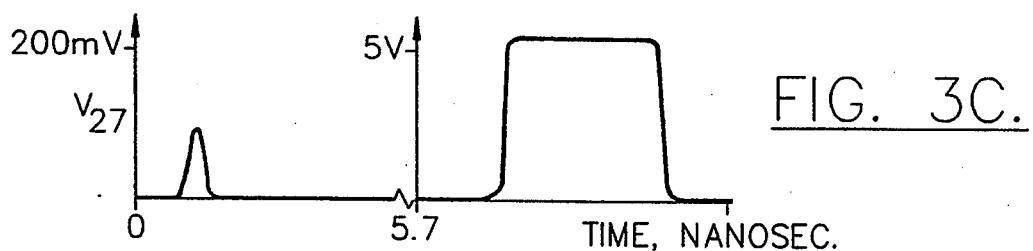
Figure 3D:
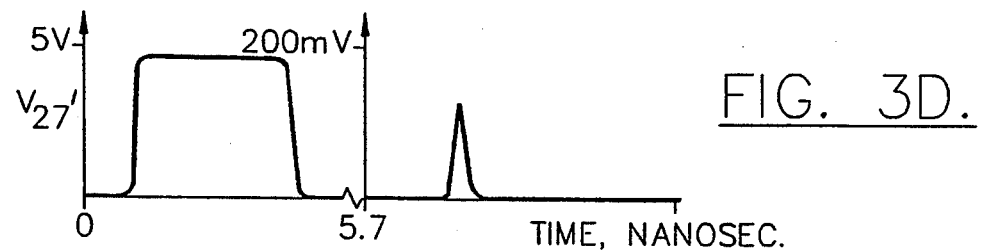

Referring now to FIG. 2, the inverter transfer functions of symmetrical inverters 16, 16' and skewed inverters 11, 11' are shown. As shown, the output voltages (at nodes 13, 13') of the skewed inverters 11, 11' are skewed towards the second reference potential 15 (i.e. ground) relative to the input voltages thereof (at nodes 12, 12'). In particular, for reference voltages of 5 volts and ground, the output voltages of skewed inverters 11, 11' rapidly change state at an input voltage of about one volt. Stated differently, the output voltage is skewed by a factor of 2½ less than a symmetrical inverter. This contrasts with the inverter transfer function of the symmetrical inverters 16, 16', the output voltages of which (at nodes 18, 18') change state symmetrically about an input voltage (at nodes 17, 17') approximately midway between the first reference voltage 14 and the second reference voltage 15. For five volt and ground reference voltages, the symmetrical inverters switch state at about 2.5 volts.

Left hand skewing of inverters 11, 11' accomplishes two primary results. First, it allows 10 to sense a voltage differential on bit lines 20, 20' immediately after one of the bit lines rises above the noise level. Sensing not need to wait until the bit lines rise to half the power supply voltage. Second, it causes the slope (voltage gain) of the transfer function at the skewed switching point to be much higher than it is at the midway point. Compare the slopes of the two curves of FIG. 2. Rapid latchup is thereby provided.

Left hand skewing of the voltage transfer function of inverters 11, 11' is accomplished by making the product of the N-channel transistor (22, 22', 23, 23') maximum square channel saturation current (I*satN) and the channel width-to-length ratio of the N-channel transistors substantially larger than the product of the P-channel square channel saturation current (I*satP) and the channel width-to-length ratio of the P-channel transistors 21-21'. It will be understood by those having skill in the art that the square channel saturation current is the maximum current which can be produced by a channel having equal length and width. The square channel saturation current is proportional to the value of the carrier mobility in the respective transistor; i.e. the electron mobility in the N-channel transistor and the hole mobility in the P-channel transistor. Since the channel lengths of all FET transistors in a typical integrated circuit are generally made equal, above the relationship may be generally represented as:

$$(I^*satN)(Z_N) >> (I^*satP)(Z_P)$$

Preferably the product of saturation current and channel width of the N-channel devices is made ten times greater than that of the P-channel devices. For silicon devices having equal channel lengths, the relative channel widths of the P-channel devices 21, 21' and the N-channel devices 22, 22', 23, 23' are shown in FIG. 1 inside the respective transistors. These channel widths can be scaled to any desired groundrules.

As also shown in FIG. 2, inverter 16, 16' has a symmetrical voltage transfer function. This is obtained by making the product of the square channel saturation current and the width-to-length ratio of the P-channel transistors substantially equal to that of the N-channel transistors. Since for silicon, the P-channel transistor has a square channel saturation current about half that of a N-channel transistor, the symmetrical transfer function is obtained by making the channel the P-channel transistor twice as wide as the N-channel transistor. The relative dimensions are shown in each transistor in FIG. 1.

Differential Latching Inverter Operation

Operation of the Differential Latching Inverter (DLI) 10 of FIG. 1 will now be described. In general, when the input signal on one of bit lines 20, 20' rises above the DLI's threshold voltage, the DLI outputs 27, 27' rapidly latch to represent one or the other binary signal state. Specifically, when one of the signals on the bit lines 20, 20' is above the threshold voltage of the DLI, and a small differential signal component, for example of at least two millivolts, is present, a binary output latchup condition rapidly occurs that produces a binary ONE signal at one output terminal 27, 27' of the DLI and a binary ZERO (down) signal at the other output 27, 27' of the DLI. The binary signal state of the selected memory cell being read is determined by which output terminal 27, 27' of the DLI is HIGH. For example, when output 27 goes up to $V_{DD}$, a binary ONE has been read from memory, and when output 27' goes up to $V_{DD}$ a binary ZERO has been read from memory.

The DLI has a third or reset state that occurs when both outputs 27 and 27' are at DOWN level (i.e. at or near ground level). The third state is automatically set when the bit lines 20, 20' are both at or near ground potential. When the DLI is not being called to read or write, both of the bit lines 20, 20' are placed at ground potential so that both output terminals 27, 27' are at LOW output state, i.e. at ground. It will be understood by those having skill in the art that substantially no DC power is dissipated by DLI 10 in any of the three stable states. Minimal power is dissipated only during the switching interval; i.e. when switching from one state to another. The amount of power dissipated is a function of the switching frequency.

During a read operation, a selected bit line pair is coupled to a single memory cell selected by a word line. Once coupled together, the voltage on bit lines 20, 20' both ramp-up from ground. However, the ramp-up rate is faster on one bit line than the other bit line as a function of whether the selected memory cell is storing a binary ONE or ZERO.

It will be recalled that the inverter transfer function of inverters 11, 11, is skewed towards ground potential. For example, voltage level transfer may occur at around one volt. Accordingly, assume that the voltages on bit lines 20 and 20' are increasing from ground, but that the voltage on bit line 20 is increasing from ground at a slightly faster rate due to the binary value stored in the selected RAM cell. When the voltage on bit line 20 exceeds one volt, the output 13 of inverter 11 rapidly switches LOW (to ground potential), forcing the output 13' to remain HIGH (near $V_{DD}$). Since output 13 is at ground potential, the input to cross-coupled transistor 23' is also at ground potential turning off transistor 23' and thereby forcing node 13' to $V_{DD}$. Accordingly, latchup rapidly occurs.

In summary, the DLI includes a feedback mode of operation which results in a high gain rapid latching condition determined by the imbalance in input (bit line) ramp-up voltage rates. A two millivolt difference between the input signals above threshold is sufficient to cause the desired latchup state. The sensitivity of the DLI to the RAM cell state to induce a differential signal component during a read cycle is primarily due to the heavily left hand skewed voltage transfer function in the inverters 11, 11'.

The first pull-up circuit 19 increases the latchup speed of DLI 10. In particular, if bit line 20 first exceeds threshold and the output 13 of skewed inverter 11 is first forced to ground, transistor 26' of pull-up circuit 19 is turned on, thereby also rapidly bringing (or holding) node 13' to $V_{DD}$. Since node 13' is HIGH, transistor 26 is turned off and does not pull node 13 up. Accordingly, pull-up circuit 19 increases the speed at which latchup occurs.

It will be assumed for the present that MOP input 28 is at HIGH logic level so that transistors 30, 30', 31 and 31' are off and the second pull-up circuits 29, 29' are not operational. Second pull-up circuits 29, 29' are used to restore the third or reset state of the DLI at the conclusion of a read or write operation, as will be described in detail below.

It will also be understood by those having skill in the art that symmetrical inverter 16, 16' may be used to provide an output 27, 27' for the DLI which is a TRUE output (as opposed to a COMPLEMENT output) of the sensed signal. In other words, if the voltage in bit line 20 increases faster than 20', the latchup will force output 27 HIGH and 27' LOW. It will also be understood that inverters 16, 16' should have a symmetrical voltage transfer function so that they latch up rapidly when output nodes 13, 13' of the skewed inverters change state.

Referring now to FIGS. 3A-3D, the above described operation is illustrated. Voltage wave forms for the bit lines 20 and 20' and the outputs 27, 27' of the skewed inverters 11, 11' are shown. As shown in the first time interval for FIGS. 3A-3D, when the input on bit lines 20, 20' are below about one volt, the outputs 27, 27' remain at ground. However, as shown in the first time interval of FIG. 3A, when the voltage on bit line 20' is greater than about one volt and exceeds the voltage on bit line 20 by about two millivolts, line 27' rapidly latches to 5 volts and the slight rise in line 27 is immediately suppressed by the feedback condition. During a data read operation latchup occurs in about 1.65 nanoseconds from the start of the word pulse, using 0.8 micron groundrules. The second time interval of FIGS. 3A-3D illustrates the latchup of output 27 in response to the voltage on bit line 20 being higher than that of bit line 20'. After sensing of the stored data occurs, the voltage on both outputs are rapidly brought to ground by operation of the MOP input 28 which will be described below.

Memory Architecture Incorporating The DLI

Having described the design and operation of the DLI, a high speed, low power, high density memory architecture which uses the DLI will now be described. This architecture will be described relative to an SRAM, however it will be understood by those having skill in the art that the architecture may also be used in a DRAM.

Figure 4A:
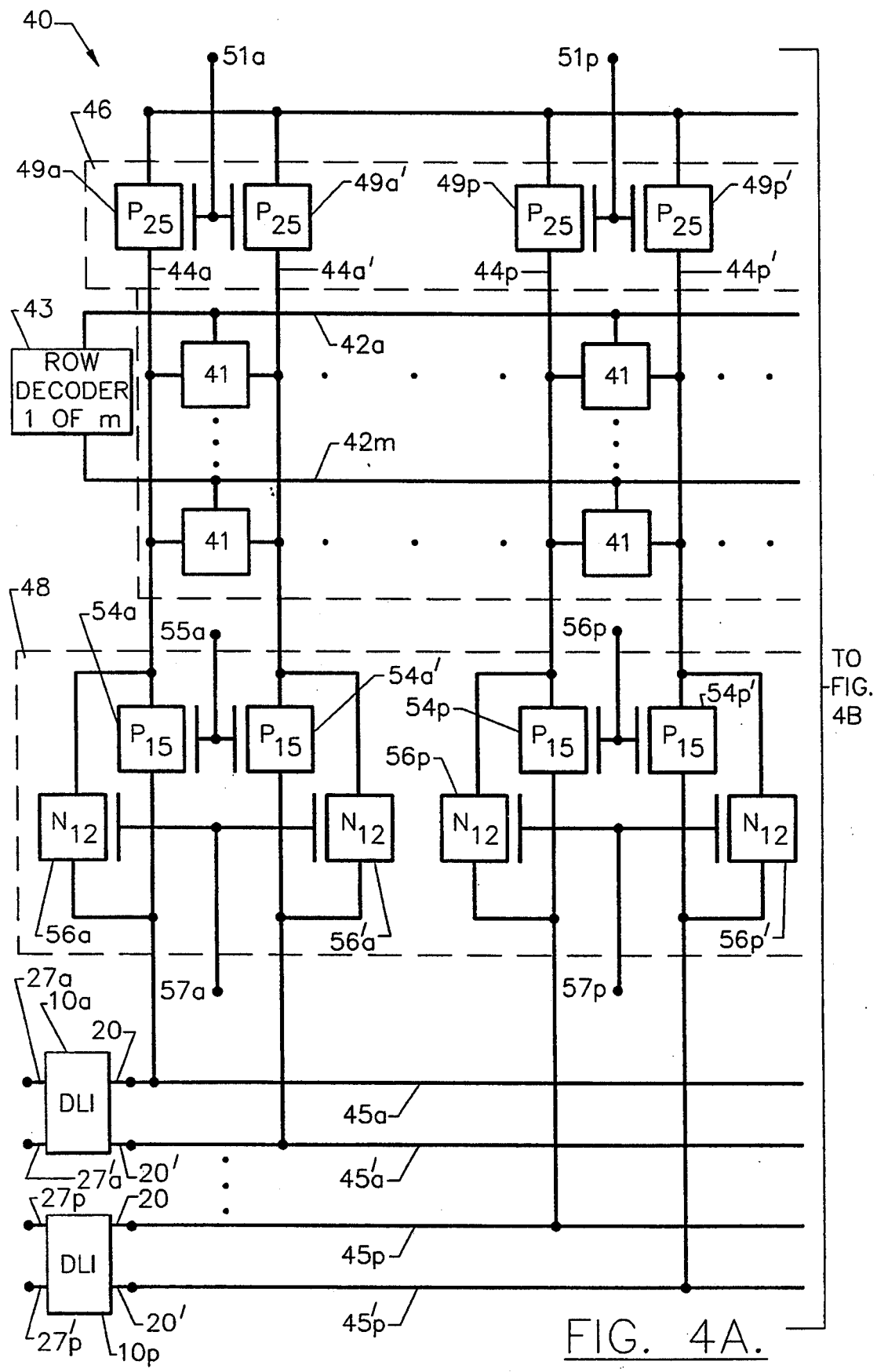
FIGS. 4A and 4B, which form FIG. 4 when placed adjacent one another as indicated, illustrate a block diagram of a random access memory architecture according to the Parent Applications incorporating the Differential Latching Inverter of FIG. 1.
Figure 4B:
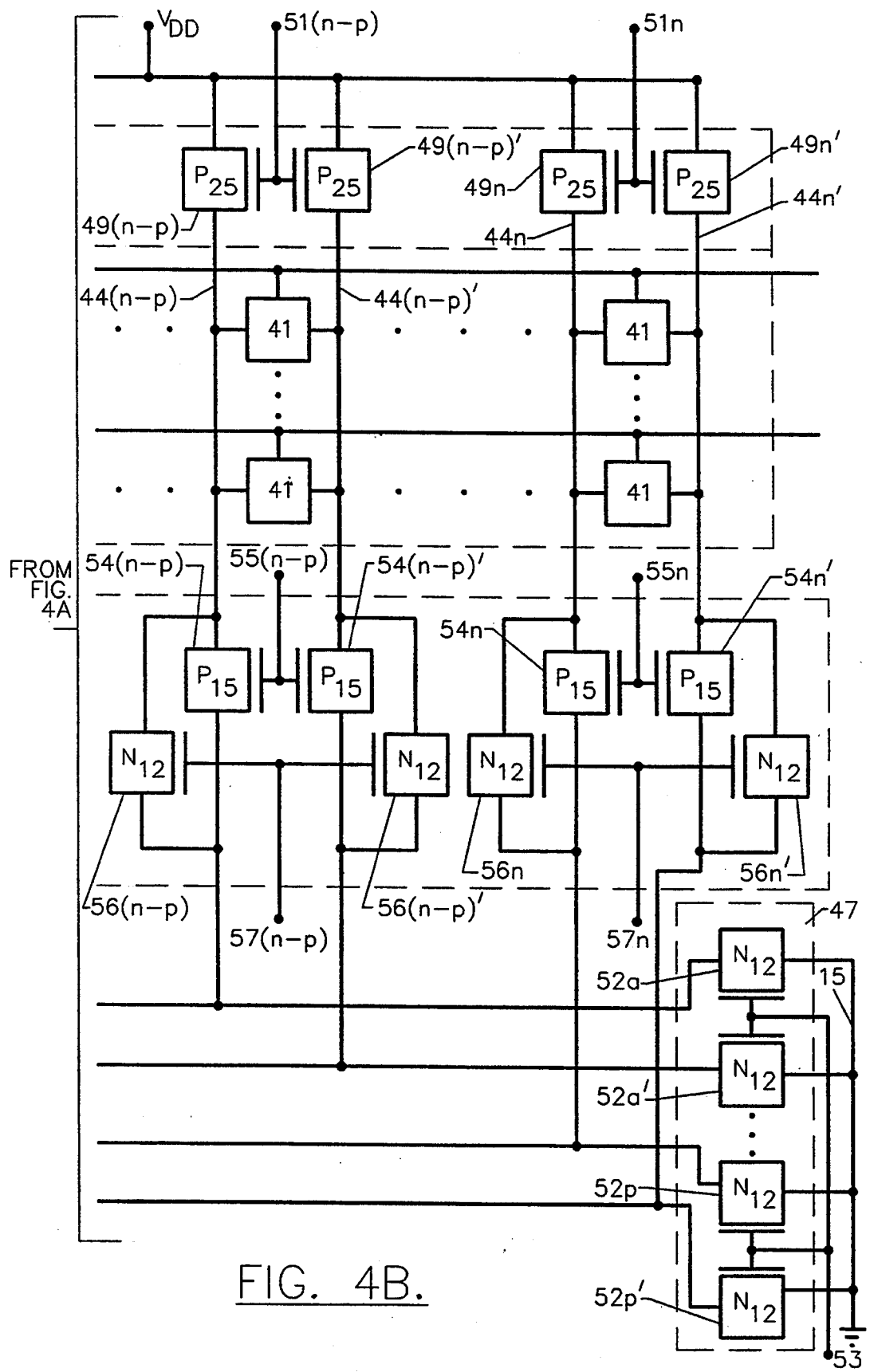

Referring now to FIGS. 4A and 4B, which are placed together as indicated to form FIG. 4, random access memory (RAM) 40 comprises an array of RAM cells 41. It will be understood by those having skill in the art that RAM cells 41 may be SRAM cells or DRAM cells, and may use cell designs well known to those having skill in the art. As illustrated in FIG. 4, RAM cells 41 are configured in an array of m rows and n columns. For example, in a 128 k bit RAM, 256 rows and 512 columns of RAM cells may be used. As also shown, m word lines 42a-42m are coupled to a one-of-m row decoder 43 for accessing one of word lines 42a . . . 42m. As also shown in FIG. 4, n pairs of bit lines 44a, 44a'-44n, 44n' are connected to the respective n rows of the array. As will be described below, two sets of bit lines are used in RAM 40, so that bit lines 44 are referred to as the "primary" bit lines.

Still referring to FIG. 4, it may be seen that p pairs of "signal" bit lines 45a, 45a'-45p, 45p' are provided, with every p'th pair of primary bit lines 44 being connected to a respective one of the signal bit lines 45. In the example shown herein, p=16, i.e. 16 pairs of signal bit lines 45, 45' are provided, with every 16th column being connected to a respective one of the bit lines. In other words, bit line pairs $44_1, 44_1', 44_{17}, 44_{17}' \ldots 44_{597}, 44_{597}'$ are connected to signal bit lines 45a, 45a', and bit lines $44_{16}, 44_{16}' \ldots 44_{32}, 44_{32}' \ldots 44_{512}, 44_{512}'$ are connected to signal bit line pair 45p, 45p'. The signal bit lines are generally orthogonal to the primary bit lines.

The choice of the number of signal bit line pairs depends on several factors. In particular, it has been found that the total capacitance which loads the primary bit lines 44 should be equal to or greater than the total capacitance loading the signal bit lines 45. The total capacitance which loads the signal bit lines 45 is primarily due to the diffusion capacitance of the coupling transistors which couple the primary and signal bit lines, as described below. It has been found that this loading capacitance should be minimized to achieve the maximum memory clock rate and minimum data access time and is inversely proportional to the number of DLI 10 used to configure the system. Finally, the relationship between m (the number of rows), n (the number of columns), and p (the number of DLIs) will also depend on the overall configuration of the RAM 40.

Continuing with the description of FIG. 4, a DLI 10a . . . 10p is connected to a respective signal bit line 45a . . . 45p. First, second and third coupling means, 46, 47 and 48 respectively, are used to selectively couple the primary bit lines 44 to the first reference potential 14 ($V_{DD}$), to selectively couple the signal bit lines 45 to the second reference potential 28 (ground), and to selectively couple the primary bit lines 44 to the signal bit lines 45. In particular, the first coupling means comprises n pairs of P-channel transistors 49a, 49a'-49n, 49n' for coupling a respective primary bit line 44a, 44a' . . . 44n, 44n' to $V_{DD}$ under control of gate inputs 51a-51n. Second coupling means 47 comprises p pairs of N-channel FETs 52a, 52a'-52p, 52p', each of which couples a respective signal bit line 45a, 45a'-45p, 45p' to ground 28 under control of gate 53. Finally, third coupling means 48 is seen to include P-channel transistors 54a, 54a'-54n, 54n' for coupling a primary bit line 44a, 44a'-44n, 44n' to a respective signal bit line 45a, 45a'-45p, 45p' under control of gate 55a-55n. An N-channel transistor 56a, 56a'-56n, 56n' also couples a respective primary bit line 44a, 44a'-44n, 44n' to a respective signal bit line 45a, 45a'-45p, 45p' under control of gates 57a-57n.

As will be seen from the operational description below, the first coupling means 46 couples the primary bit lines to $V_{DD}$ during the idle operation and during the read operation and decouples at least one of the primary bit line pairs from $V_{DD}$ during a write operation. The second coupling means 47 couples the signal bit lines to ground during the idle operation and decouples the signal bit lines from ground during a read operation and a write operation. The third coupling means 48 couples the primary bit lines to the signal bit lines during a read and write operation and decouples the primary bit lines and signal bit lines from one another during an idle operation. In particular, P-channel transistors 54 couple the primary bit lines to the signal bit lines during read operation and N-channel transistors 56 couple the primary bit lines to the signal bit lines during a write operation.

Operation of the Random Access Memory

The detailed operation of the random access memory 40 (FIG. 4) will now be described. The idle state will first be described followed by the read state and then the write state.

During the idle state, a LOW logic level is provided to gates 51 of first coupling means 46 to turn all of transistors 49 on and thereby place the primary bit lines 44 at the power supply level $V_{DD}$. At the same time, a HIGH logic level is provided to input 53 to turn on second coupling means 47, and thereby couple all of the signal bit lines 45 to ground. A high logic level is applied to inputs 55 and a low logic level is applied to inputs 57 to thereby turn transistors 54 and 56 off and thereby decouple the primary bit lines 44 from the signal bit lines 45. Finally, since all of the signal bit lines 45 are at ground, all of the DLIs 10 are in their third or idle state with all of the outputs 27 and 27' being at ground potential. No DC power is consumed by the circuit during the idle state.

During a read operation, row decoder 43 selects one of word lines 42a . . . 42m to access a particular row of RAM cells 41. A logic LOW signal is applied to input 53 to turn second coupling means 47 off to thereby decouple signal bit lines 45 from ground. Although not coupled to ground, the capacitance of the signal bit lines maintains the signal bit lines near ground potential. A logic LOW level is maintained at gates 51 to thereby continue to couple the primary bit lines to $V_{DD}$. A column decoder, not shown in FIG. 4, provides a LOW logic level to a selected one of inputs of $55a$–$55n$ depending upon the column to be read. This turns on the appropriate transistor pair 54, 54' and causes current to flow between the associated primary bit lines 44, 44', and the signal bit lines 45, 45'.

It should be noted that FETs 54 are connected as current controlled devices, the current through which is controlled by their source voltage. Accordingly, the primary bit line which is at a higher voltage will produce more current to pull up the signal bit lines, than the primary bit line which is at a lower voltage. Since the selected RAM cell current tries to discharge one or the other side of the primary bit lines 44, 44', the voltage of one of the primary bit lines drops from $V_{DD}$ at a rate faster than the other, depending on the state of the selected RAM cell 41. Current flows between the selected primary bit line pair 44, 44', and the signal bits lines 45, 45', causing a difference to occur in the voltage ramp-up rate on the signal bit line pair 45, 45'. When the ramp-up voltage on one or the other of the signal bit lines 45, 45' exceeds the threshold of the DLI 20, the output of the DLI is rapidly latched to a ONE or ZERO. In other words, either output 27 goes HIGH and 27' goes LOW or output 27' goes HIGH and 27 goes LOW.

As described in detail below, the outputs 27 of all of the DLIs may be gated (ORed) together because all of the DLIs which are not active are in their third state. Accordingly, the output of the activated DLI may be placed in a read register and provided as the chip output, as described in detail below.

Once a DLI has been latched and the data has been read, the RAM is rapidly restored to the idle state by activating the MOP input 28 (FIG. 1) with a logic LOW signal, to immediately pull the DLI back to its idle state. At the same time, once the data has been read, a HIGH signal is applied to input 53 to thereby reactivate second coupling means to return the signal bit lines to ground and a HIGH signal is applied to input 55 to decouple primary bit lines 44, 44' from signal bit lines 45, 45'. Once this has occurred, the MOP input 28 is again brought HIGH to disable the second pull-up circuit 29 because the DLI is now in the reset state. The operation of the control circuits for restoring the RAM after a read operation will be described in detail below.

From the above description it may be seen that the read operation is self-timing. In other words, once the data has been read, the RAM resets itself to the idle state without the need for a reset clock pulse. Accordingly, speed is not hampered by clocking requirements, and operations can occur as fast as possible consistent with reliable reading of data. The DLI also provides reliable reading of data at high speed, so that high speed operation of RAM 40 may be obtained.

In the write operation, a selected one of inputs $51a$–$51n$ is placed HIGH by a column decoder to thereby deactivate the associated first coupling means 46 and thereby decouple the associated pair of primary bit lines 44, 44' from $V_{DD}$. A HIGH logic signal is applied to select one of inputs $57a$–$57n$ to thereby couple the selected primary bit lines 44, 44' to the appropriate signal bit lines 45, 45'. One of the signal bit lines is clamped at LOW level which thereby forces one of the selected primary bit lines to ground. This forces one side of the selected RAM cell to ground and causes the other side to go up thereby storing data in the selected cell. During the write operation, transistors 54 are maintained off and transistors 52 are turned off to decouple the signal bit lines from ground. After the write operation is successfully performed, the written data is automatically sensed by the associated DLI, and the memory is reset as described above for the read operation. The operation of the control circuits for restoring the RAM after a write operation will be described in detail below.

Having described the general operation of the RAM of the Parent Applications, the detailed circuitry for controlling the operation of the RAM will now be described.

Read and Write Control Circuit

Figure 5:
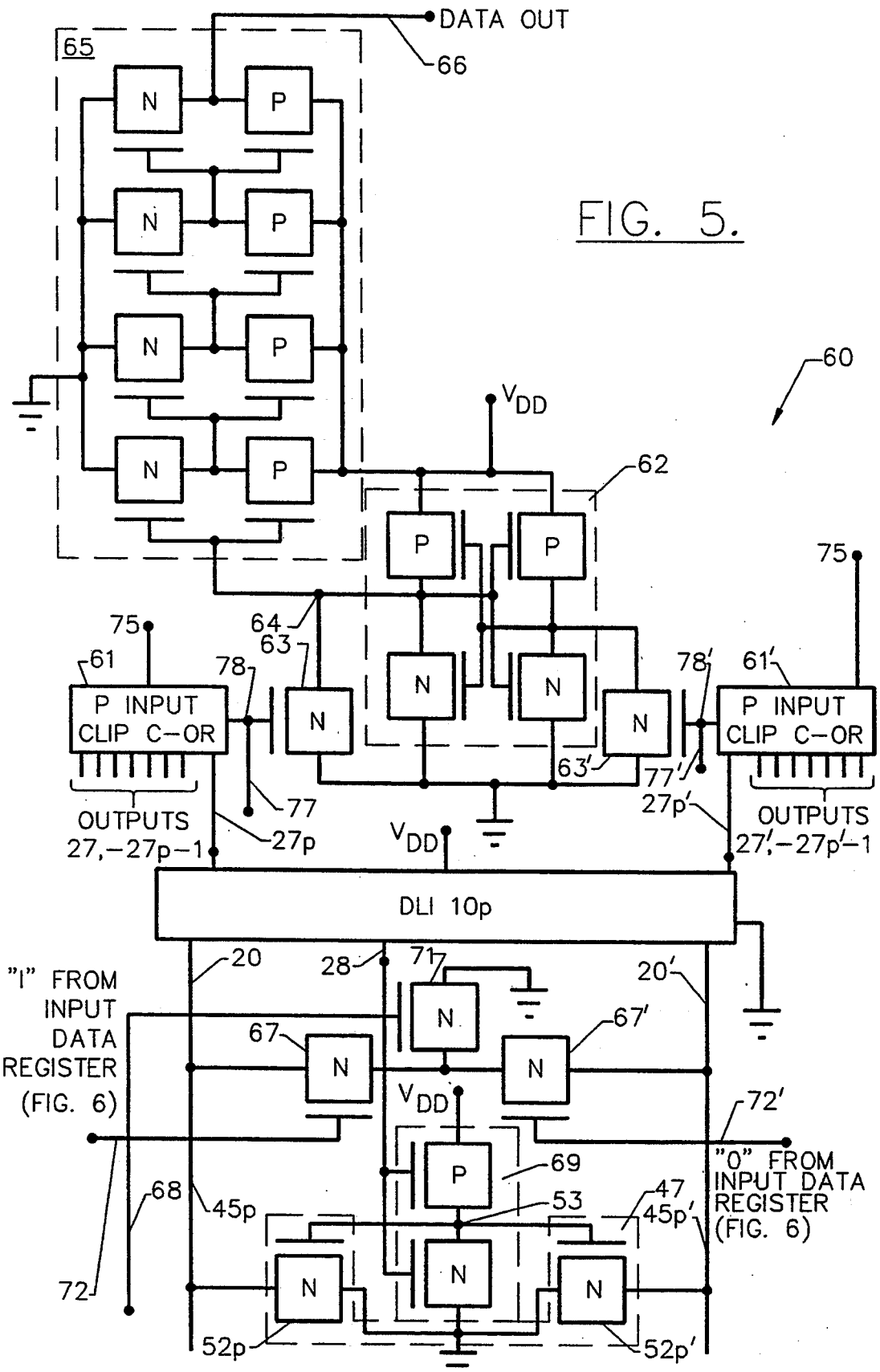
FIG. 5 illustrates a schematic circuit diagram of read and write control circuits for a random access memory according to the Parent Applications.

Referring now to FIG. 5, there is illustrated a schematic circuit diagram of the circuit for coupling each of p signal bit line pairs $45a$, $45a'$$45p$, $45p'$ to a DLI $10a$–$10p$ and coupling the outputs 27, 27' of each DLI to a data output register. Circuitry for referencing the signal bit line pairs $45a$, $45a'$–$45p$, $45p'$ to ground is also shown along with circuitry to control the binary value written into a selected RAM cell 41 from a given signal bit line pair.

Referring again to FIG. 5, each of the output terminals 27, 27' of a DLI 10, for example, output terminals $27p$, $27p'$ of DLI $10p$, is shown coupled to a p-input Complementary Logic Input Parallel Clocked OR gate 61, 61' also referred to as a CLIP-C OR gate. The CLIP-C OR gate is described in detail in copending application Ser. No. 07/648,219 entitled *Complementary Logic Input Parallel (CLIP) Logic Circuit Family* by the present inventor Albert W. Vinal and assigned to the assignee of the Parent Applications, now U.S. Pat. No. 5,247,212, the disclosure of which is incorporated herein by reference. Conventional cascaded OR gates may also be used; however, as described in the aforesaid copending application, a single CLIP-C OR gate can handle large numbers of inputs at high speed and low power.

As shown, outputs $27_127p-1$ and $27_1'$-$27p-1'$ of the remaining DLI circuits $10_1$–$10p-1$ drive other input terminals of these CLIP-C OR gates. The logic output 78, 78' of each CLIP-C OR gate drives the input of a transfer memory (TRAM) output cell 62 comprising a pair of cross-coupled complementary inverters, via coupling transistors 63, 63'. As shown, if output $27p$ of DLI $10p$ is HIGH, then N-channel transistor 63 is turned on and the left side of TRAM cell 62 is driven LOW. Alternatively, if output $27p'$ of DLI $10p$ is HIGH, then N-channel transistor 63' is turned on via CLIP OR gate 61' and the output of TRAM cell 62 is HIGH. The clock inputs 75, 75' to CLIP-C OR gates 61, 61' will be described below, in connection with FIG. 7. The outputs 78, 78' of OR gates 61, 61' are also provided to reset circuit 88 of FIG. 7, via lines 77, 77' as described below.

As shown, the output 64 of TRAM cell 62 is coupled to a ring segment buffer 65 having four stages, to allow the output of the TRAM cell to rapidly drive off-chip or on-chip load capacitance with a specified voltage rise and delay time. The ring segment buffer design is described in application Ser. No. 07/497,103 entitled *High Speed Logic and Memory Family Using Ring Segment Buffer* by the present inventor Albert W. Vinal assigned to the assignee of the Parent Applications and now U.S. Pat. No. 5,030,853, the disclosure of which is hereby incorporated herein by reference. The output 66 of the ring segment buffer 65 is the digital data output of the memory array.

Accordingly, during a read operation, one output of one DLI will go HIGH, as a function of the voltage ramp differential on the associated signal bit line. One input to OR gate 61, or one input to OR gate 62 will thereby go HIGH. One of OR gate outputs 78 or 78' will thereby go HIGH, thereby setting or resetting TRAM 62. The output of TRAM 62 drives ring segment buffer 65, to thereby provide a HIGH or LOW data input. The ring segment buffer 65 may be configured as a tristate driver, under control of a chip select signal, in order to accommodate a plurality of RAM outputs on a single bus.

Still referring to FIG. 5, when the RAM is in its idle state, the gates of transistors 52p, 52p' are HIGH because the MOP gate 28 is LOW causing the output 53 of complementary inverter 69 to be HIGH. The gate input terminals of the transistors in inverter 69 are driven by the MOP gate 28. Generation of the MOP signal is described in detail below. In the absence of a MOP gate 28, each bit line of all signal bit line pairs is continually referenced to ground by transistors 52, 52'. Voltage referencing is terminated only when a MOP gate is active.

During a write interval, transistors 67, 67' and 71 provide means for controlling the binary state written into a selected RAM cell. A RAM cell selection occurs at the intersection of a selected word line 42 and a selected primary bit line pair 45 (FIG. 4). The gate input terminals of transistors 67, 67', are coupled through a logic AND gate (not shown), to the ONE and ZERO output terminals respectively, of a binary data input register described below in connection with FIG. 6.

During a write interval, the gate input 68 to transistor 71 is brought HIGH, thereby clamping the common source connection between transistors 67 and 67' at ground potential. Transistor 71 allows one or the other bit line of a signal bit line pair to be clamped to ground, depending on whether the gate voltage is applied to transistor 67 or 67'. If the data input register contains a binary ONE, then transistors 67 and 71 conduct, clamping the ZERO side 20 of the signal bit line pair to ground. At the same time, the ONE side of the signal bit line pair 20' is not clamped to ground. The opposite conditions exist if the data input register produces an UP level voltage at the gate of transistor 67' and a DOWN voltage at the gate of transistor 67.

Figure 6:
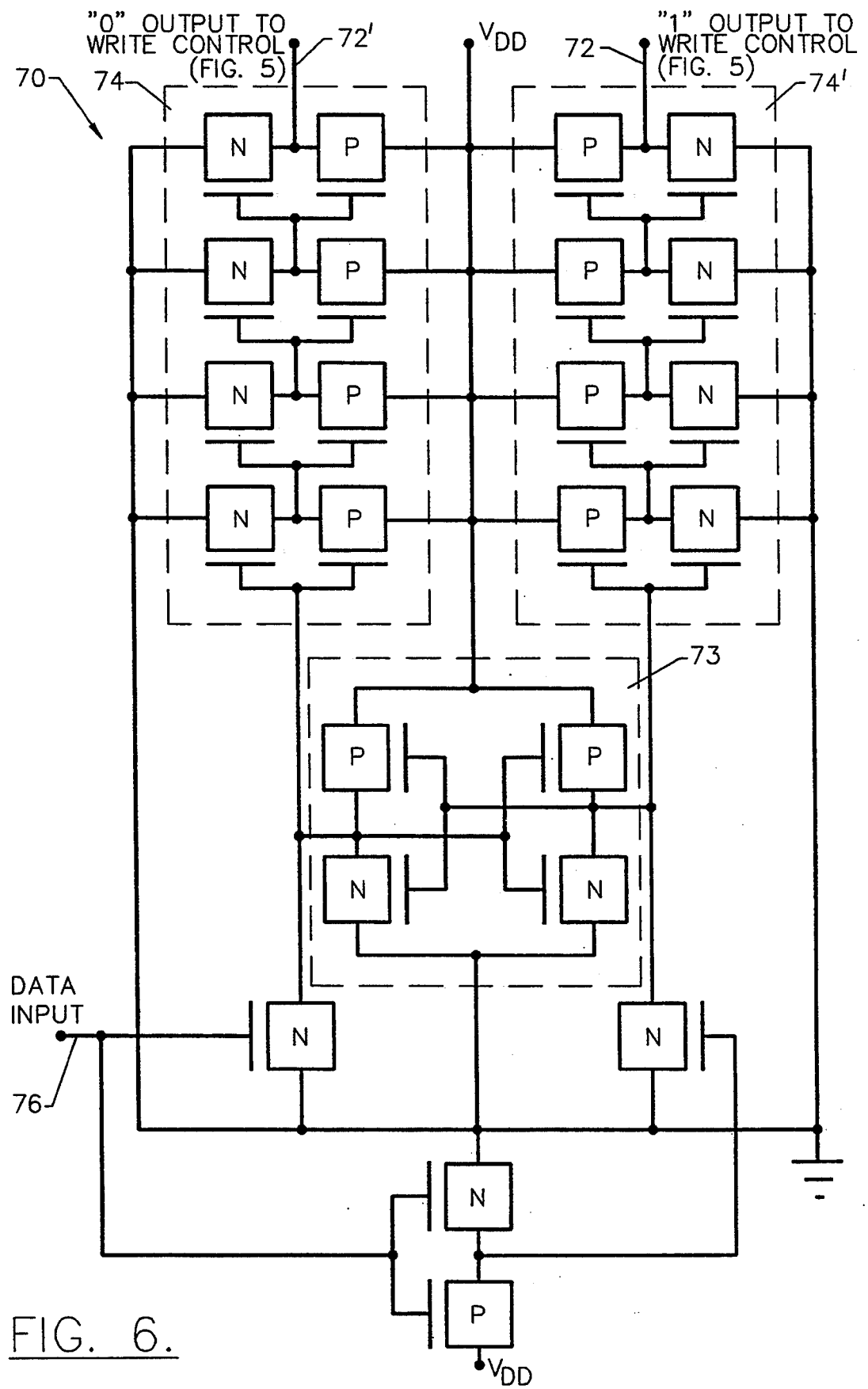
FIG. 6 illustrates a schematic circuit diagram of a data input register for a random access memory according to the Parent Applications.

FIG. 6 illustrates the data input register 70. As shown, a data input 76 to the RAM array is coupled to a transfer memory output cell 73, the ZERO output of which is coupled to a first ring segment buffer 74 and the ONE output of which is coupled to a second ring segment buffer 74' to produce a ZERO output 72' or a ONE output 72 which is coupled to the input 72, 72' of FIG. 5. The ring segment buffer is described in the aforesaid application Ser. No. 07/497,103. It allows a given load to be driven, with a predetermined rise time, and minimum delay.

The data input register circuit 70 allows a slow rise time input to be converted into fast rise time TRUE and COMPLEMENT outputs, with a minimum delay. Accordingly, the circuit of FIG. 6 may also be used to buffer slow rise time RAM inputs (such as address or select inputs), for use in the RAM array.

Continuing with the description of the write operation, and referring again to FIG. 4, assume that a particular primary bit line pair 44, 44' is decoded and activated by bit line decoder. Transistors 49, 49' of this bit line pair are turned off during a write cycle by selecting the appropriate input 51 via the bit line decoder. Appropriate decoded coupling transistors 56, 56' are turned on. One side or the other of a signal bit line pair 45, 45' is clamped to ground by the data input register via transistors 67, 67' (FIG. 5). This causes the associated transistor 56, 56' (FIG. 4) to pull down one primary bit line 44, 44' towards ground potential. The unclamped signal bit line rapidly rises in voltage until the sum of this voltage and the drop in the primary bit line voltage equals the power supply voltage $V_{DD}$. Preferably, the RAM cell design allows the increase in the unclamped signal bit line voltage to be equal to the decrease in the primary signal bit line voltage.

During a write cycle, one of m word lines 42 is also turned on by row decoder 43 (FIG. 4), applying gate voltage to the pass transistors of the RAM cell. The selected RAM cell pass transistors thereby couple the potential of the primary bit lines to or from a common signal point in the RAM cell. During write, the primary bit line that is driven to near ground potential sets the state of the selected RAM cell. When the state of the selected RAM cell is set, the MOP gate generator described below is terminated along with the write gate 68 (FIG. 5), and transistors 49, 49' are turned on to recharge the primary bit lines 44 back to power supply voltage $V_{DD}$. Simultaneously, transistor 71 of FIG. 5 is turned off and transistors 52, 52' are turned on allowing both signal bit lines 45, 45' to be returned to ground potential.

During the write interval, the rising potential of the unclamped signal bit line rapidly causes the associated DLI to respond to this signal voltage when it exceeds the threshold voltage of the DLI. The binary state written into the RAM cell is therefore also transmitted to the output TRAM 62 (FIG. 5) and presented to the output 66, as described above for the read operation, allowing error detection functions to be performed. It will be understood by those having skill in the art that the simultaneous sensing of the signal voltage written into the selected RAM cell during a write operation allows the RAM to terminate the write operation without the need for external clocking. Resetting of the RAM after a write or read operation will be described below.

Memo Operation (MOP) Timing Control

Figure 7:
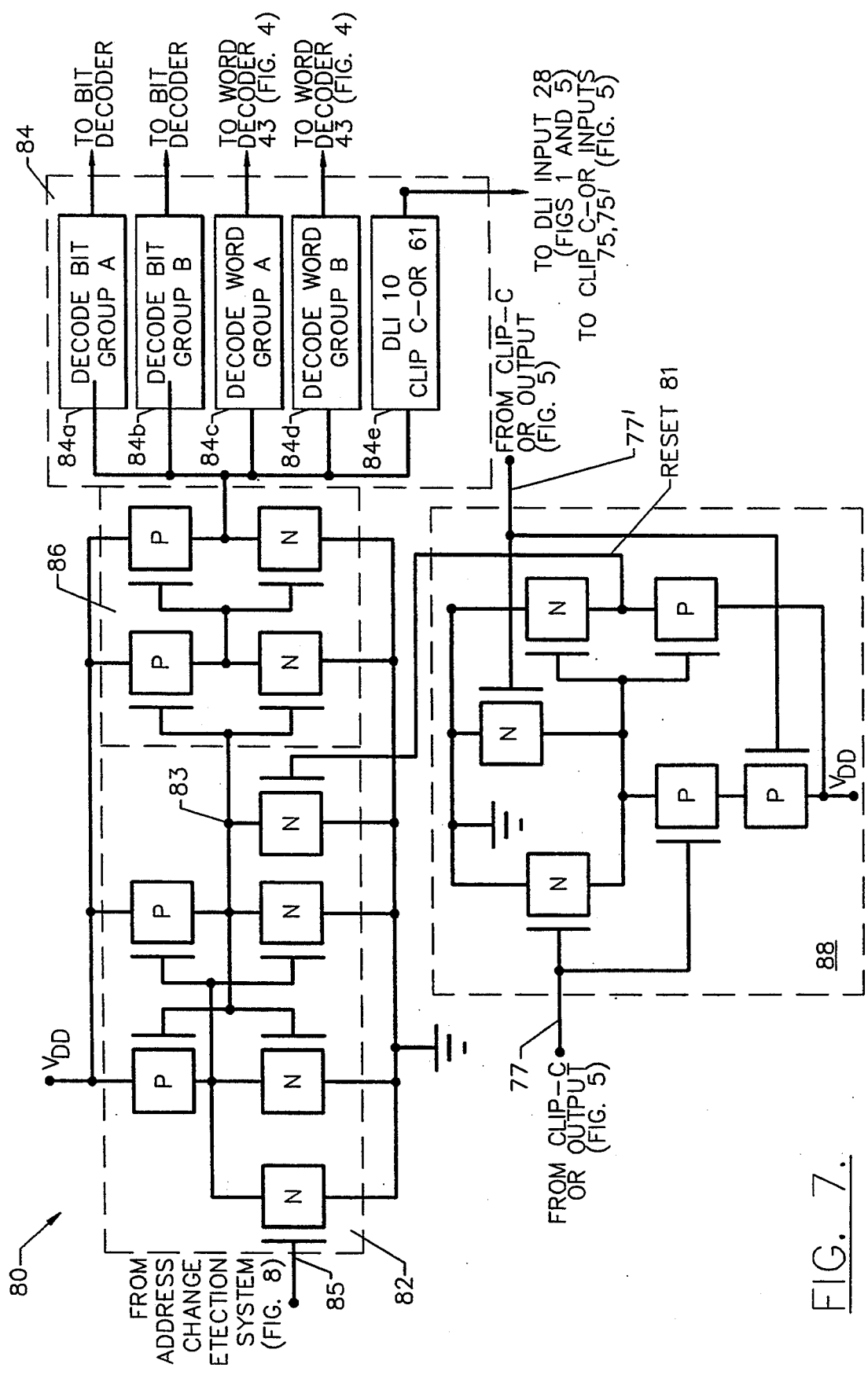
FIG. 7 illustrates a schematic circuit diagram of timing control circuitry for a random access memory according to the Parent Applications.

Referring now to FIG. 7, the circuitry for controlling the timing of a read and write operation, collectively referred to as a memory operation (MOP) is shown. This circuitry generates a MOP signal which is used at various portions of the RAM architecture as previously described. Activation of the MOP signal initiates a read or write operation, and deactivation of the MOP signal terminates the read or write operation, as described below. By generating an internal MOP signal, and using the MOP signal to control the timing of read and write operations, the memory operation is independent of an external clock. System power is dissipated only during the MOP interval, and is primarily related to the switching power; i.e. it is proportional to capacitance times voltage squared times the switching frequency. When the MOP gate is off, the only power dissipated by the system is due to transistor leakage current. None of the circuits within the system dissipate standby power when the memory is not functioning in a read or write mode, regardless of whether the chip select is active or not. A low power, high speed memory is thereby provided.

Moreover, since the memory creates its own timing signals for read and write operations, all timing and logic functions within the memory are automatically temperature compensated, allowing the RAM to reliably operate over a broad range of temperatures. At high temperatures, the maximum access rate is lowered from room temperature due to the reduced current capabilities of the transistors. At low temperatures, the maximum access rate is increased above the room temperature value due to the increased current capabilities of the transistor.

Referring again to FIG. 7, the read/write operation timing circuitry 80 is controlled by a TRAM cell 82 comprising a pair of cross-coupled inverters and a pair of pass transistors of well known design. This TRAM cell is turned on and the output 83 thereof goes HIGH when an address change detection system issues an address change detection clock pulse on input 85, upon detecting a change in the input address. This TRAM cell is also turned on when a chip select transition going active, or a write enable transition going active, is detected by a TDLU discussed below in connection with FIG. 8. The address change detection system is described in connection with FIG. 8 below.

The output 83 of RAM cell 82 is coupled to a ring segment buffer 86, the output of which is coupled to a group of ring segment buffers 84. These ring segment buffers provide the mechanism for driving the total load capacity associated with the clock lines and the system logic cells such as the bit and word address decoding drivers and the DLI sensing systems. These ring segment buffers also provide the proper delay for timing the various internal circuits in the RAM, as described below.

As shown in FIG. 7, five delay ring segment buffers 84a–84e are used, however other numbers of ring segment buffers may be used in other memory architectures. Ring segment buffers 84a and 84b are used to clock the bit decoders (not shown) for the primary bit line pairs, and ring segment buffers 84c and 84d are used to clock the row decoder 43 (FIG. 4). The input stage of each of ring segment buffers 84a–84d comprise a two input CMOS NAND gate. One of the input gate electrodes of this NAND gate is driven by the appropriate output of the high order bit of the m bit word and n bit address registers. The other input is driven by the MOP gate. This NAND gate permits segmenting the total number of row and column selects of the RAM into at least two halves. The first half contains m/2 low order addresses and n/2 high order addresses. Accordingly, clocking in high order groups is inhibited when addressing low order group selection and vice versa. This procedure eliminates dissipating unnecessary switching power during a read or write memory cycle and simplifies the design of the clock driver. However, it will be understood by those having skill in the art that the word and bit decode functions need not be divided into groups.

The output of delay ring segment buffer 84e is provided to the DLI input 28 (FIGS. 1 and 5) and to the clock inputs of the CLIP-C OR circuits 75, 75' (FIG. 5). Accordingly, after a predetermined period from the time an address change is detected, the DLI input 28 is activated and a clock pulse is applied to the CLIP-C OR gate. Application of the MOP input 28 to the DLI 10 of FIG. 1, allows the DLI to rapidly latch into one or the other binary state, without interference from the second pull-up circuit 29, 29'. Application of the MOP input to clocking inputs of the CLIP-C OR gates 75 provides a clock pulse for timing the output of the CLIP-C OR gate.

Still referring to FIG. 7, two input CMOS OR gate 88 is driven by the outputs 77, 77' of the p-input CLIP-C OR gates 61, 61' (FIG. 5). The reset output 81 of this OR gate resets TRAM 82 and thereby resets each ring segment buffer 84 after the predetermined delay of each ring segment buffer. After a RAM cell has been read (either during a read cycle or at the end of a write cycle) one or the other p-input CLIP-C OR gates 61, 61' (FIG. 6) will deliver a logic HIGH voltage at output 71 or 71', to signal completion of the intended operation. In other words, a DLI has properly stored a bit value which was read or has properly stored a bit value which was written to confirm that writing has taken place. When this event occurs, the MOP gate is no longer required and is automatically terminated by action of the MOP gate reset driver 88. All clock drivers subsequently shut down within the propagation delay time of the ring segment buffers 84.

In particular, ring segment buffers 84a and 84b shut down the bit decoders and ring segment buffers 84c and 84d shut down the word decoders 43 (FIG. 4). Ring segment buffer 84c terminates the MOP signal which shuts off CLIP-C OR gates 61, 61' (FIG. 5) and also causes second pull-up circuits 29, 29' (FIG. 1) to rapidly bring DLI 10 to its reset state (both inputs at ground). A memory operation (read or write) is thereby automatically terminated.

From the above description it may be seen that the feedback shutdown control of the MOP gate generator automatically accommodates broad thermal environments that the RAM may experience, since MOP shutdown occurs only after a read or write function completion has been detected by the DLI. In other words, the MOP gate is initiated when either an address change, chip select or write enable is detected, indicating that a read or write operation is to begin, and is automatically terminated once the proper read or write function has been completed. When neither a write or read function is required, the MOP gate is off and remains off until turned on again by the output of the change detector. The address change detector operation will be described in the next section in connection with FIG. 8.

Address Change Detection System

Figure 8:
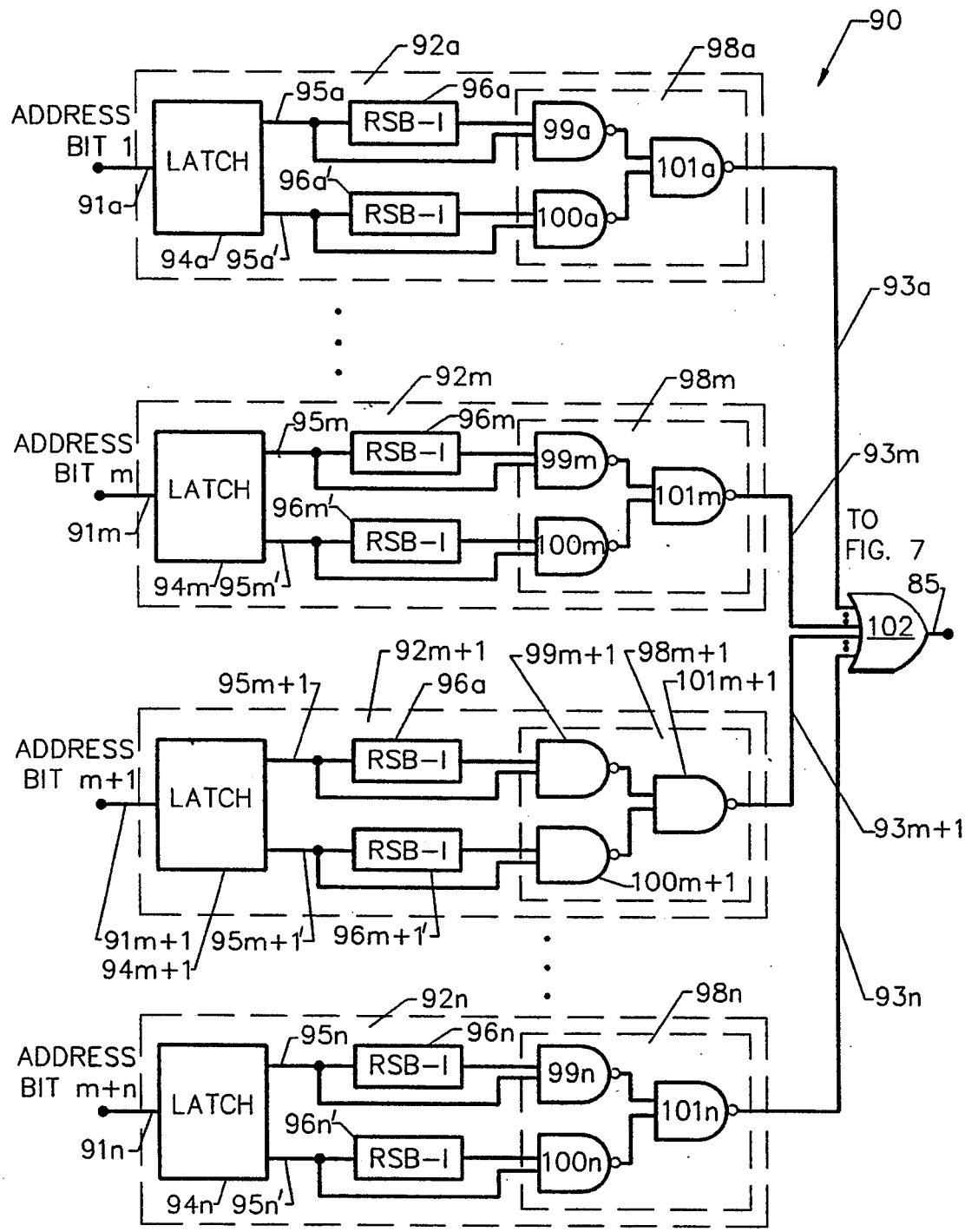
FIG. 8 illustrates a block diagram of an address change detection circuit according to the Parent Applications.

In general, a random access memory can begin a memory operation (i.e. a read or a write operation) by detecting a change in at least one of the input address bits. In a conventional address change detection system, the time required to detect a change in the input address can significantly slow the memory cycle time. According to the Parent Applications, an improved address change detection system detects a change in an input address in minimum time. The system uses a transition detection logic unit (TDLU) which is shown in FIG. 8. Prior to describing the TDLU, a conventional address change detection system will be described.

There are three basic elements required in a conventional address change detection system. The first is a latch which is used to increase the rise time of the input address bit. Using the example of a memory with m rows and n columns, a total of m+n latches are required to compare the m+n latches allow comparison of the m+n address bits. The second component of a conventional address change detection system is an exclusive OR circuit for each of the latches. The exclusive OR circuit will provide an output whenever the previous address bit and the present address bit are different. Finally, all of the exclusive OR gate outputs are ORed together, to provide a HIGH logic level when any of the exclusive OR gates are HIGH. A change in the address is thereby detected.

The above described exclusive OR and OR logic is responsible for most of the delay in detecting the change in the input address, due to the large number of inputs which have to be ORed together. For example, for a 64 k bit RAM, the total number of address bits (m+n) is 16, and for a 256 k bit RAM the total number of address bits (m+n) is equal to 18. Using conventional CMOS gates, a cascaded tree of CMOS gates is required to provide the function of a 16 or 18 input OR gate.

For example, using conventional three input CMOS OR gates, a nine-OR gate tree is necessary to OR 18 inputs. Six OR gates accept the total of 18 inputs at a first level of the tree. The outputs of each group of three gates are provided to an OR gate at a second level. Two OR gates are used in the second level to accept all six outputs from the first level. Finally, at a third level, one OR gate combines the output of the two second level OR gates. Propagation delay time through this logic tree is excessive and requires many transistors to perform the function.

Referring now to FIG. 8, a block diagram of the address change detection system 90 of the Parent Applications will now be described. As shown, the address change detection system comprises m+n Transition Detection Delay Units (TDLU) 92a-92n. A respective address bit 91a-91n is provided as the input to a respective transition detection delay unit 92a-92n. The respective outputs 93a-93n of the transition detection delay units 92a-92n are provided as inputs to a single m+n input Complementary Logic Input Parallel (CLIP) OR gate 102. The output 85 of CLIP OR gate 102 provides an address change detection signal which is provided to the MOP generating circuit 80 of FIG. 7. The design and operation of a complementary logic input parallel OR circuit 102 is described in the aforementioned application Ser. No. 07/648,219.

Each TDLU 92 delivers a clock pulse to the appropriate input of the CLIP OR gate 102 when an address transition is detected on its input address line 91. One TDLU is coupled to the chip select latch and one TDLU is coupled to the write enable latch (not shown). Their outputs are also inputted to CLIP OR gate 102. The basic components of the TDLU are a latch 94a-94n, whose logical state is controlled by a single input signal line 91a-91n which is connected to the address inputs of the RAM chip. The ONE and ZERO outputs of the latch, 95a-95n and 95a'-95n, respectively, rapidly switch when a transition in the input signal 91 occurs and provides both the TRUE and COMPLEMENT function of the input signal. Identical ring segment buffers 96a-96n and 96a'-96n' are coupled to the true and complement outputs 95a-95n and 95a'-95n' of the latches 94a-94n. As shown in FIG. 8, ring segment buffers 96 are delay ring segment buffers with an odd number of stages to provide an inverting delay ring segment buffer (RSB-I). The design and operation of a delay ring segment buffer is described in application Ser. No. 07/497,103. As described in this application, the delay property of the ring segment buffer is controlled by proper choice of channel length for the P- and N-channel transistors used to form the ring segment buffer inverters. The outputs of the ring segment buffers and the outputs of the latch are each connected to cascaded NAND gates 98a-98n as illustrated in FIG. 8, to form the output 93a-93n of the TDLUs 92a-92n.

FIG. 9 illustrates an alternative design for the TDLU 92. In this alternative design, noninverting delay ring segment buffers, consisting of an even number of inverter stages, are used. The latch outputs 95, 95' are cross-coupled with the ring segment buffer outputs in order to provide the proper inputs to the cascaded NAND gates 98. FIG. 10 illustrates the relationship between the input address bit 91 and the output 93 of each of the TDLUs 92, 92' of FIGS. 8 or 9. As shown, a positive going or negative going transition in an address bit 91 provides a clock pulse of a predetermined duration at the output 93. The duration of the clock pulse resulting from detecting a transition at the outputs of the latch, is controlled by the time delay designed into the ring segment buffers 96.

FIGS. 11A and 11B illustrate the truth tables for the TDLU 92 of FIG. 8 and the TDLU 92' of FIG. 9, respectively. Referring to FIGS. 11A and 11B, it may be seen that both configurations of the TDLU produce the same output function for the same input function.

The address change detection system of the Parent Applications, is simple to construct and virtually eliminates propagation delay time required to detect a change in an input voltage function, and has broad functional application for high speed computer design philosophy. It will also be noted that the TDLU technology automatically accommodates the demands of the MOP gate generator for temperature effects.

Figure 12A:
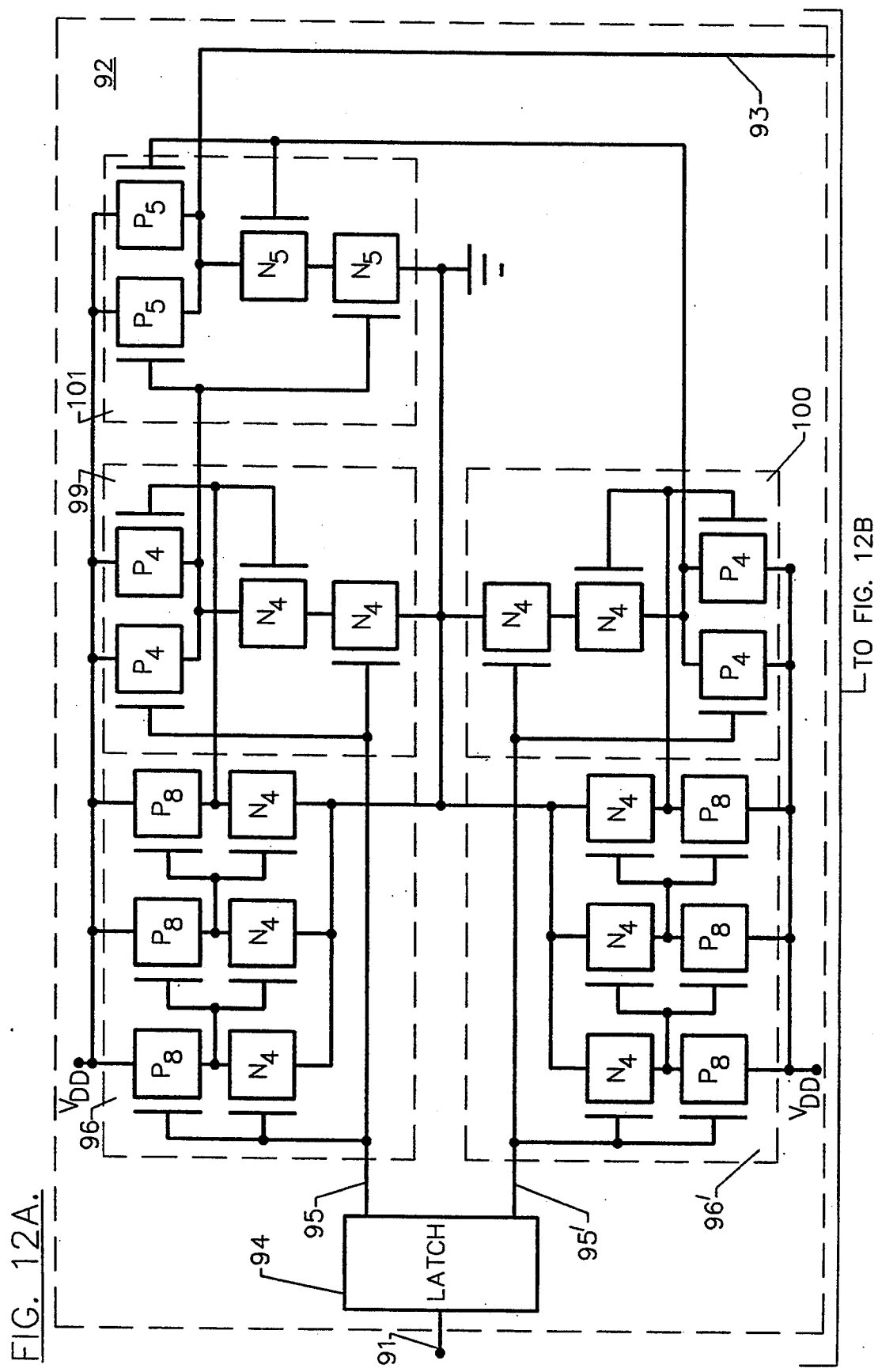
FIG. 12 is a circuit schematic diagram of the address change detection circuitry of FIG. 9.
Figure 12B:
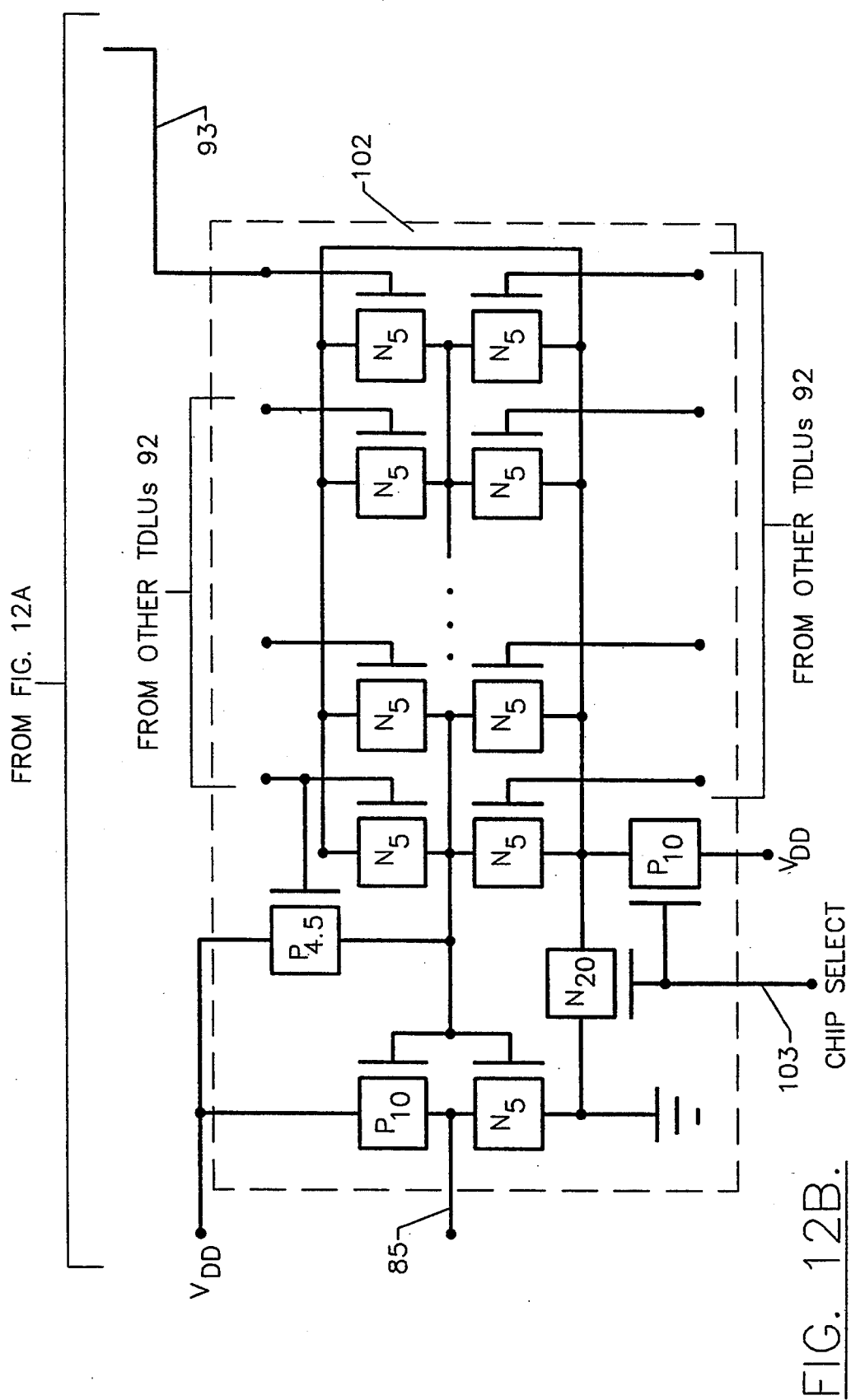

FIGS. 12A and 12B, which together form FIG. 12 as indicated, illustrate a circuit schematic diagram of the address change detection circuitry of FIG. 8. As shown, TRAM 92 includes latch 94 and a pair of three stage (inverting) ring segment buffers 96, 96'. Complementary Logic Input Parallel NAND gates 99, 100 and 101 are also shown. Assuming equal channel lengths, the relative channel widths of the respective transistors are shown within the respective transistors.

The output 93 from the transition detection delay unit 92 is provided as an input to multiple input CLIP OR gate 102. The corresponding outputs from the other transition detection delay units are also provided as inputs to the CLIP OR gate 102. Also provided as an input to the CLIP OR gate is a chip select input 103 so that the output 85 of CLIP OR gate 102 is at logic HIGH whenever an address change is detected and the RAM chip has been selected.

Timing of RAM Operation

Figure 13:
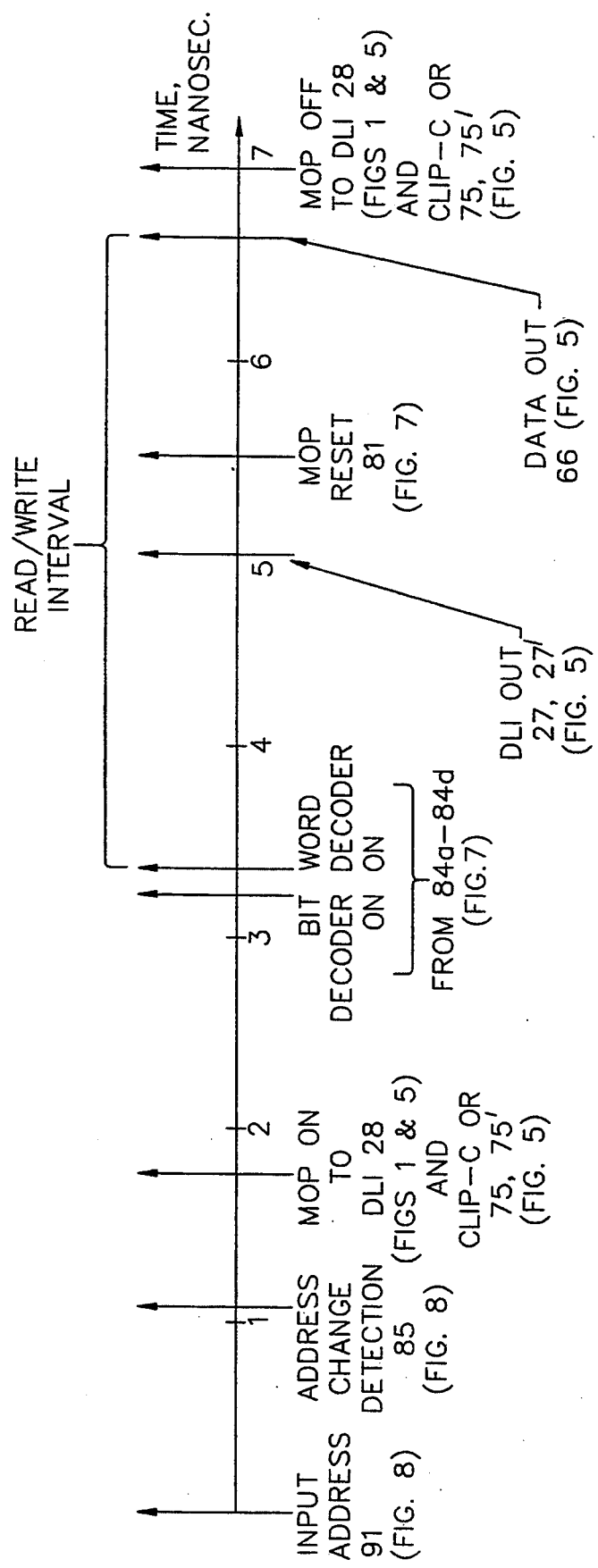
FIG. 13 is a timing diagram for a random access memory according to the Parent Applications.

Having now described the individual components and the detailed operation of the Parent Applications, an overview of the memory timing will now be described in connection with the timing diagram of FIG. 13. The time line of FIG. 13 is calibrated in nanoseconds and the values are based on simulations of the RAM of the Parent Applications, with the FETs being fabricated using 0.8 micron groundrules.

The timing diagram begins at time equals zero, with a change on input address 91 of FIG. 8. The change in input address is detected and the output 85 of the address change detection system of FIG. 8 is produced after 1.1 nanoseconds. This output is provided to the timing circuit 80 of FIG. 7, and the output of ring segment buffer 84e produces the MOP signal after about 1.75 nanoseconds. At about 3.5 nanoseconds, the bit decoders and word decoders are clocked via the outputs of ring segment buffers 84a-84d of FIG. 7. Accordingly, the read or write interval begins after about 3.5 nanoseconds from the time the input address changed.

An output is produced on the DLI at just over five nanoseconds and the MOP reset signal 81 of FIG. 7 is produced shortly thereafter. The data out signal 66 in FIG. 5 is produced approximately 2.7 nanoseconds from the time the read/write interval began. The reset signal propagates through the ring segment buffers 84a-84e between five and six nanoseconds to turn off the CLIP-C OR gate 75, 75' of FIG. 5 and to activate the second pull-up circuit of the DLI via MOP input 28. Accordingly, after about seven nanoseconds, a new read/write cycle may start with a new change in the input address.

The random access memory of the Parent Applications may also be operated in a unique write mode called "burst write". Burst write is achieved when the write enable is active, the chip select (103, FIG. 12) is active, and the transition detection delay unit output starts the memory cycle with each detected address change and the DLI output terminates the MOP gate. This burst write cycle can be used efficiently to fully load all or a part of the total memory in minimal time and with minimal power consumption.

Improved Coupling Between Primary and Signal Bit Lines

The memory architecture of FIGS. 4A and 4B includes a first coupling means 49 for coupling a primary bit line 44 to $V_{DD}$ under control of gate inputs 51. A third coupling means 48 couples at least one primary bit line pair 44 to a respective signal bit line pair 45. The first and third coupling means are located at opposite ends of the primary bit lines 44. In particular, each of the primary bit lines includes one end which is relatively close to the signal bit lines and an opposite end which is relatively distant from the signal bit lines. The first coupling means are located at the opposite (relatively distant) end of the primary bit lines and the third coupling means are located at the one (relatively close) end of the primary bit lines, adjacent the signal bit lines.

In the configuration of FIGS. 4A and 4B it has been found that the remote positioning of the first coupling means may degrade the performance of the RAM. In particular, the performance of the third coupling means may be degraded by the electrical resistance of the primary bit lines 44. When the first coupling means 49 is located at the opposite end of the primary bit lines, the pull-up transistors remain on and serve to control the source voltage of the pass transistors 54 in the third coupling means. These pass transistors shuttle current from the primary bit lines to one of the signal bit line pairs 45. The amount of shuttle current decreases with increasing source voltage. The difference in source voltage of the P-channel transistors 54 in the third coupling means accounts for the differential component of the current which is shuttled through the signal bit lines. This differential current component is produced by current flowing to ground from one side or the other of the primary bit lines as a result of a selected RAM cell during a data read operation. The difference in shuttle current accounts for the difference in the voltage ramp up rate of the selected bit line detected by the DLI 10.

The remote position of the first coupling means 49 of FIG. 4 allows the shuttle current to flow through the primary bit lines 44. Unfortunately, this current produces an additional voltage drop at the source terminal of the transistors 54 in the third coupling means, due to the resistance of the primary bit lines 44. This additional voltage drop reduces shuttle current and thereby increases the ramp-up time on the signal bit lines, thereby delaying detection of the state of the selected RAM cell.

Moreover, a significant imbalance may occur in the resistance of one of the main bit lines of each main bit line pair as a result of manufacturing imperfections. This resistance imbalance may increase the probability of a false signal being detected by the DLI. Finally, the remote position of the first coupling means 49 requires a conductor to run along the length of each primary bit line pair 44 in order to terminate the pull-up current on a selected bit line pair during a write operation. In other words, terminals 51 and 57 are connected by running a conductor line across the entire length of the main bit line. These conductor lines add to the complexity of the RAM layout.

Figure 14A:
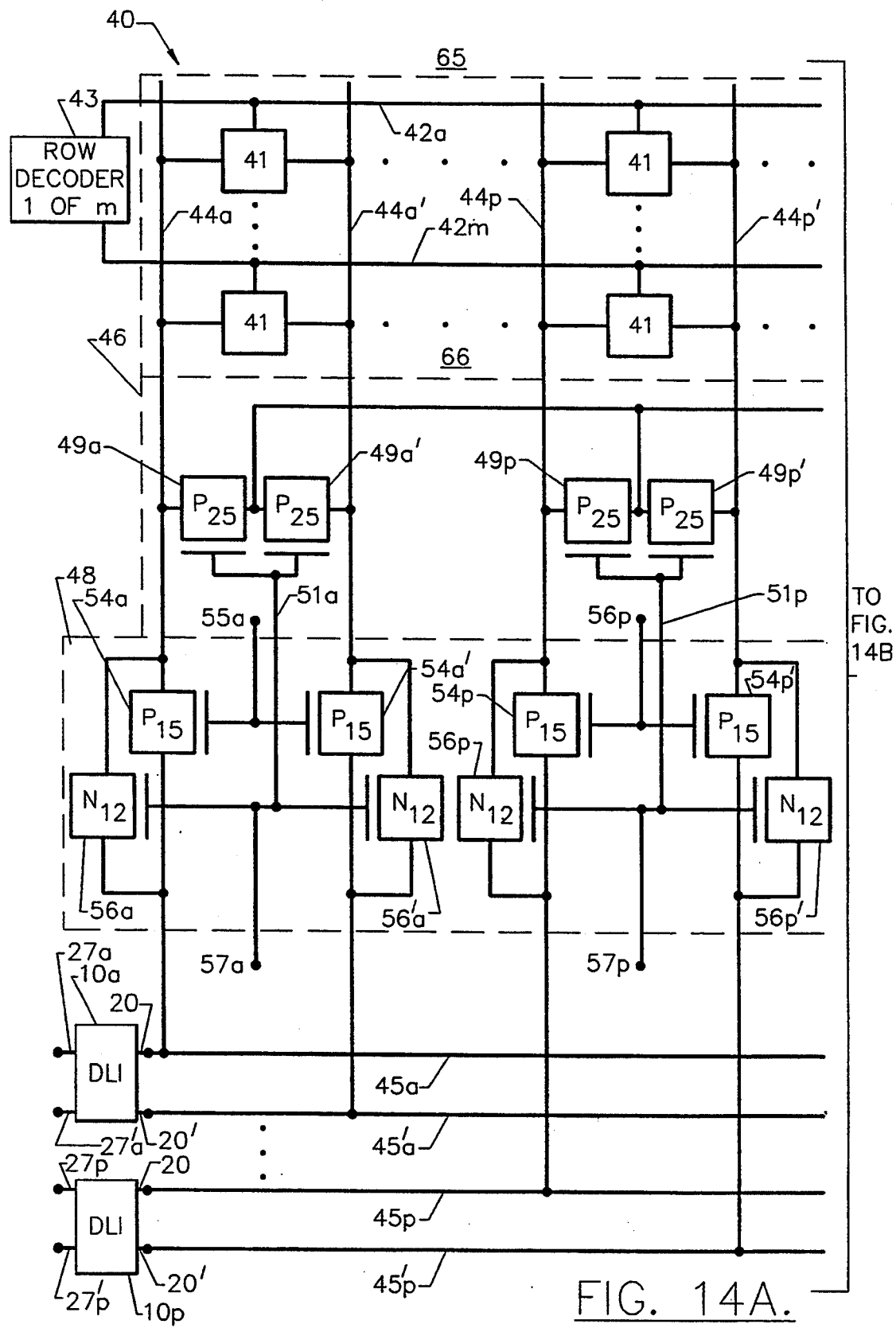
FIGS. 14A and 14B, which form FIG. 14 when placed adjacent one another as indicated, illustrate a block diagram of an alternate random access memory architecture according to the Parent Applications, incorporating first and third coupling means which are both located between the primary bit lines and the signal bit lines.
Figure 14B:
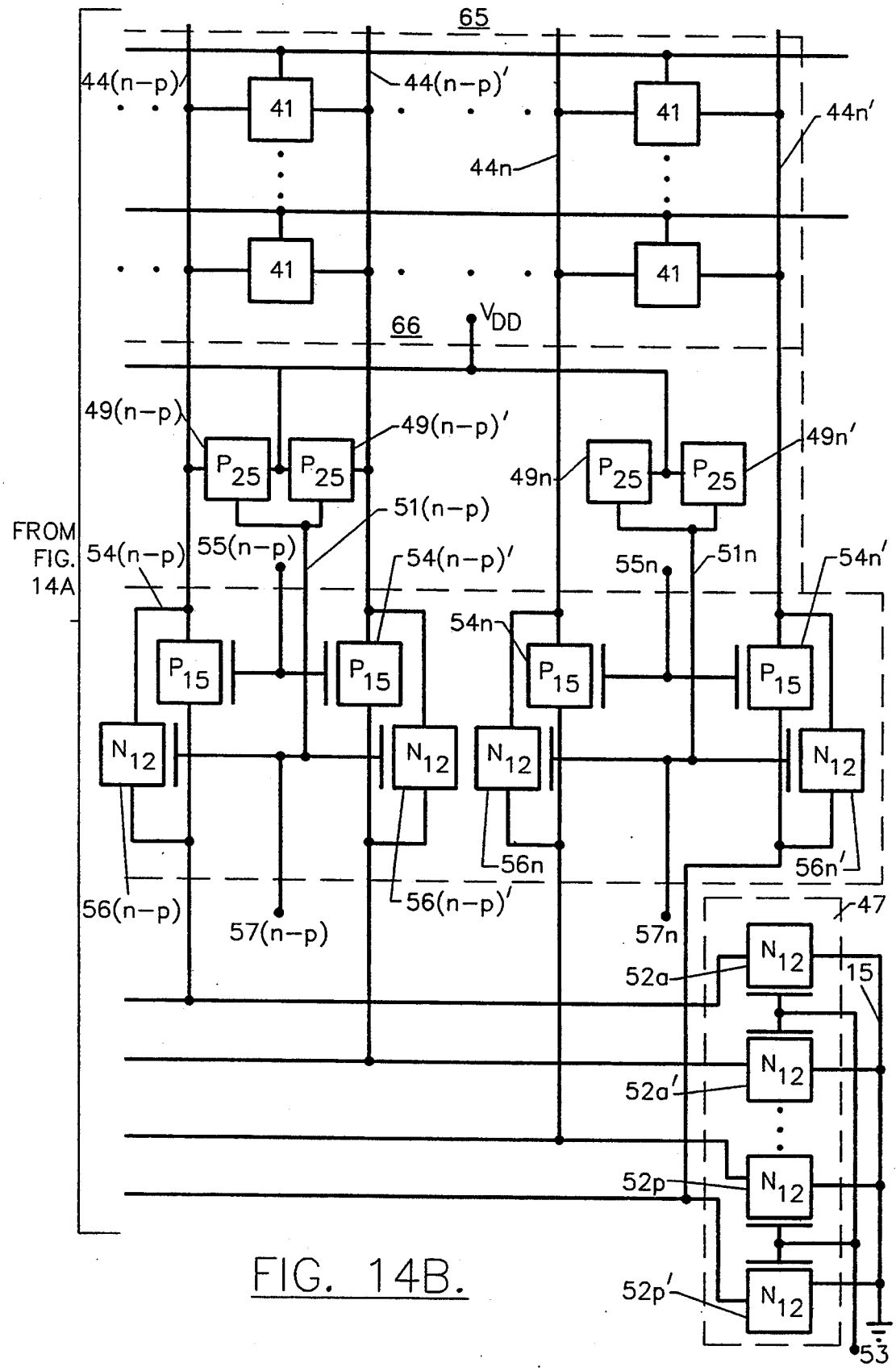

FIGS. 14A and 14B, which when placed together form FIG. 14, describe a solution to all of these problems. As shown in FIGS. 14A and 14B, the first coupling means 49 is positioned at the one end 66 of the primary bit lines 44, relatively close to the signal bit lines 45, rather than being positioned at the opposite end 65 of the primary bit lines 44, relatively distant from the signal bit lines 45. By positioning the first coupling means at the one end of the primary bit lines, close to the third coupling means, bit line resistance effects are eliminated. Accordingly, the reduced shuttle current due to primary bit line voltage drop is eliminated, and sensing delay is reduced. Moreover, an imbalance in the resistance of one or the other primary bit lines as a result of manufacturing imperfections does not adversely impact the accurate sensing of data read from a selected RAM cell. Finally, the placement of the first coupling means adjacent the third coupling means allows terminals 51 and 57 to be electrically connected using a short conductor line, which need not run the entire length of the primary bit lines.

It will be understood by those having skill in the art that in the configuration shown in FIG. 14, the main bit lines 44 become stub transmission lines with no termination at the opposite end 65. RAM cells which are located toward the opposite end 65 are therefore not sensed immediately at the one end 66 due to transmission line delay time. The maximum delay time $T_d$ is given by the following equation:

$$T_d = \frac{C_1}{2}\left[\frac{1.2 V_o}{I_{RAM}} + R_1\right]$$

Where;
 $V_0$ = is the voltage operating point of the first coupling transistor 49 with full shuttle current flowing, typical 0.5 Volts.
 $V_{DD}$ = Power supply voltage.
 $C_1$ = Total capacitance of the main bit line 44.
 $I_{RAM}$ = RAM cell 41 current.
 $R_1$ = Electrical resistance of the main bit line 44.

For a RAM architecture which includes 256 RAM cells 41 per main bit line pair 44, the delay time $T_d$ is typically 200 picoseconds. This delay may be accommodated by activating a selected word line 42 prior to activating the selected transistor 54 in the third coupling means by a time equal to the worst main bit line delay time $T_d$.

A number of alternate embodiments for the first and third coupling means are illustrated in FIGS. 15–19. It will be understood by those having skill in the art that the first coupling means may be located at the opposite (far) end 65 of the primary bit lines 44, as was illustrated in FIG. 4. Preferably, however, the first coupling means is located at the one (near) end 66 of the primary bit lines as illustrated in FIGS. 14A and 14B. Other embodiments of the first and third coupling means will also be envisioned by those having skill in the art.

In order to simplify FIGS. 15–19, only a single first coupling means 46 and a single third coupling means 48 are shown. However, it will be understood by those having skill in the art that a plurality of first coupling means 46 and third coupling means 48 may be substituted into FIGS. 14A and 14B.

Figure 15:
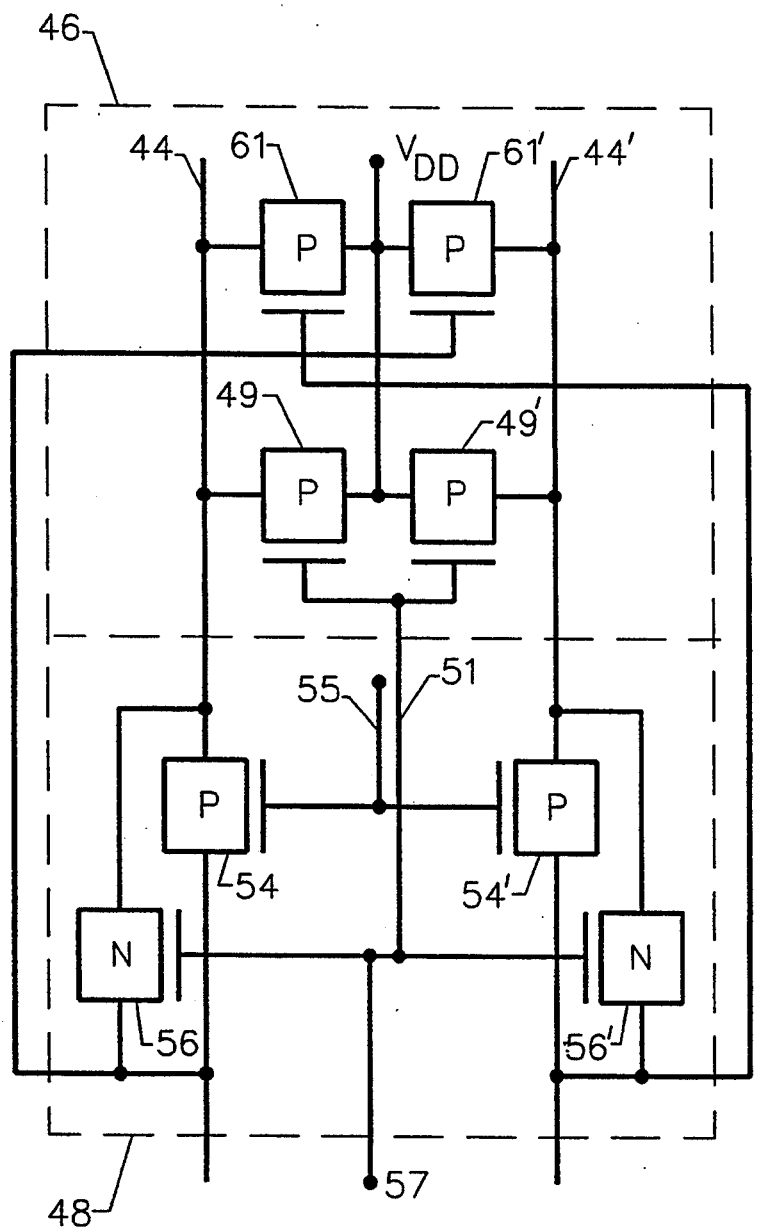
FIGS. 15–19 illustrate alternate embodiments of the first and third coupling means of FIG. 14.

Referring now to FIG. 15, the embodiment shown includes third coupling means 48 which is identical to that shown in FIG. 14. However, first coupling means 46 adds a pair of cross coupled P type transistors 61, 61', the controlled electrodes of which are serially coupled between power supply voltage $V_{DD}$ and a respective one of the primary bit lines 44, 44'. The controlling electrodes are cross coupled to a respective one of the associated signal bit lines 45', 45. The channel widths and lengths of all of the P channel transistors 61, 61', and 49, 49' are identical.

The transistors 61, 61' provide an analog feedback path from the signal bit lines to the first coupling means to enhance the RAM cell induced differential signal component which is shuttled from the main bit lines to the signal bit lines. The effect of this feedback configuration is to almost double the differential of the signal component due to RAM cell current. The feedback allows almost all of the RAM current to be shuttled to the signal bit line as a differential signal, instead of slightly over half the RAM current which is shuttled without the use of feedback. Accordingly, the signal being detected by the DLI 20 is increased, and smaller RAM cell designs 41 with reduced current outputs, may be used.

This feedback technique also plays a fundamental role in controlling the voltage of each primary bit line of the selected pair during the writing of data. Specifically, feedback voltage signals are cross coupled from the signal bit line to the gates of the first coupling means, allowing one of the selected primary bit lines to be held close to supply voltage $V_{DD}$, while the other selected memory bit line is forced close to ground. This technique of utilizing feedback control from the signal bit line to the first coupling means greatly improves the reliability of writing data into a selected RAM cell.

It will be understood that an additional small capacitive loading of the signal bit line is produced due to the gate capacity of transistors 61. However, when the Fermi threshold field effect transistor, described in U.S. Pat. Nos. 4,990,974 and 4,984,043 (assigned to the assignee of the Parent Applications) are used, this capacitive loading becomes almost negligible. The embodiment of FIG. 15 is presently considered by the inventor to be the best mode for configuring the first and third coupling means at the first end of the primary bit lines.

Figure 16:
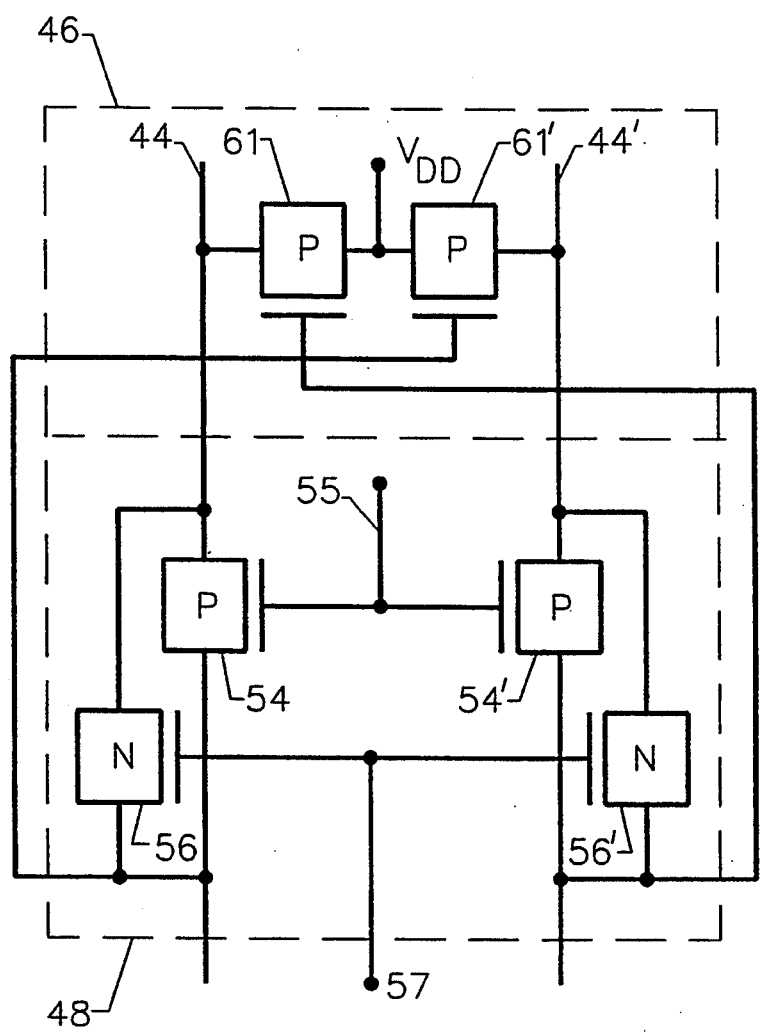

Referring now to FIG. 16, another alternative embodiment of the first and third coupling means is shown. The third coupling means 48 is identical to FIG. 15. However, the first coupling means 46 uses only the cross coupled pair of transistors 61, 61' and eliminates the need for the transistors 49, 49' of FIG. 15. This embodiment may provide more feedback than is necessary in some RAM architectures.

Figure 17:
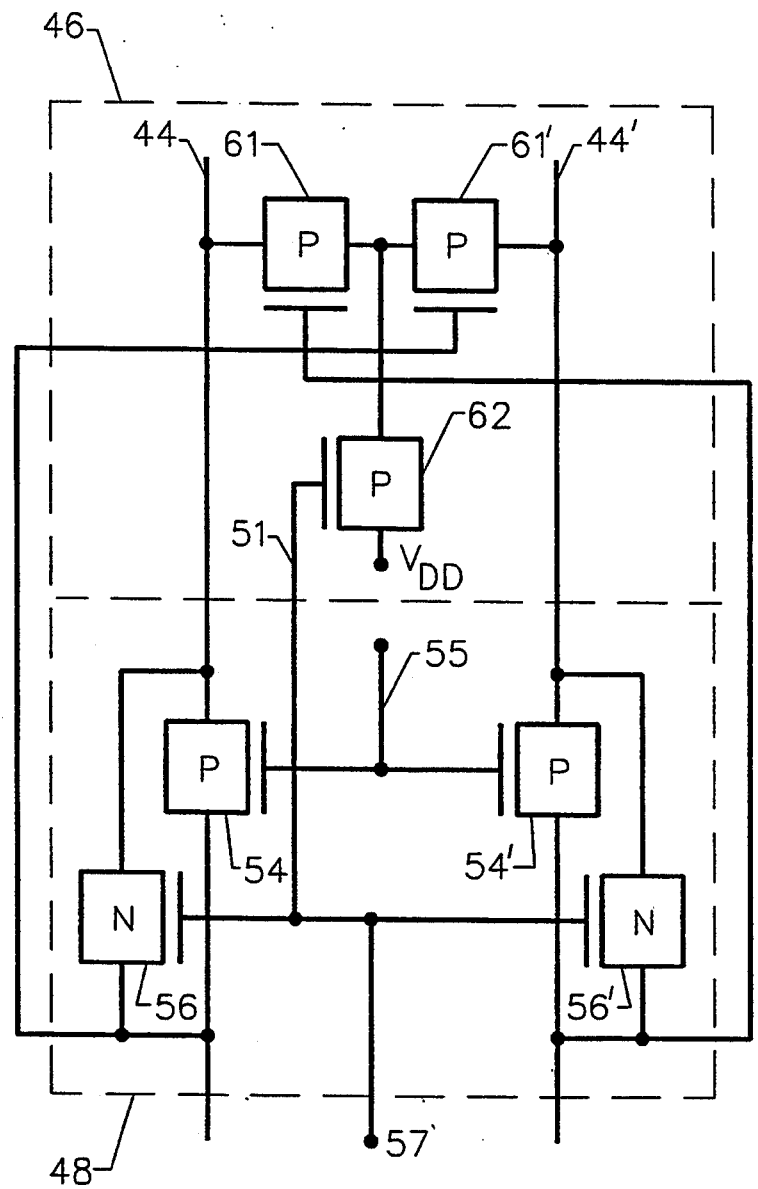

Referring now to the embodiment of FIG. 17, the third coupling means 48 is identical to FIG. 16. The first coupling means 46 is identical to FIG. 16, except that another P channel transistor 62 is added in order to allow the transistors 61, 61' to be turned off during a write operation.

Figure 18:
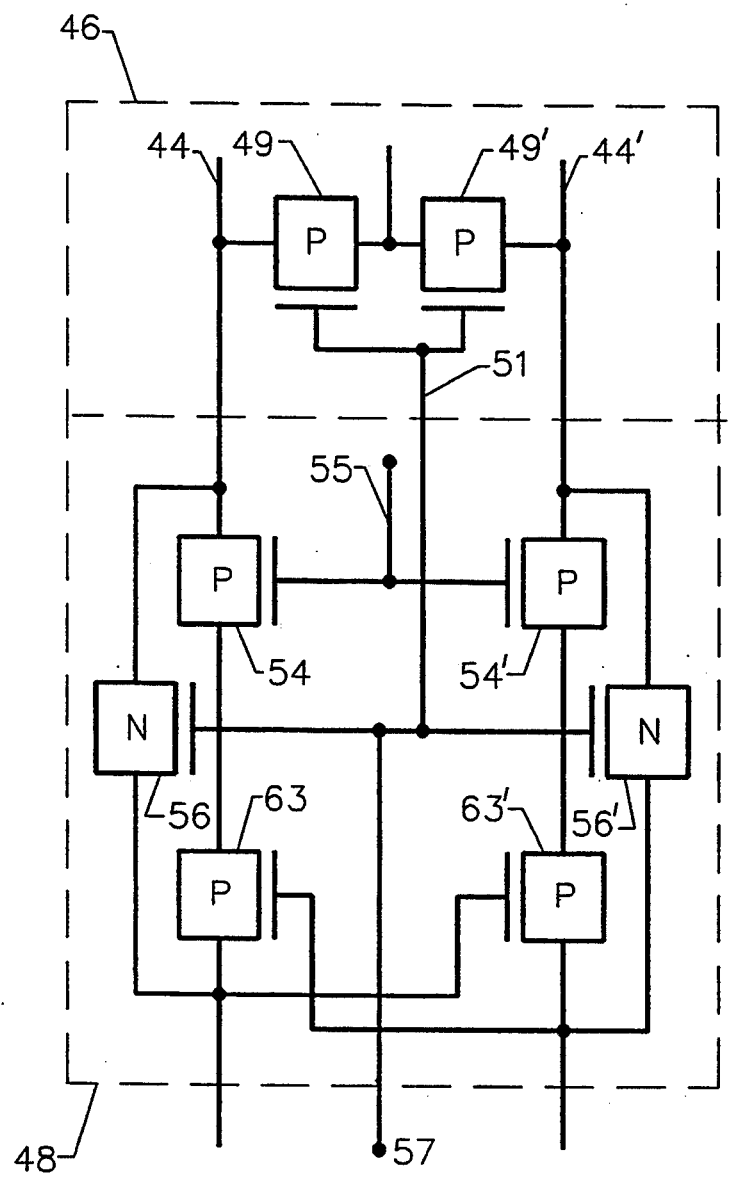
Figure 19:
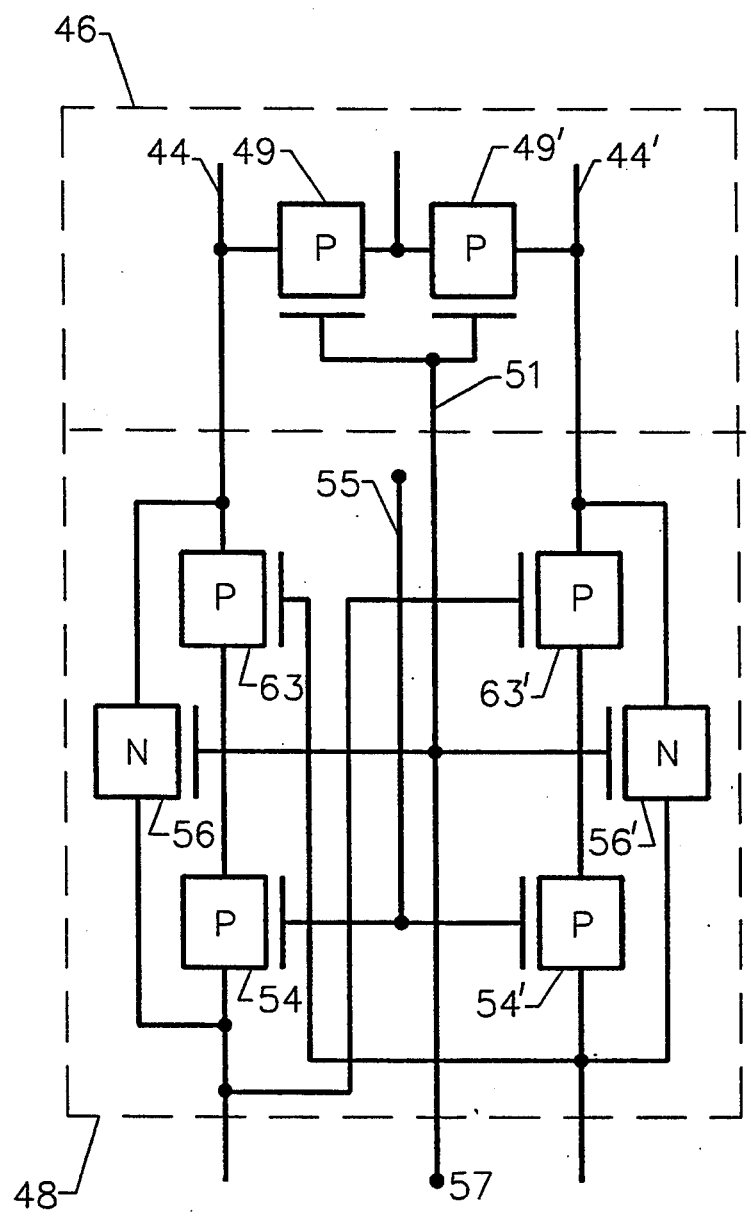

FIG. 18 describes another embodiment of the Parent Applications. The first coupling means 46 is identical to FIG. 14. However, the second coupling means 48 adds a pair of cross coupled transistors 63, 63' to provide additional feedback and thereby amplify the differential signal. As shown in FIG. 18, the additional transistors may be located between transistors 54, 54' and the signal bit lines 45, 45'. Alternatively, as shown in FIG. 19, the cross coupled transistors 63, 63' may be located between the first coupling means 46 and the transistors 54, 54'.

Other embodiments of the first and third coupling means will be envisioned by those having skill in the art, in which the first and third coupling means are located at one end of the primary bit lines, adjacent the signal bit lines. The first coupling means is not located at the opposite (remote) end of the primary bit lines. Although it would appear to be undesirable to allow the remote end of the primary bit line to act as an unterminated transmission line, it has been unexpectedly found, both experimentally and theoretically, that improved performance may be obtained when the first coupling means are moved to the close end of the primary bit lines, adjacent the signal bit lines and the third coupling means.

From the above Description of a Preferred Embodiment, it will be understood by those having skill in the art that the Differential Latching Inverter, memory architecture, read and write control circuit, memory operation timing control circuit and address change detection circuit may be used independently to improve the operation of conventional random access memories. However, it will also be understood by those having skill in the art that these elements may all be incorporated together into a unique random access memory design which exhibits high speed and low power dissipation. For example, a computer simulation of a 128 kilobit SRAM array using these circuits and implemented in 0.8 micron MOSFET technology exhibits a read or write cycle time of eight nanoseconds, and a power dissipation of 200 milliwatts operating at 125 mHz, at room temperature. The memory dissipates 200 microwatts when idle. This performance is unheard of in the present state of the art of SRAM design. When 0.8 micron Fermi-FET technology is employed, 200 mHz performance is readily achieved with less power.

Coincident Activation of Pass Transistors

In order to describe the problems of conventional six transistor SRAM cells, the operation of a conventional SRAM cell in the architecture of the Parent Applications will be described.

Figure 20A:
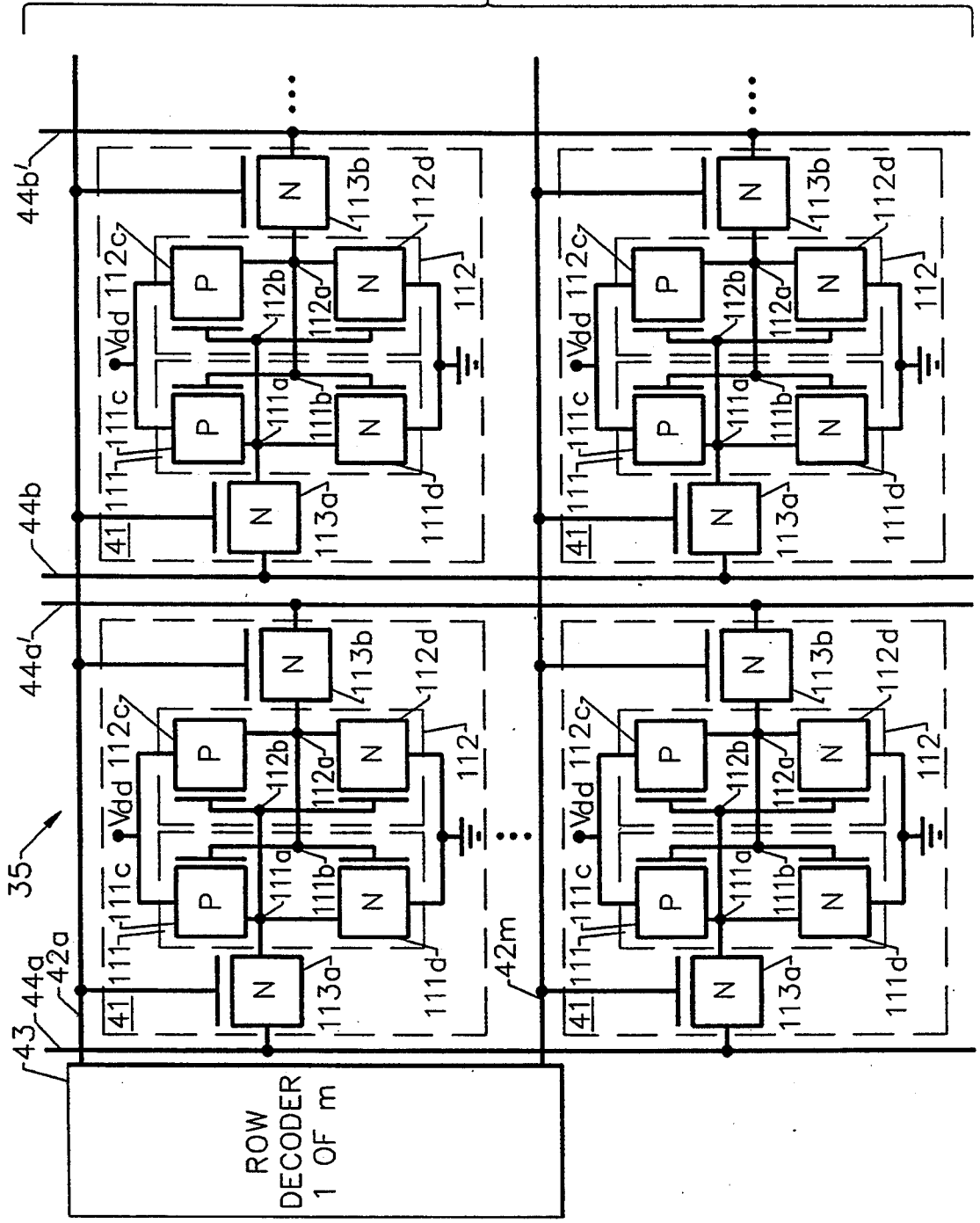
FIGS. 20A and 20B, which form FIG. 20 when placed adjacent one another as indicated, illustrate the random access memory architecture of FIG. 4 using conventional six transistor memory cells.
Figure 20B:
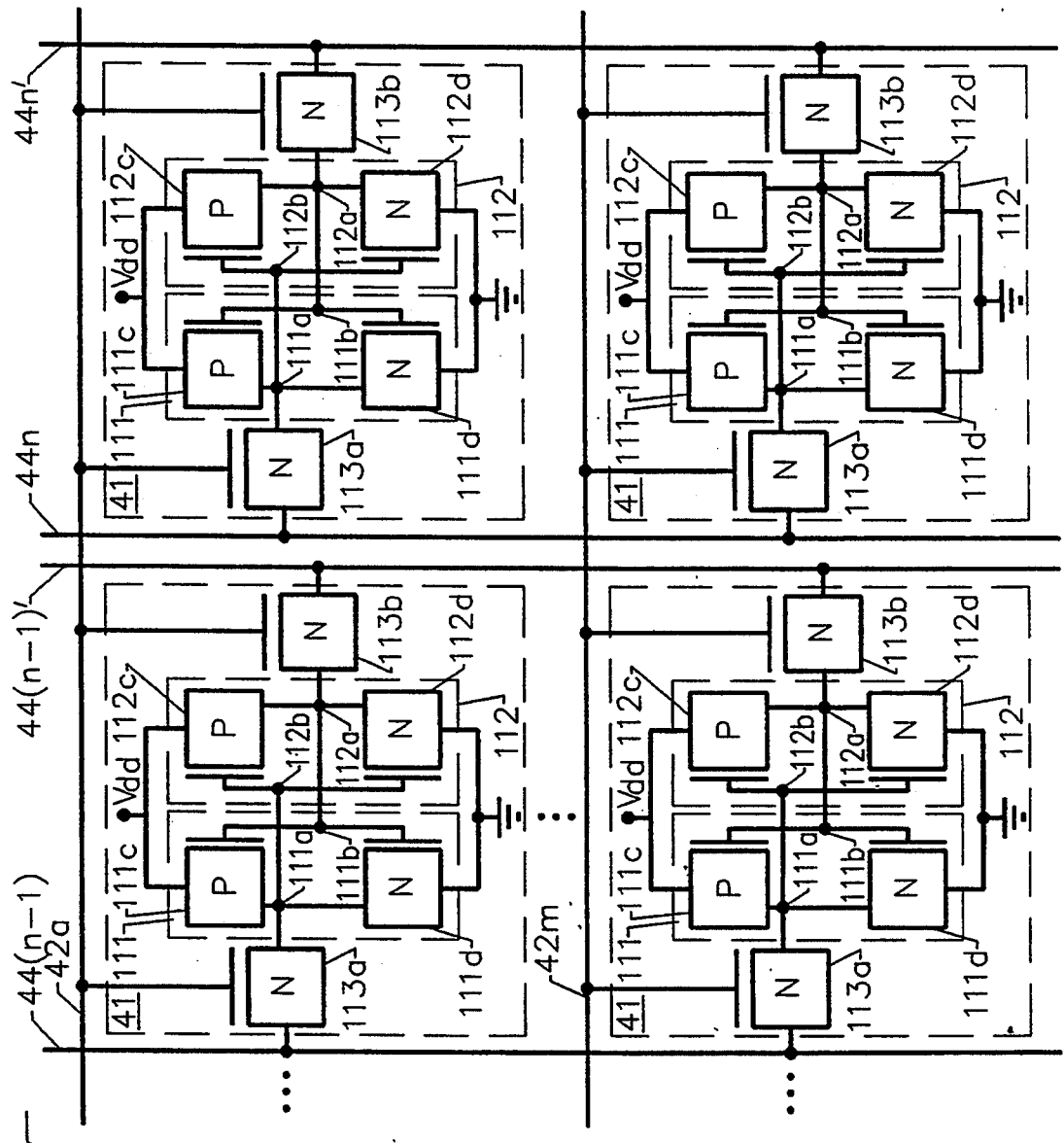

FIGS. 20A and 20B, which when placed together form FIG. 20, illustrate an array of SRAM cells 41 operating in the SRAM architecture of FIGS. 4A–4B and 14A–14B. It will be understood by those having skill in the art that the SRAM cells 41 may also operate in a conventional SRAM architecture.

As illustrated in FIG. 20, an array 35 of m rows and n columns of SRAM cells 41 is shown. Each SRAM cell 41 includes a pair of cross coupled complementary inverters. The first complementary inverter 111 includes an input 111b and an output 111a, and is comprised of P-channel transistor 111c and N-channel transistor 111d which are serially connected between first and second reference voltages, typically the power supply voltage $V_{DD}$ and ground. Inverter input 111b is the controlling electrodes (gates) of transistors 111c and 111d and output 111a is the connection node between serially connected transistors 111c and 111d. Complementary topologies can also be used. The second complementary inverter 112 includes an output 112a and an input 112b and is comprised of serially connected P-channel transistor 112c and N-channel transistor 112d. Inverter input 112b is the controlling electrodes (gates) of transistors 112c and 112d and output 112a is the connection node between serially connected transistors 112c and 112d. The output 111a of the first complementary inverter 111 is electrically connected to the input 112b of the second complementary inverter 112, and the output 112a of the second inverter 112 is connected to the input 111b of the first inverter 111 to form a latch of cross-coupled complementary transistor inverters, which is capable of storing a binary 1 or 0 therein.

Also included in the SRAM cell 41 is a pair of pass transistors 113a and 113b. The controlled electrodes (source and drain) of the first pass transistor 113a are connected between a first associated bit line 44a . . . 44n and the output 111a of the first complementary inverter 111. The controlling electrode (gate) of first pass transistor 113a is connected to the associated word line 42a–42m. Similarly, the controlled electrodes of the second pass transistor 113b are connected between the output 112a of the second complementary inverter 112 and an associated bit line 44a′–44n′, and the controlling electrode of the second pass transistor 113b is connected to the associated word line 42a–42m. It will be understood by those having skill in the art that an array of only two rows and four columns of cells are shown in FIG. 20. However, typically, up to 256 or more rows and up to 256 or more columns of cells may be used.

In operation, each bit line 44a–44n and 44a′–44n′ is referenced to positive potential such as $V_{DD}$. In order to read or write into a selected cell 41, the row decoder 43 selects the row 42a–42m associated with the desired cell 41, for example by bringing the selected row to $V_{DD}$. When the decoded word line is energized, one of the pass transistors 113a or 113b in each of the SRAM cells 41 connected to that row will sink current to ground from the appropriate bit line 44a–44n or 44a′–44n′, depending on the digital state of the RAM cell. Accordingly, if there are 256 RAM cells 41 in each row, and the sink current is 1 mA, then 256 mA flows between ground and $V_{DD}$ when a word line is selected. At the end of the word pulse upon deselection of the word line, all 256 bit line pairs are recharged back up to $V_{DD}$, again resulting in substantial transient power consumption.

Figure 21A:
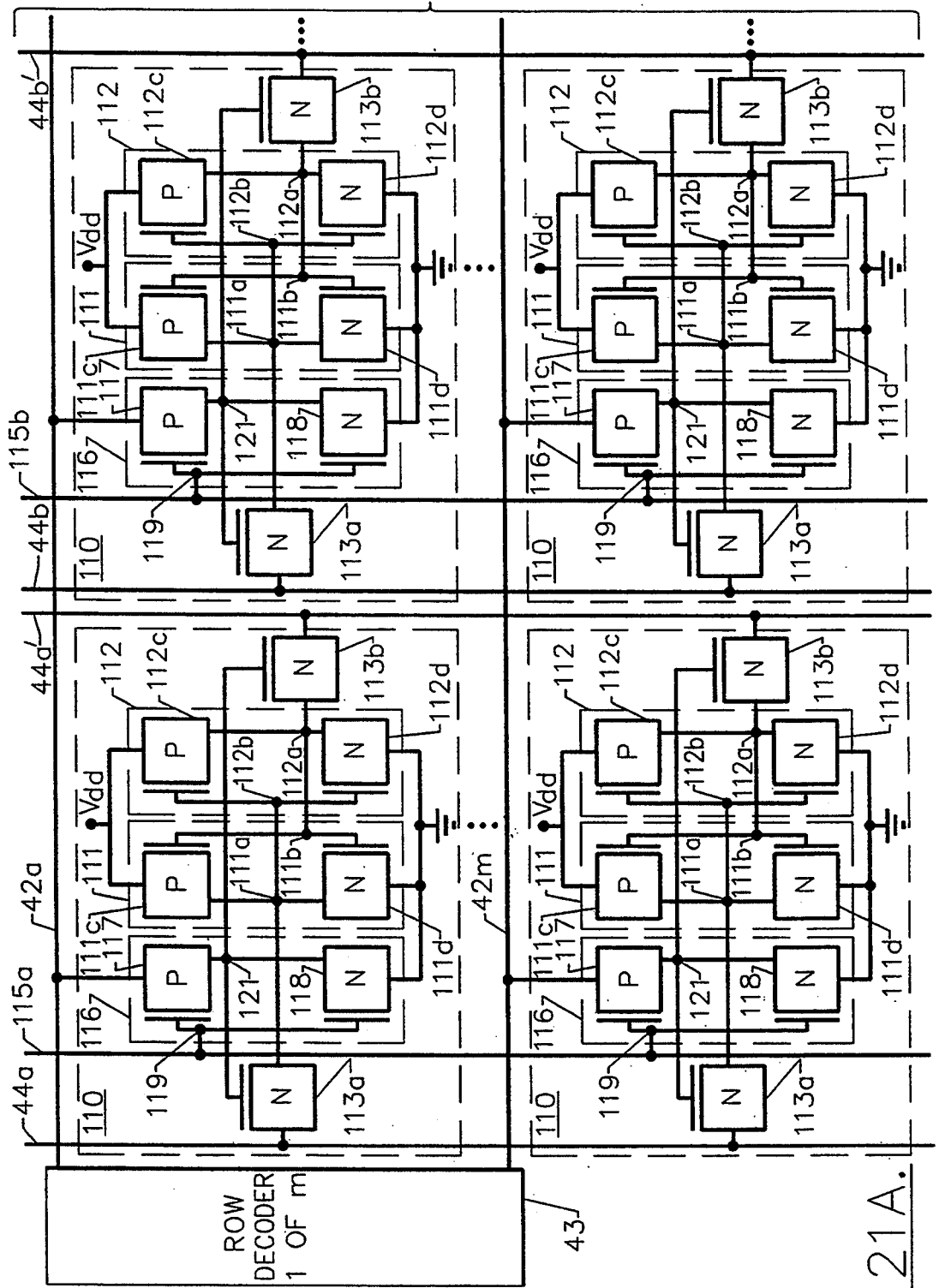
FIGS. 21A and 21B, which form FIG. 21 when placed adjacent one another as indicated, illustrate a random access memory having coincident pass transistor activation means according to the present invention.
Figure 21B:
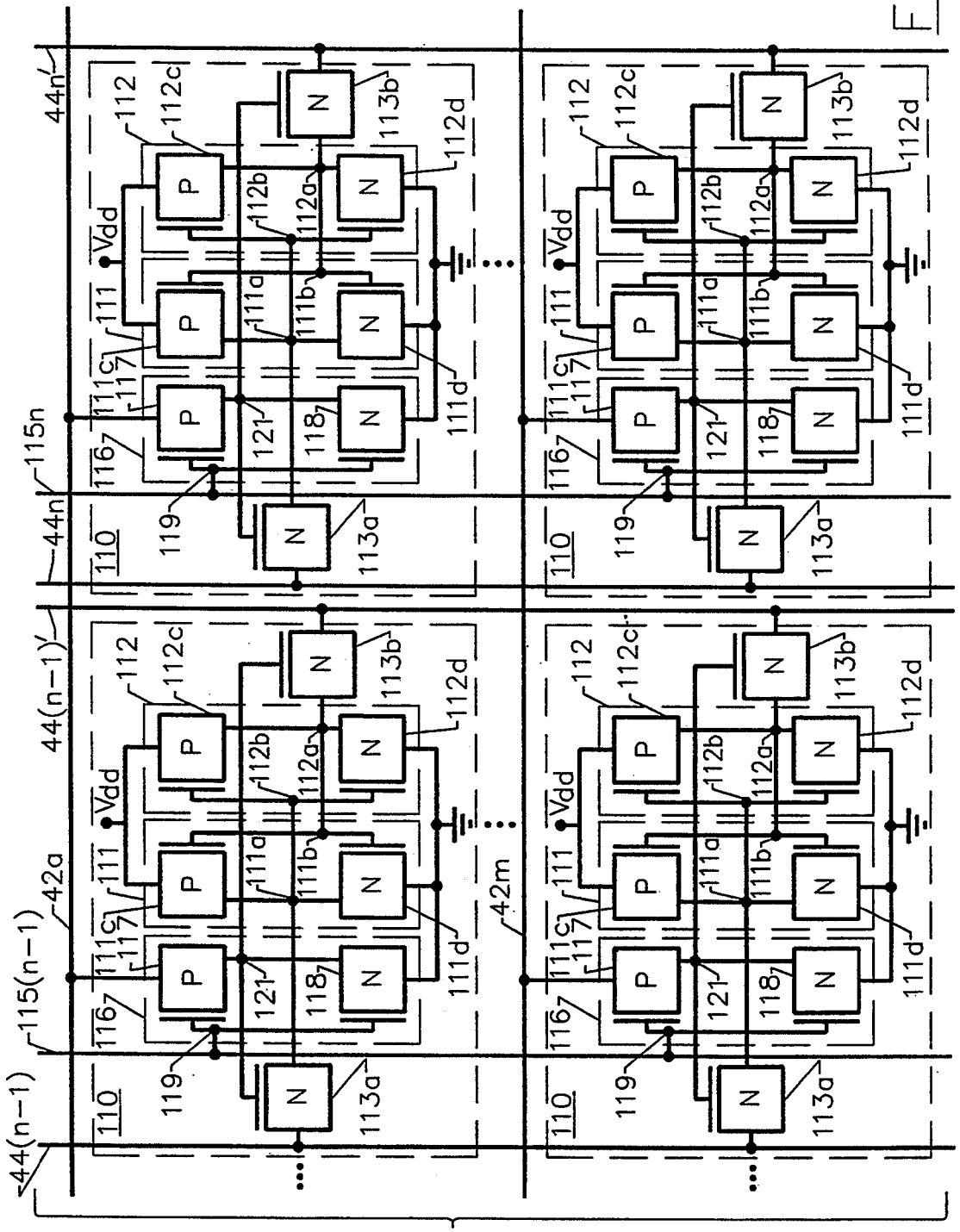

Referring now to FIGS. 21A and 21B, which when placed together as indicated form FIG. 21, a random access memory having coincident pass transistor activation means according to the present invention will now be described. It will be understood that the SRAM cell described in FIG. 21 may be used in a conventional SRAM architecture as well as the unique architecture described in the Parent Applications. As shown in FIG. 21, SRAM cell 110 includes a column select line 115a–115n for each column of the array. Each column select line 115a–115n is coupled to a gating means 116 such that the pass transistors 113 in the memory cell 110 are only activated upon coincident (simultaneous) selection of the word line 44 and column select line 115 associated with that cell. Selection of only the word line or only the column select line will not activate the pass transistors. Accordingly, when a word line 42 is selected, all of the pass transistors in the selected row will not be activated. Power consumption is thereby dramatically reduced. For example, if 256 cells are included in each row, transient power consumption is reduced to 1/256 of its value without the coincident pass transistor activation means.

As shown in FIG. 21, a preferred embodiment of the gating means 116 is a third inverter comprising a complementary pair of transistors 117 and 118 which are serially connected between the word line 42 and a reference voltage such as ground. By coupling the transistor 117 to the associated word line 42, the word line acts as a power input for the transistor so that the gating means 116 is inactive unless the word line is accessed by the row decoder. The output of the inverter 121 is connected to the controlled electrodes (gates) of the associated pass transistors 113a and 113b, and the column select line 115a is connected to the input 119 of the gating means 116. Alternatively, transistor 117 can be coupled to the associated column select line 115 and the input 119 of the inverter can be coupled to the associated word line 42.

The gating means 116 functions as an AND gate, so that the pass transistors 113a and 113b are only activated when the associated word line 42 is selected and the associated column select line 115 is selected. Unless both the word line and column select line are selected, the pass transistors are inactive. Accordingly, all other pass transistors in the row selected by the word decoder 43 remain inactive. Power consumption is thereby dramatically reduced. It will be understood by those having skill in the art, that as configured, the gating means 116 is activated by negative logic, i.e. a column select means is activated by a transition from $V_{DD}$ to 0 volts.

It will also be understood by those having skill in the art that the seventh and eighth transistors 117 and 118 may be of minimum dimensions. Thus, if the P-channel transistors 111c and 112c have channel width of 2 $\mu$m and the N-channel transistors 111d and 112d have channel width of 6 $\mu$m, and the pass transistors 113a and 113b have channel width of 3 $\mu$m, the P- and N-channel transistors of the gating inverter may have channel width of 1 $\mu$m or less because they merely function as a logic AND gate, and drive very little capacitive loading.

It will be understood by those having skill in the art that the gating means shown in FIG. 21 also reduces the capacitive loading on row decoder 43 because the source of one transistor 117 is connected to the word line 42, rather than having a pair of pass transistor gates connected thereto. It will also be understood that the coincident selection means of the present invention greatly simplifies the ability to provide redundant bit locations to compensate for defects in the manufactured array of bits. Only a few extra word lines intersecting all bit line pairs need be provided, along with means to select the alternate word lines. Manufacturing yields are thereby increased.

Figure 22A:
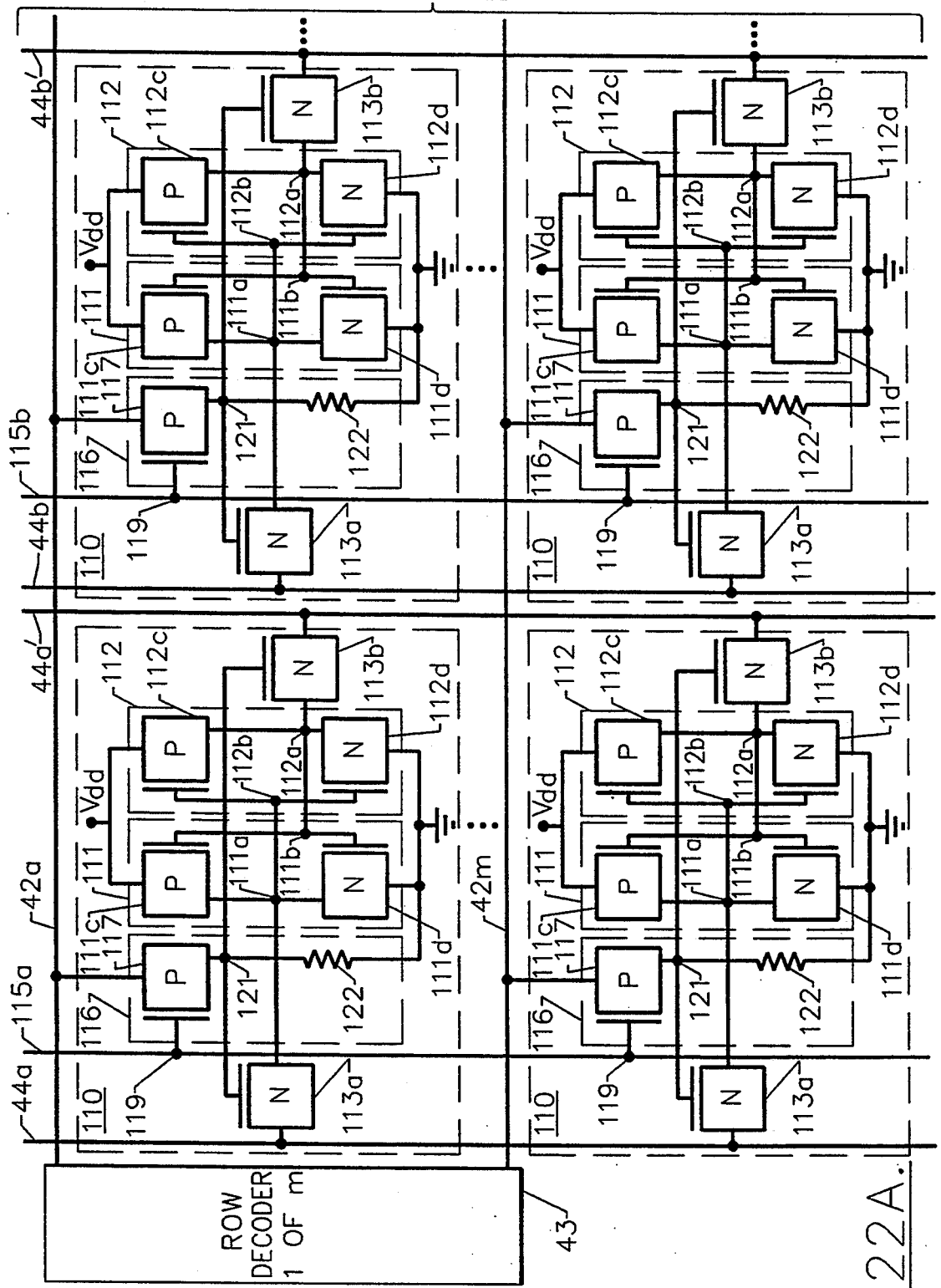
FIGS. 22A and 22B, which form FIG. 22 when placed adjacent one another as indicated, illustrate a random access memory including an alternate embodiment of the coincident pass transistor activation means according to the present invention.
Figure 22B:
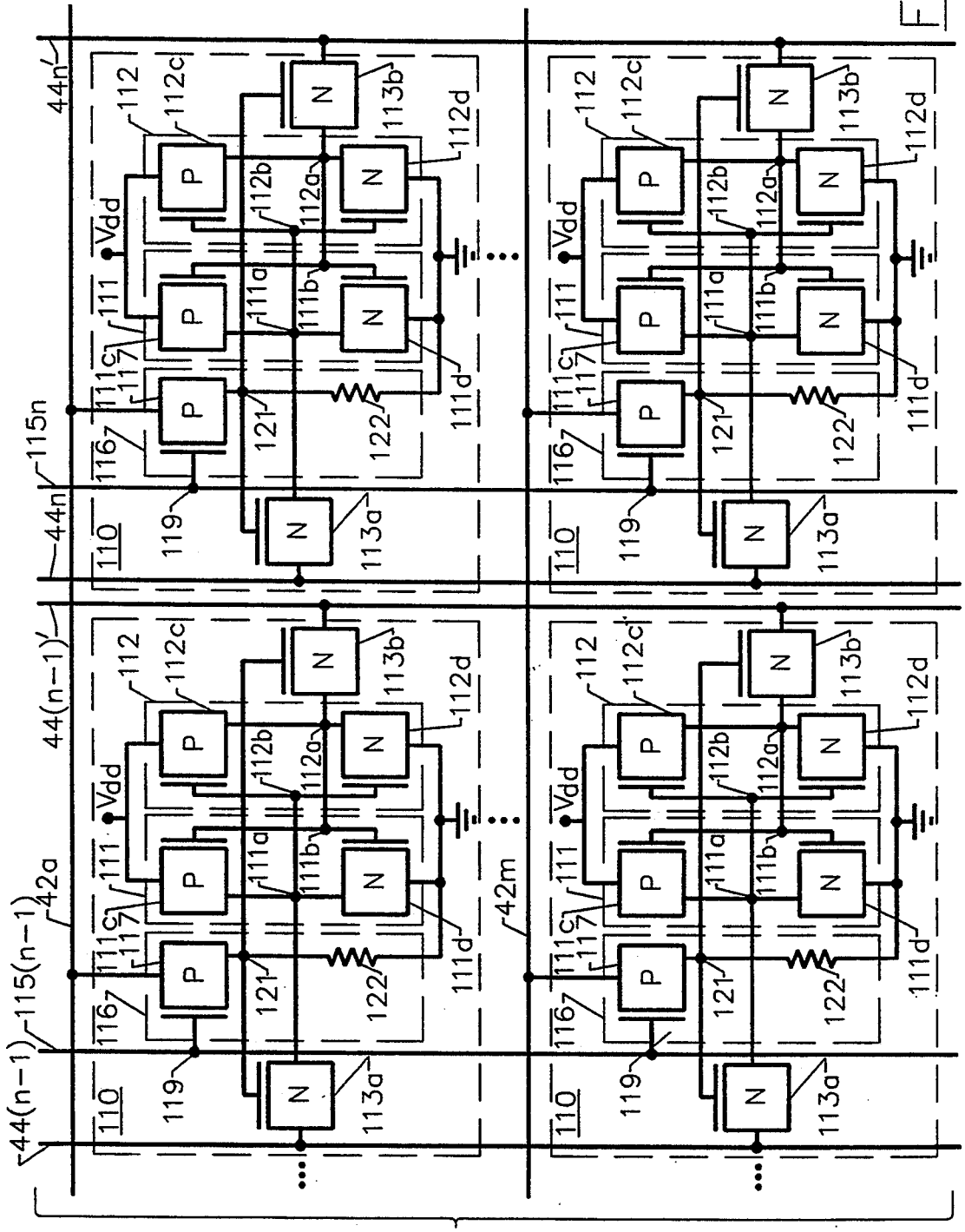

FIGS. 22A and 22B, which when placed together as indicated form FIG. 22, illustrate an alternate embodiment of the gating means 116. As shown, gating means 116 comprises a P-channel field effect transistor 117, and a resistor 122 instead of N-channel transistor 118. Preferably a 12 kΩ resistor fabricated in polysilicon is used.

Figure 23A:
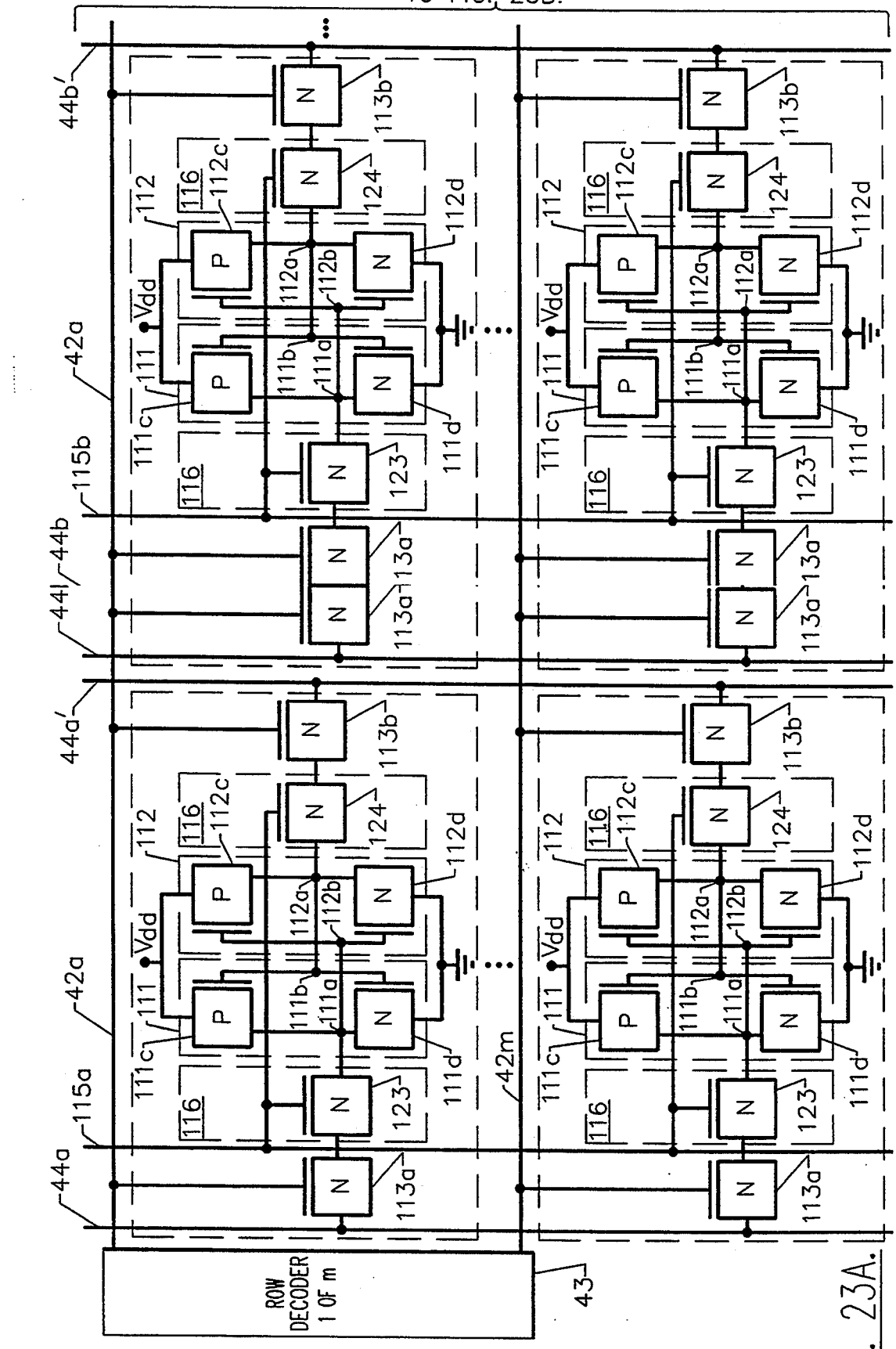
FIGS. 23A and 23B, which form FIG. 23 when placed adjacent one another as indicated, illustrate a random access memory including another alternate embodiment of the coincident pass transistor activation means according to the present invention.
Figure 23B:
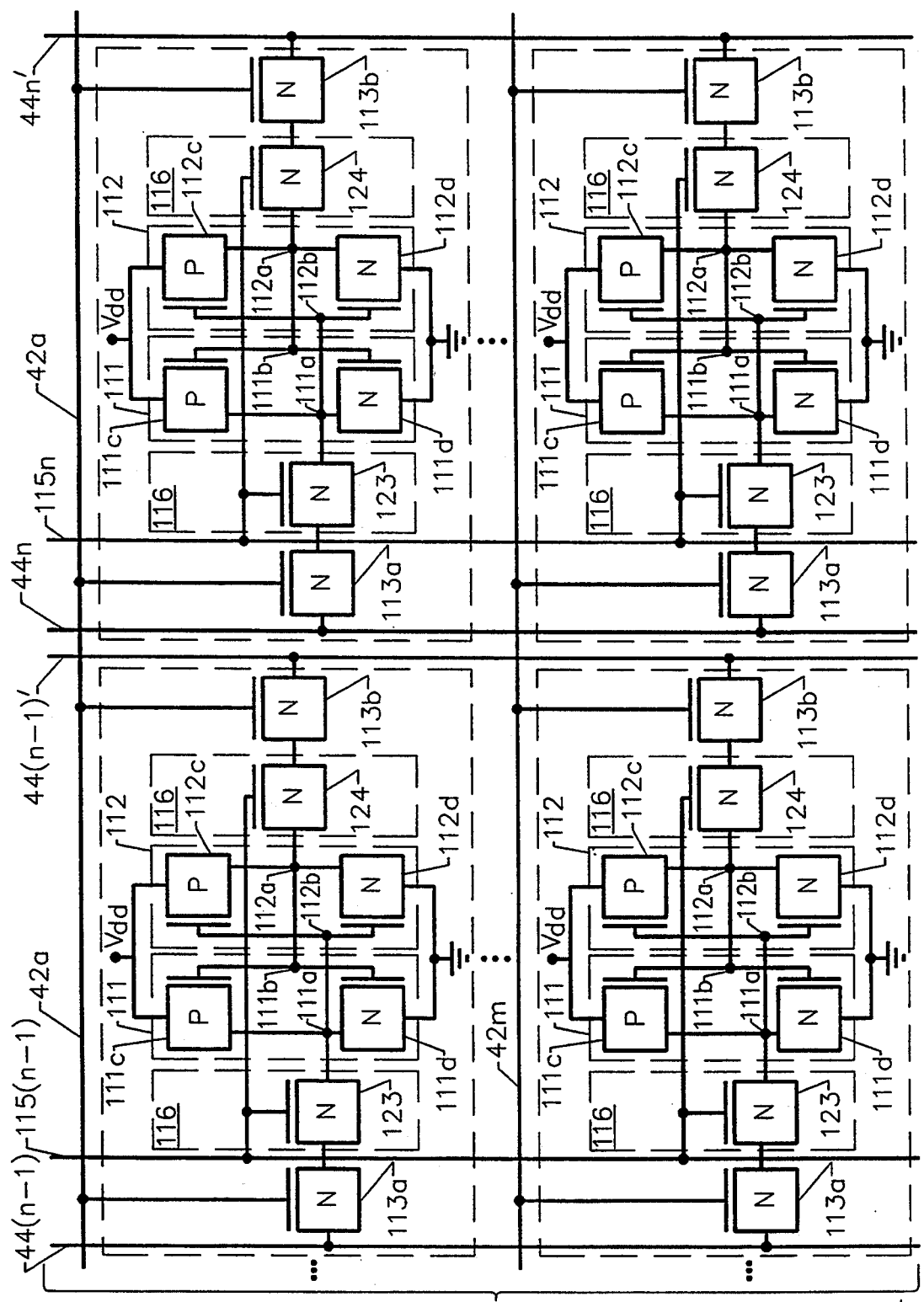

FIGS. 23A and 23B, which when placed together as indicated form FIG. 23, illustrate a third embodiment of the RAM cell of the present invention. In this embodiment, gating means 116 is embodied by a pair of transistors 123, 124. The controlled electrodes of seventh transistor 123 are serially connected between pass transistor 113a and the output 111a of first inverter 111. The controlled electrodes of the eighth transistor 124 are serially connected between the second pass transistor 113 and the output 112a of the second inverter 112. The controlling electrodes of transistors 123 and 124 are coupled to the column select line 115. The controlling electrodes of pass transistors 113a and 113b are coupled to the word line 42.

As described above, gating means 116 functions as an AND gate, for preventing activation of pass transistors 113a or 113b unless the associated word line is selected and the associated column select line 115 is selected. Otherwise, the pass transistors 113a and 113b are deactivated. In comparing the size of the gating transistors of FIG. 23 with the transistors of FIG. 21, the width of each of the transistors 113a, 113b, 123 and 124 must be twice the value of a conventional pass transistor if the original pass current is to be maintained. Thus, for example, if transistors 111d and 112d are 6 μm in width, each of transistors 113a, 113b, 123 and 124 are preferably 6 μm in width, rather than 3 μm for transistors 113a and 113b in FIG. 21, for example. Also, the capacitive loading on the row and column drivers is greater than the embodiment of FIG. 21.

Shared Bit Lines

As described, the coincident pass transistor activation means of the present invention greatly reduces transient power dissipation of the SRAM array, reduces capacitive loading on the word drivers and allows simplified cell redundancy, at the expense of slightly greater cell area due to the addition of the gating means and column select lines. However, the coincident pass transistor activation means of the present invention provides another unexpected advantage which allows reduction in the size of the array. In particular, because the bit lines are no longer used to select a particular column in the array, the bit lines between adjacent columns of the array may be shared. Accordingly, rather than providing a pair of bit lines for each column of the array, a single bit line is provided between each column, and is connected to both adjacent columns of the array. The number of bit lines is therefore reduced in half compared to a conventional SRAM array. Accordingly, the array size may be reduced.

Figure 24A:
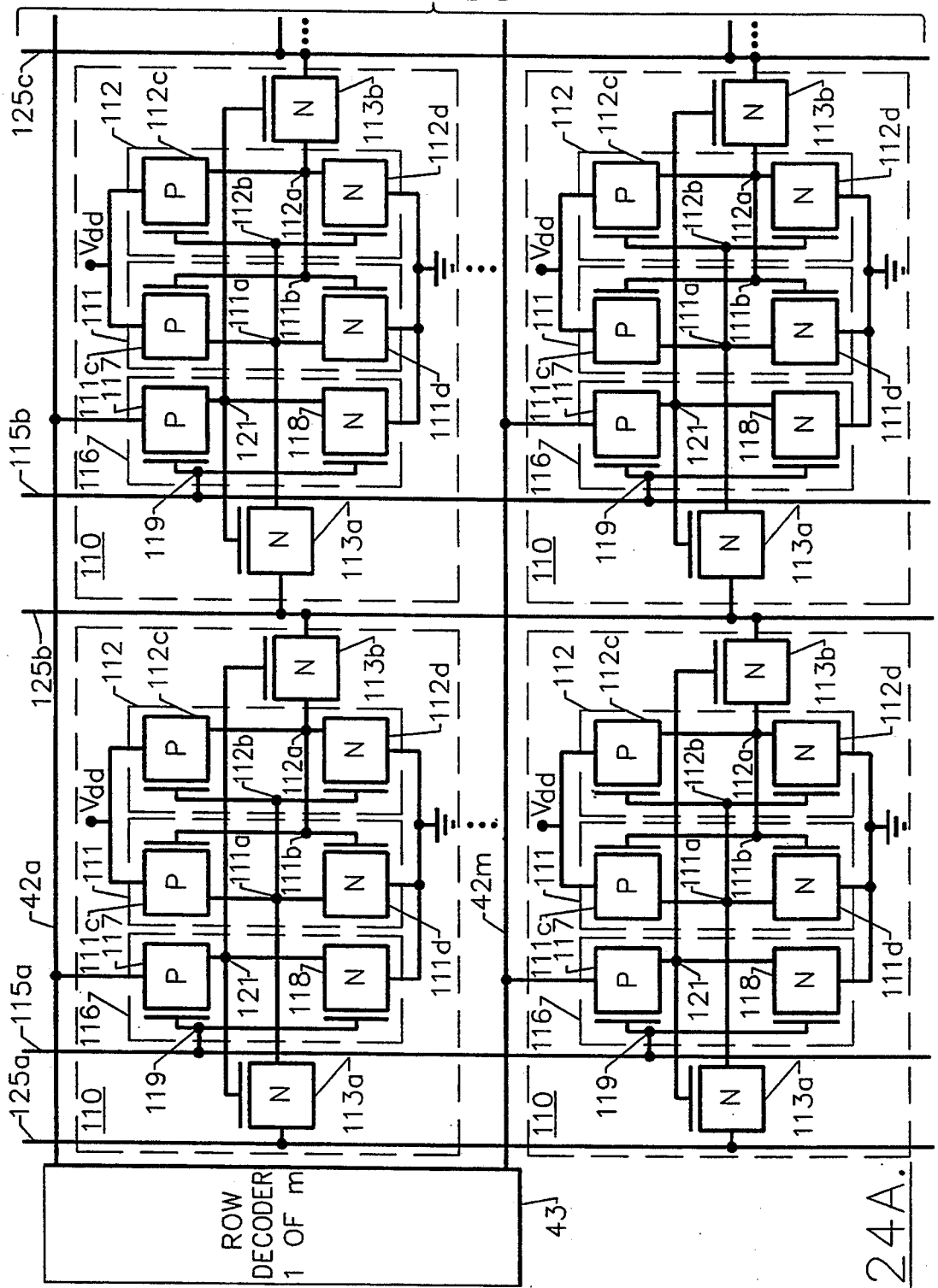
FIGS. 24A and 24B, which form FIG. 24 when placed adjacent one another as indicated, illustrate the memory array of FIG. 21, including shared bit lines according to the present invention.
Figure 24B:
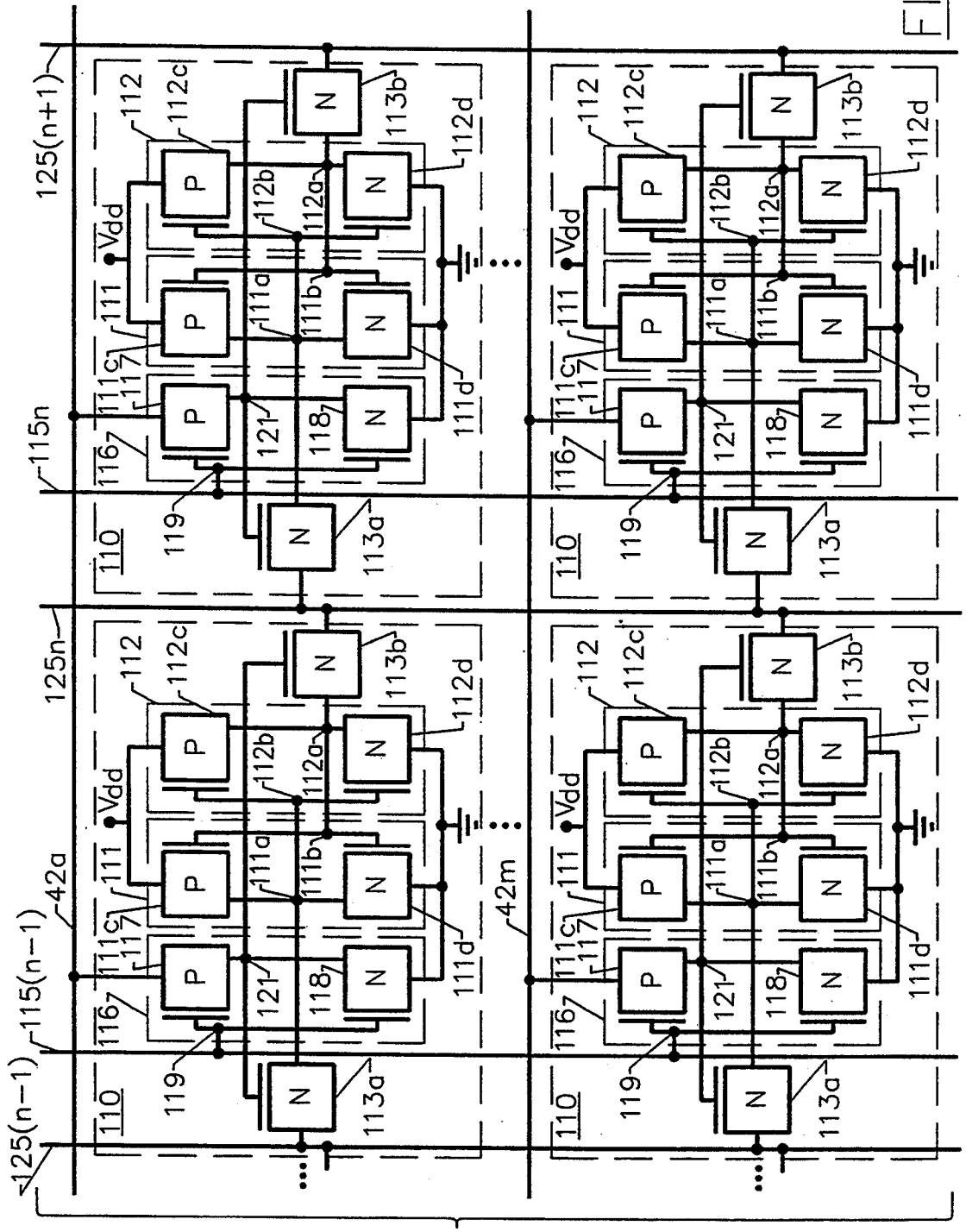
Figure 25A:
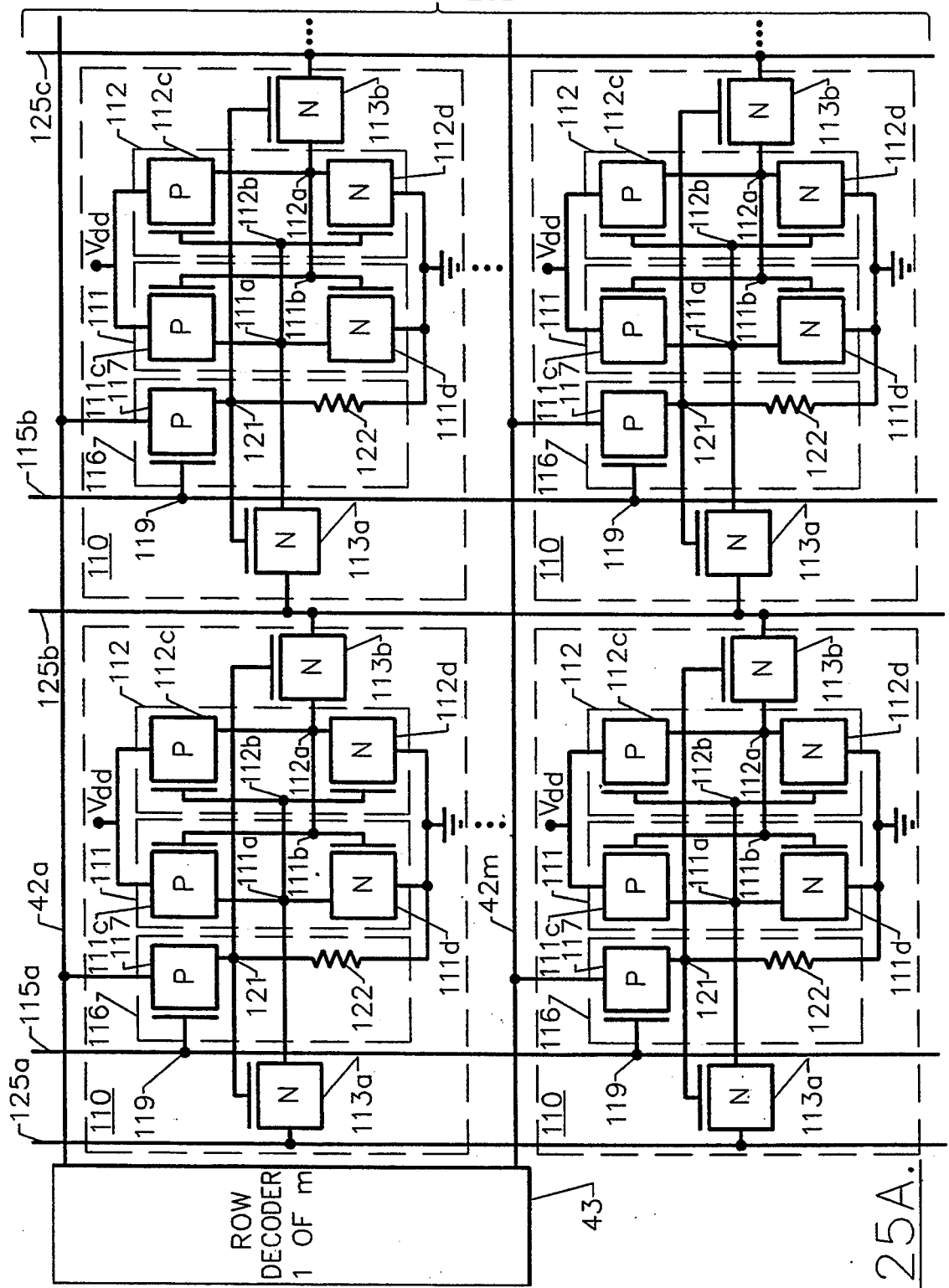
FIGS. 25A and 25B, which form FIG. 25 when placed adjacent one another as indicated, illustrate the memory array of FIG. 22, including shared bit lines according to the present invention.
Figure 25B:
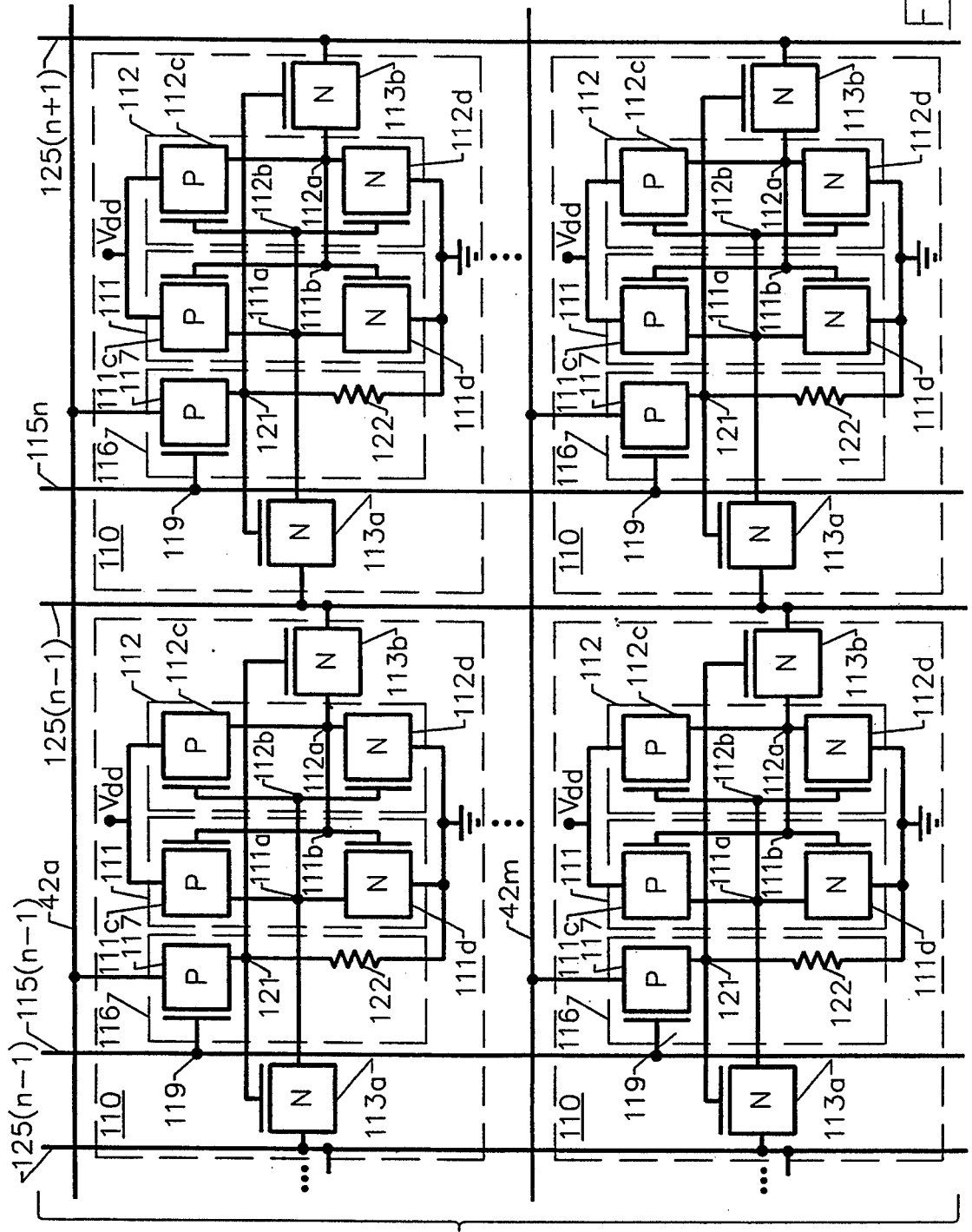
Figure 26B:
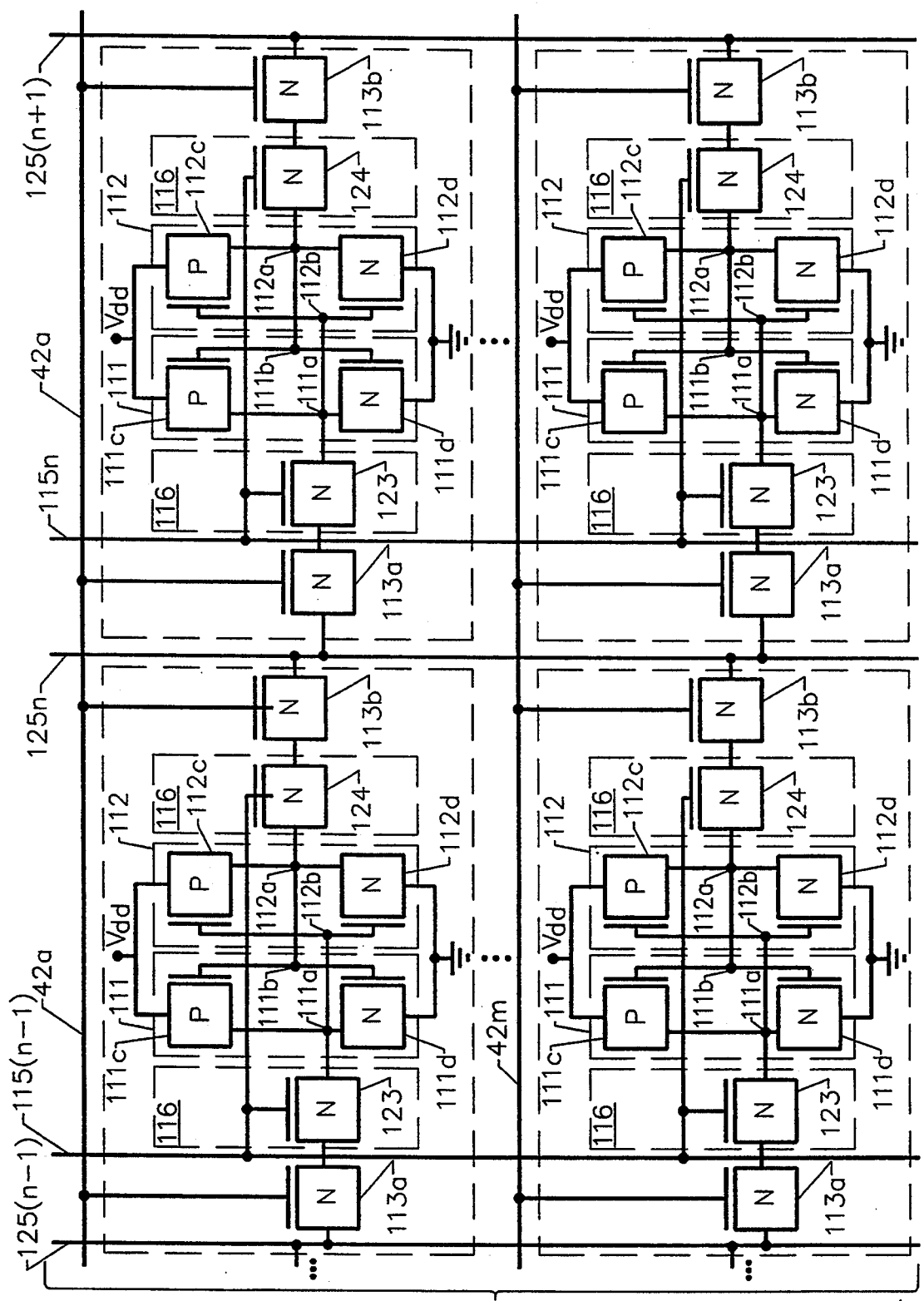

FIGS. 24A and 24B, which when placed together as indicated form FIG. 24, illustrate the SRAM array of FIG. 21 including n+1 shared bit lines 125a–125n+1. As shown, for example, bit line 125b is connected to the pass transistors 113a and 113b in the SRAM cells on both sides thereof. Since the column select lines 115a–115n govern the selection of a pair of pass transistors, those memory cells which are unselected by a column select line will not be affected by the state of the associated bit line. Thus, the bit lines can be shared.

For example, if column select line 115b and word line 42a are selected, only the pass transistors in the cell at the intersection thereof will be activated. The pass transistors in the cells to the left of bit line 125b and the right of bit line 125c will not be activated. Thus, data can be transferred to and from the cell selected by column select line 115b using bit lines 125b and 125c, without affecting any of the other cells connected to these bit lines. A more compact array of RAM cells may thereby be constructed with minimum bit line width and pitch compared with the a six transistor RAM array.

It will be understood by those having skill in the art that for SRAM organizations requiring simultaneous reading or writing of multiple bits, the shared bit lines require all bit groups read or written to have odd or even column numbers, so that cells in adjacent columns are not simultaneously accessed. If only a single read or write operation takes place at a given time, there is no such restriction. FIGS. 25A and 25B and FIGS. 26A and 26B illustrate the SRAM arrays of FIGS. 22 and 23 respectively, with shared bit lines.

Figure 27B:
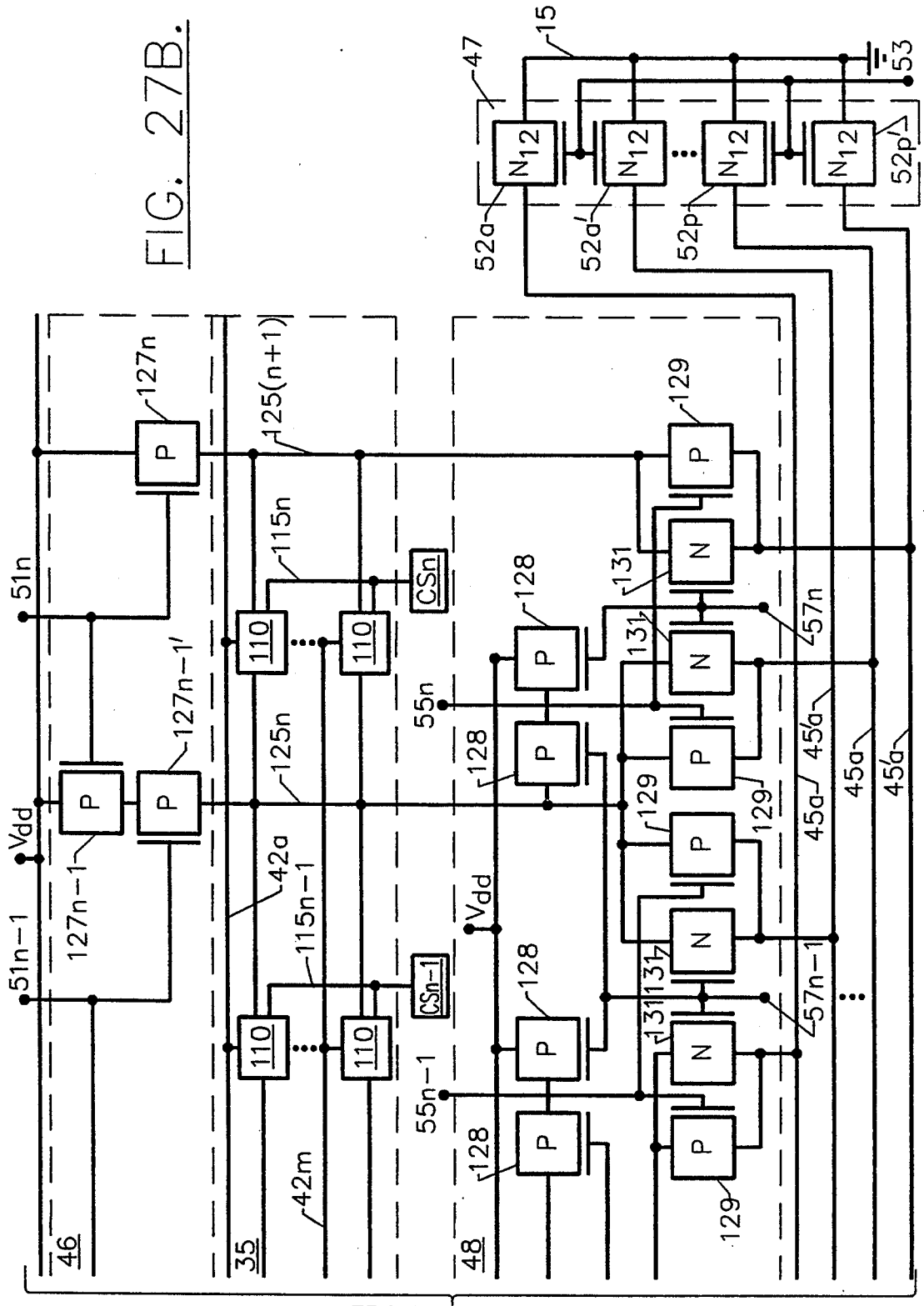

Referring now to FIGS. 27A and 27B, which together form FIG. 27, modifications to the first coupling circuit 46 and third coupling circuit 48 of FIGS. 4A and 4B will be described, which permit shared bit line access. Operation of the memory with the modified circuit was already described in connection with FIG. 4. It will be understood by those having skill in the art that similar shared bit line access circuitry can be provided for any memory architecture that uses the coincident selection means and shared bit lines of the present invention.

In particular, referring to FIG. 27, the first coupling circuit 46 includes stacked pairs of transistors 127a, 127a', 127b, 127b' . . . to provide coupling of gates 51a–51n to the shared bit lines 125a–125n. Operation of gates 51a–51n was already described in connection with FIGS. 4A and 4B. Third coupling circuit 48 also operates as was described in connection with FIGS. 4A and 4B, as far as read signal lines 55a–55p, and write signal lines 57a–57p are concerned. The internal circuitry is modified, however, to accommodate sharing of bit lines, as shown in FIG. 27.

In particular, P-channel transistors 128 reference the shared bit lines 125a–125p to supply potential $V_{DD}$. These transistors 128 are in continuous mode of operation except during a write cycle. During a write cycle, the row and column select signals activate the RAM cell connected between the appropriate main bit lines. A write signal is applied to the appropriate line 57 to thereby disable the $V_{DD}$ referencing condition only on the associated pair of shared bit lines. The n-channel transistors 131 in the appropriate column are activated, so that the predetermined signal voltage line potential allows a 1 or a 0 to be written into the activated RAM cell. During a read operation, the P-channel transistors 129 cause the appropriate pair of signal bit lines to rise in potential, allowing the differential latching inverter 10 to sense the digital state of the activated RAM cell. All other features of the already described SRAM are unaltered except for the internal circuit configuration of circuits 48 and 46 to accommodate sharing of bit lines. The column select signal CS1-CSN is provided from the column decoder outputs, with a ring segment buffer or other known means being used to invert the logic state if necessary, and to provide the requisite delay for timing purposes.

The coincident pass transistor activation means described above can be used together with or separate from the shared bit lines described above. Moreover, either or both of the coincident pass transistor activation means and the shared bit lines can be used in conventional memory architectures to reduce transient power and to produce a dense design. However, preferably, both of these concepts are used with the *Differential Latching Inverter and Random Access Memory Using Same*, as described in copending application Ser. Nos. 07/708,459 and 07/742,649 to provide a high speed, low power, dense random access memory.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A Random Access Memory (RAM) comprising:
   an array of memory cells arranged in rows and columns, each of said memory cells storing therein a binary digit, each of said memory cells including a pair of pass transistors for providing external access to said memory cell, each of said pass transistors including a controlling electrode; and
   coincident pass transistor activation means, for activating the controlling electrodes of the pair of pass transistors in a memory cell only upon simultaneous selection of both the associated row and the associated column of the memory cell, and for preventing activation of the controlling electrodes in the pair of pass transistors in a memory cell otherwise.

2. A Random Access Memory (RAM) comprising:
   an array of memory cells arranged in rows and columns, each of said memory cells storing therein a binary digit, each of said memory cells including pass transistors for providing external access to said memory cell;
   coincident pass transistor activation means, for activating the pass transistors in a memory cell only upon simultaneous selection of both the associated row and the associated column of the memory cell, and for preventing activation of the pass transistors in a memory cell otherwise; and
   a bit line between each pair of adjacent columns of said memory cells, for transferring binary data to and from said memory cells, the memory cells in each pair of adjacent columns being connected to said bit line therebetween.

3. A Random Access Memory (RAM) comprising:
   an array of memory cells arranged in rows and columns, each of said memory cells storing therein a binary digit, each of said memory cells including pass transistors for providing external access to said memory cell;
   coincident pass transistor activation means, for activating the pass transistors in a memory cell only upon simultaneous selection of both the associated row and the associated column of the memory cell, and for preventing activation of the pass transistors in a memory cell otherwise; and
   a plurality of word lines, a respective one of which is connected to a respective row of said memory cell array for selecting at least one row of said memory cell array; and wherein said coincident pass transistor activation means comprises:
   a plurality of column select lines, a respective one of which is connected to a respective column of said memory cell array for selecting at least one column of said memory cell array; and
   gating means in each memory cell, electrically connected to at least one of the associated word line, the associated column select line and the associated pass transistors, for electrically activating the associated pass transistors only upon simultaneous selection of the associated column select line and the associated word line, and for preventing electrical activation of the associated pass transistors otherwise.

4. The RAM of claim 3 further comprising:
   a bit line between each pair of adjacent columns of said memory cells, for transferring binary data to and from said memory cells, the memory cells in each pair of adjacent columns being connected to said bit line therebetween.

5. The RAM of claim 3 further comprising a plurality of bit lines, a respective at least one of which is connected to the memory cells in a respective column of said memory cell array, for transferring binary data to and from said memory cells;
   wherein each of said memory cells comprises a first and a second complementary inverter, each of which includes an input and an output, with the input of the first complementary inverter being connected to the output of said second complementary inverter and the input of said second complementary inverter being connected to the output of said first complementary inverter, and wherein said pass transistors comprise a first and a second pass transistor each having a controlling electrode and a pair of controlled electrodes;
   the controlled electrodes of said first pass transistors being electrically connected between an associated bit line and the output of the associated first complementary inverter, the controlled electrodes of said second pass transistors being electrically connected between an associated bit line and the output of the associated second complementary inverter;
   wherein said gating means comprises a third complementary inverter having an input and an output, said third complementary inverter being electrically connected to the associated word line, the associated column select line and the controlling electrodes of said first and said second pass transistors.

6. The RAM of claim 5 wherein said plurality of bit lines comprise a plurality of shared bit lines, a respective one of which is connected to the memory cells in a respective pair of adjacent columns, the controlled electrodes of said first pass transistors being electrically connected between an associated shared bit line and the output of the associated first complementary inverter, and the controlled electrodes of the second pass transistors in an immediately preceding column being electrically connected between said associated shared bit line and the output of the associated second complementary inverter.

7. The RAM of claim 3 further comprising a plurality of bit lines, a respective at least one of which is connected to the memory cells in a respective column of said memory cell array, for transferring binary data to and from said memory cells;

wherein each of said memory cells comprises a first and a second complementary inverter, each of which includes an input and an output, with the input of the first complementary inverter being connected to the output of said second complementary inverter and the input of said second complementary inverter being connected to the output of said first complementary inverter, and wherein said pass transistors comprise a first and a second pass transistor each having a controlling electrode and a pair of controlled electrodes;

the controlled electrodes of said first pass transistors being electrically connected between an associated bit line and the output of the associated first complementary inverter, the controlled electrodes of said second pass transistors being electrically connected between an associated bit line and the output of the associated second complementary inverter;

wherein said gating means comprises:

a transistor having a controlling electrode and a pair of controlled electrodes, the transistor being connected between the associated word line, the associated column select line and the controlling electrodes of said pass transistors; and a resistor, electrically connected to the controlling electrodes of said pass transistors.

8. The RAM of claim 7 wherein said plurality of bit lines comprise a plurality of shared bit lines, a respective one of which is connected to the memory cells in a respective pair of adjacent columns, the controlled electrodes of said first pass transistors being electrically connected between an associated shared bit line and the output of the associated first complementary inverter, and the controlled electrodes of the second pass transistors in an immediately preceding column being electrically connected between said associated shared bit line and the output of the associated second complementary inverter.

9. The RAM of claim 3 further comprising a plurality of bit lines, a respective at least one of which is connected to the memory cells in a respective column of said memory cell array, for transferring binary data to and from said memory cells;

wherein each of said memory cells comprises a first and a second complementary inverter, each of which includes an input and an output, with the input of the first complementary inverter being connected to the output of said second complementary inverter and the input of said second complementary inverter being connected to the output of said first complementary inverter, and wherein said pass transistors comprise a first and a second pass transistor each having a controlling electrode and a pair of controlled electrodes;

wherein said gating means comprises:

a seventh and an eighth transistor, each having a controlling electrode and a pair of controlled electrodes, the controlled electrodes of said first pass transistor and said seventh transistor being serially connected between the associated bit line and the output of said first complementary inverter, the controlled electrodes of said second pass transistor and said eighth transistor being serially connected between the associated bit line and the output of said second complementary inverter, the controlling electrode of one of said first pass transistor and said seventh transistor being connected to the associated word line and the controlling electrode of the other of said first pass transistor and said seventh transistor being connected to the associated column select line, the controlling electrode of one of said second pass transistor and said eighth transistor being connected to said associated word line and the controlling electrode of the other of said second pass transistor and said eighth transistor being connected to the associated column select line.

10. The RAM of claim 9 wherein said plurality of bit lines comprise a plurality of shared bit lines, a respective one of which is connected to the memory cells in a respective pair of adjacent columns, the controlled electrodes of said first pass transistors and said seventh transistors being serially connected between an associated shared bit line and the output of the associated first complementary inverter, and the controlled electrodes of said second pass transistors and said eighth transistors in an immediately preceding column being serially connected between said associated shared bit line and the output of the associated second complementary inverter.

11. A Random Access Memory (RAM) comprising:

an array of memory cells arranged in intersecting rows and columns, each of said memory cells storing therein a binary digit, each of said memory cells including a pair of pass transistors for providing external access to said memory cell, each of said pass transistors including a controlling electrode; and coincident pass transistor activation means, for activating only the controlling electrodes of the pair of pass transistors in a memory cell at an intersection of at least one selected row and at least one selected column, and for preventing activation of the controlling electrodes of the pairs of pass transistors in memory cells which are not at an intersection of the at least one selected row and the at least one selected column of said array of memory cells.

12. A Random Access Memory (RAM) comprising:

an array of memory cells arranged in intersecting rows and columns, each of said memory cells storing therein a binary digit, each of said memory cells including pass transistors for providing external access to said memory cells;

coincident pass transistor activation means, for activating only the pass transistors in a memory cell at an intersection of at least one selected row and at least one selected column, and for preventing activation of the pass transistors in memory cells which are not at an intersection of the at least one selected row and the at least one selected column of said array of memory cells; and a bit line between each pair of adjacent columns of said memory cells, for transferring binary data to and from said memory cells, the memory cells in each pair of adjacent columns being connected to said bit line therebetween.

13. A Random Access Memory (RAM) comprising:

an array of memory cells arranged in intersecting rows and columns, each of said memory cells storing therein a binary digit, each of said memory cells including pass transistors for providing external access to said memory cell;

coincident pass transistor activation means, for activating only the pass transistors in a memory cell at an intersection of at least one selected row and at least one selected column, and for preventing activation of the pass transistors in memory cells which are not at an intersection of the at least one selected row and the at least one selected column of said array of memory cells; and a plurality of word lines, a respective one of which is connected to a respective row of said memory cell array for selecting the at least one row of said memory cell array; and wherein said coincident pass transistor activation means comprises:

a plurality of column select lines, a respective one of which is connected to a respective column of said memory cell array for selecting the at least one column of said memory cell array; and gating means in each memory cell, electrically connected to at least one of the associated word line, the associated column select line and the associated pass transistors, for electrically activating the associated pass transistors only upon simultaneous selection of the associated column select line and the associated word line, and for preventing electrical activation of the associated pass transistors otherwise.

14. The RAM of claim 13 further comprising:

a bit line between each pair of adjacent columns of said memory cells, for transferring binary data to and from said memory cells, the memory cells in each pair of adjacent columns being connected to said bit line therebetween.

15. The RAM of claim 3 further comprising a plurality of bit lines, a respective at least one of which is connected to the memory cells in a respective column of said memory cell array, for transferring binary data to and from said memory cells;

wherein each of said memory cells comprises a first and a second complementary inverter, each of which includes an input and an output, with the input of the first complementary inverter being connected to the output of said second complementary inverter and the input of said second complementary inverter being connected to the output of said first complementary inverter, and wherein said pass transistors comprise a first and a second pass transistor each having a controlling electrode and a pair of controlled electrodes;

the controlled electrodes of said first pass transistors being electrically connected between an associated bit line and the output of the associated first complementary inverter, the controlled electrodes of said second pass transistors being electrically connected between an associated bit line and the output of the associated second complementary inverter;

wherein said gating means comprises a third complementary inverter having an input and an output, said third complementary inverter being electrically connected to the associated word line, the associated column select line and the controlling electrodes of said first and said second pass transistors.

16. The RAM of claim 15 wherein said plurality of bit lines comprise a plurality of shared bit lines, a respective one of which is connected to the memory cells in a respective pair of adjacent columns, the controlled electrodes of said first pass transistors being electrically connected between an associated shared bit line and the output of the associated first complementary inverter, and the controlled electrodes of the second pass transistors in an immediately preceding column being electrically connected between said associated shared bit line and the output of the associated second complementary inverter.

17. The RAM of claim 13 further comprising a plurality of bit lines, a respective at least one of which is connected to the memory cells in a respective column of said memory cell array, for transferring binary data to and from said memory cells;

wherein each of said memory cells comprises a first and a second complementary inverter, each of which includes an input and an output, with the input of the first complementary inverter being connected to the output of said second complementary inverter and the input of said second complementary inverter being connected to the output of said first complementary inverter, and wherein said pass transistors comprise a first and a second pass transistor each having a controlling electrode and a pair of controlled electrodes;

the controlled electrodes of said first pass transistors being electrically connected between an associated bit line and the output of the associated first complementary inverter, the controlled electrodes of said second pass transistors being electrically connected between an associated bit line and the output of the associated second complementary inverter;

wherein said gating means comprises:

a transistor having a controlling electrode and a pair of controlled electrodes, the transistor being connected between the associated word line, the associated column select line and the controlling electrodes of said pass transistors; and a resistor, electrically connected to the controlling electrodes of said pass transistors.

18. The RAM of claim 17 wherein said plurality of bit lines comprise a plurality of shared bit lines, a respective one of which is connected to the memory cells in a respective pair of adjacent columns, the controlled electrodes of said first pass transistors being electrically connected between an associated shared bit line and the output of the associated first complementary inverter, and the controlled electrodes of the second pass transistors in an immediately preceding column being electrically connected between said associated shared bit line and the output of the associated second complementary inverter.

19. The RAM of claim 13 further comprising a plurality of bit lines, a respective at least one of which is connected to the memory cells in a respective column of said memory cell array, for transferring binary data to and from said memory cells;

wherein each of said memory cells comprises a first and a second complementary inverter, each of which includes an input and an output, with the input of the first complementary inverter being connected to the output of said second complementary inverter and the input of said second complementary inverter being connected to the output of said first complementary inverter, and wherein said pass transistors comprise a first and a second pass transistor each having a controlling electrode and a pair of controlled electrodes;

wherein said gating means comprises:

a third and a fourth transistor, each having a controlling electrode and a pair of controlled electrodes, the controlled electrodes of said first pass transistor and said third transistor being serially connected between the associated bit line and the output of said first complementary inverter, the controlled electrodes of said second pass transistor and said fourth transistor being serially connected between the associated bit line and the output of said second complementary inverter, the controlling electrode of one of said first pass transistor and said third transistor being connected to the associated word line and the controlling electrode of the other of said first pass transistor and said third transistor being connected to the associated column select line, the controlling electrode of one of said second pass transistor and said fourth transistor being connected to said associated word line and the controlling electrode of the other of said second pass transistor and said fourth transistor being connected to the associated column select line.

20. The RAM of claim 19 wherein said plurality of bit lines comprise a plurality of shared bit lines, a respective one of which is connected to the memory cells in a respective pair of adjacent columns, the controlled electrodes of said first pass transistors and said third transistors being serially connected between an associated shared bit line and the output of the associated first complementary inverter, and the controlled electrodes of said second pass transistors and said fourth transistors in an immediately preceding column being serially connected between said associated shared bit line and the output of the associated second complementary inverter.

21. A Random Access Memory (RAM) comprising:
an array of memory cells arranged in a first plurality of rows and a second plurality of columns, each of said memory cells adapted for storing therein a binary digit, each of said memory cells including a pair of pass transistors for providing external access to said memory cell, each of said pass transistors including a controlling electrode; and
means for activating the controlling electrodes of only one pair of pass transistors in only one of said memory cells, with the controlling electrodes of pass transistor pairs in all other memory cells in said array being deactivated.

22. A Random Access Memory (RAM) comprising:
an array of memory cells arranged in a first plurality of rows and a second plurality of columns, each of said memory cells adapted for storing therein a binary digit, each of said memory cells including a pair of pass transistors for providing external access to said memory cell;
means for activating only one pair of pass transistors in only one of said memory cells, with the pass transistor pairs in all other memory cells in said array being deactivated; and
a bit line between each pair of adjacent columns of said memory cells, for transferring binary data to and from said memory cells, the memory cells in each pair of adjacent columns being connected to said bit line therebetween.

23. A Random Access Memory (RAM) comprising:
an array of memory cells arranged in a first plurality of rows and a second plurality of columns, each of said memory cells adapted for storing therein a binary digit, each of said memory cells including a pair of pass transistors for providing external access to said memory cell;
means for activating only one pair of pass transistors in only one of said memory cells, with the pass transistor pairs in all other memory cells in said array being deactivated; and
a plurality of word lines, a respective one of which is connected to a respective row of said memory cell array for selecting a row of said memory cell array;
and wherein said pass transistor activating means comprises:
a plurality of column select lines, a respective one of which is connected to a respective column of said memory cell array for selecting a column of said memory cell array; and
gating means in each memory cell, electrically connected to at least one of the associated word line, the associated column select line and the associated pass transistors, for electrically activating the associated pass transistors only upon simultaneous selection of the associated column select line and the associated word line, and for preventing electrical activation of the associated pass transistors otherwise.

24. The RAM of claim 23 further comprising:
a bit line between each pair of adjacent columns of said memory cells, for transferring binary data to and from said memory cells, the memory cells in each pair of adjacent columns being connected to said bit line therebetween.

25. The RAM of claim 23 further comprising a plurality of bit lines, a respective at least one of which is connected to the memory cells in a respective column of said memory cell array, for transferring binary data to and from said memory cells;
wherein each of said memory cells comprises a first and a second complementary inverter, each of which includes an input and an output, with the input of the first complementary inverter being connected to the output of said second complementary inverter and the input of said second complementary inverter being connected to the output of said first complementary inverter, and wherein said pass transistors comprise a first and a second pass transistor each having a controlling electrode and a pair of controlled electrodes;
the controlled electrodes of said first pass transistors being electrically connected between an associated bit line and the output of the associated first complementary inverter, the controlled electrodes of said second pass transistors being electrically connected between an associated bit line and the output of the associated second complementary inverter;
wherein said gating means comprises a third complementary inverter having an input and an output, said third complementary inverter being electrically connected to the associated word line, the associated column select line and the controlling electrodes of said first and said second pass transistors.

26. The RAM of claim 25 wherein said plurality of bit lines comprise a plurality of shared bit lines, a respective one of which is connected to the memory cells in a respective pair of adjacent columns, the controlled electrodes of said first pass transistors being electrically connected between an associated shared bit line and the output of the associated first complementary inverter, and the controlled electrodes of the second pass transistors in an immediately preceding column being electrically connected between said associated shared bit line and the output of the associated second complementary inverter.

27. The RAM of claim 23 further comprising a plurality of bit lines, a respective at least one of which is connected to the memory cells in a respective column of said memory cell array, for transferring binary data to and from said memory cells;

wherein each of said memory cells comprises a first and a second complementary inverter, each of which includes an input and an output, with the input of the first complementary inverter being connected to the output of said second complementary inverter and the input of said second complementary inverter being connected to the output of said first complementary inverter, and wherein said pass transistors comprise a first and a second pass transistor each having a controlling electrode and a pair of controlled electrodes;

the controlled electrodes of said first pass transistors being electrically connected between an associated bit line and the output of the associated first complementary inverter, the controlled electrodes of said second pass transistors being electrically connected between an associated bit line and the output of the associated second complementary inverter;

wherein said gating means comprises:
a transistor having a controlling electrode and a pair of controlled electrodes, the transistor being connected between the associated word line, the associated column select line and the controlling electrodes of said pass transistors; and
a resistor, electrically connected to the controlling electrodes of said pass transistors.

28. The RAM of claim 27 wherein said plurality of bit lines comprise a plurality of shared bit lines, a respective one of which is connected to the memory cells in a respective pair of adjacent columns, the controlled electrodes of said first pass transistors being electrically connected between an associated shared bit line and the output of the associated first complementary inverter, and the controlled electrodes of the second pass transistors in an immediately preceding column being electrically connected between said associated shared bit line and the output of the associated second complementary inverter.

29. The RAM of claim 23 further comprising a plurality of bit lines, a respective at least one of which is connected to the memory cells in a respective column of said memory cell array, for transferring binary data to and from said memory cells;

wherein each of said memory cells comprises a first and a second complementary inverter, each of which includes an input and an output, with the input of the first complementary inverter being connected to the output of said second complementary inverter and the input of said second complementary inverter being connected to the output of said first complementary inverter, and wherein said pass transistors comprise a first and a second pass transistor each having a controlling electrode and a pair of controlled electrodes;

wherein said gating means comprises:
a third and a fourth transistor, each having a controlling electrode and a pair of controlled electrodes, the controlled electrodes of said first pass transistor and said third transistor being serially connected between the associated bit line and the output of said first complementary inverter, the controlled electrodes of said second pass transistor and said fourth transistor being serially connected between the associated bit line and the output of said second complementary inverter, the controlling electrode of one of said first pass transistor and said third transistor being connected to the associated word line and the controlling electrode of the other of said first pass transistor and said third transistor being connected to the associated column select line, the controlling electrode of one of said second pass transistor and said fourth transistor being connected to said associated word line and the controlling electrode of the other of said second pass transistor and said fourth transistor being connected to the associated column select line.

30. The RAM of claim 29 wherein said plurality of bit lines comprise a plurality of shared bit lines, a respective one of which is connected to the memory cells in a respective pair of adjacent columns, the controlled electrodes of said first pass transistors and said third transistors being serially connected between an associated shared bit line and the output of the associated first complementary inverter, and the controlled electrodes of said second pass transistors and said fourth transistors in an immediately preceding column being serially connected between said associated shared bit line and the output of the associated second complementary inverter.

31. A Static Random Access Memory (SRAM) cell comprising:
a first transistor of first conductivity type and a second transistor of second conductivity type, the controlled electrodes of which are serially connected between first and second reference voltages with a first connection node therebetween;
a third transistor of said first conductivity type and a fourth transistor of said second conductivity type, the controlled electrodes of which are serially connected between said first and second reference voltages with a second connection node therebetween; the controlling electrodes of said first and second transistors being connected to ;said second connection node and the controlling electrodes of said third and fourth transistors being connected to said first connection node;
a word line;
a first bit line and a second bit line;
a column select line;
pass transistors comprising a fifth transistor connected to said first bit line and a sixth transistor connected to said second bit line; and
gating means, connected to at least one of said word line said column select line and said pass transistors, for activating said pass transistors only upon simultaneous activation of said word line and said column select line, and for preventing activation of said pass transistors otherwise.

32. The SRAM cell of claim 31 in combination with a second SRAM cell which is identical to said SRAM cell, the first bit line of said SRAM cell and the second bit line of said second SRAM cell being a single shared bit line, with said fifth transistor of said SRAM cell and said sixth transistor of said second SRAM cell being connected to said single shared bit line.

33. The SRAM cell of claim 31 in combination with a second SRAM cell which is identical to said SRAM cell, the second bit line of said SRAM cell and the first bit line of said second SRAM cell being a single shared bit line, with said sixth transistor of said SRAM cell and said fifth transistor of said second SRAM cell being connected to said single shared bit line.

34. The SRAM cell of claim 31 wherein said gating means comprises:
a seventh transistor of said first conductivity type and an eighth transistor of said second conductivity type, the controlled electrodes of which are serially connected between one of said word line and said column select line, and a reference voltage, with a third connection node therebetween;
the controlling electrodes of said seventh and said eighth transistors being connected to the other of said word line and said column select line, said third connection node being connected to the controlling electrodes of said fifth and said sixth transistors;
the controlled electrodes of said fifth transistor being connected between said first bit line and said second connection node; and
the controlled electrodes of said sixth transistor being connected between said second bit line and said first connection node.

35. The SRAM cell of claim 34 in combination with a second SRAM cell which is identical to said SRAM cell, the first bit line of said SRAM cell and the second bit line of said second SRAM cell being a single shared bit line, with a controlling electrode of said fifth transistor of said SRAM cell and a controlling electrode of said sixth transistor of said second SRAM cell being connected to said single shared bit line.

36. The SRAM cell of claim 34 in combination with a second SRAM cell which is identical to said SRAM cell, the first bit line of said SRAM cell and the second bit line of said second SRAM cell being a single shared bit line, with a controlling electrode of said sixth transistor of said SRAM cell and a controlling electrode of said fifth transistor of said second SRAM cell being connected to said single shared bit line.

37. The SRAM cell of claim 31 wherein said gating means comprises:
a seventh transistor and a resistor, which are serially connected between said one of said word line and said column select line, and a reference voltage, with a third connection node therebetween;
the controlling electrode of said seventh transistor being connected to the other of said word line and said column select line, said third connection node being connected to the controlling electrodes of said fifth and said sixth transistors;
the controlled electrodes of said fifth transistor being connected between said first bit line and said second connection node; and
the controlled electrodes of said sixth transistor being connected between said second bit line and said first connection node.

38. The SRAM cell of claim 37 in combination with a second SRAM cell which is identical to said SRAM cell, the first bit line of said SRAM cell and the second bit line of said second SRAM cell being a single shared bit line, with a controlling electrode of said fifth transistor of said SRAM cell and a controlling electrode of said sixth transistor of said second SRAM cell being connected to said single shared bit line.

39. The SRAM cell of claim 37 in combination with a second SRAM cell which is identical to said SRAM cell, the first bit line of said SRAM cell and the second bit line of said second SRAM cell being a single shared bit line, with a controlling electrode of said sixth transistor of said SRAM cell and a controlling electrode of said fifth transistor of said second SRAM cell being connected to said single shared bit line.

40. The SRAM cell of claim 31 wherein said gating means comprises:
a seventh transistor, the controlled electrodes of which and the controlled electrodes of said fifth transistor are serially connected between said first bit line and said second connection node;
an eighth transistor, the controlled electrodes of which and the controlled electrodes of said sixth transistor are serially connected between said second bit line and said first connection node;
the controlling electrodes of said seventh and said eighth transistors being connected to said column select line; and
the controlling electrodes of said fifth and sixth transistors being connected to said word line.

41. The SRAM cell of claim 40 in combination with a second SRAM cell which is identical to said SRAM cell, the first bit line of said SRAM cell and the second bit line of said second SRAM cell being a single shared bit line, with a controlling electrode of said fifth transistor of said SRAM cell and a controlling electrode of said sixth transistor of said second SRAM cell being connected to said single shared bit line.

42. The SRAM cell of claim 40 in combination with a second SRAM cell which is identical to said SRAM cell, the first bit line of said SRAM cell and the second bit line of said second SRAM cell being a single shared bit line, with a controlling electrode of said sixth transistor of said SRAM cell and a controlling electrode of said fifth transistor of said second SRAM cell being connected to said single shared bit line.

43. A Static Random Access Memory (SRAM) cell comprising:
a first transistor of first conductivity type and a second transistor of second conductivity type, the controlled electrodes of which are serially connected between first and second reference voltages with a first connection node therebetween;
a third transistor of said first conductivity type and a fourth transistor of said second conductivity type, the controlled electrodes of which are serially connected between said first and second reference voltages with a second connection node therebetween; the controlling electrodes of said first and second transistors being connected to said second connection node and the controlling electrodes of said third and fourth transistors being connected to said first connection node;
a word line;
a first bit line and a second bit line;
a column select line;
pass transistors comprising a fifth transistor connected to said first bit line and a sixth transistor connected to said second bit line;
a seventh transistor of said first conductivity type and an eighth transistor of said second conductivity type, the controlled electrodes of which are serially connected between one of said word line and said bit line, and said second reference voltage, with a third connection node therebetween;

the controlling electrodes of said seventh and said eighth transistors being connected to the other of said column select line and said bit line, said third connection node being connected to the controlling electrodes of said fifth and said sixth transistors;

the controlled electrodes of said fifth transistor being connected between said first bit line and said second connection node; and the controlled electrodes of said sixth transistor being connected between said second bit line and said first connection node.

44. The SRAM cell of claim 43 in combination with a second SRAM cell which is identical to said SRAM cell, the first bit line of said SRAM cell and the second bit line of said second SRAM cell being a single shared bit line, with a controlling electrode of said fifth transistor of said SRAM cell and a controlling electrode of said sixth transistor of said second SRAM cell being connected to said single shared bit line.

45. The SRAM cell of claim 43 in combination with a second SRAM cell which is identical to said SRAM cell, the first bit line of said SRAM cell and the second bit line of said second SRAM cell being a single shared bit line, with a controlling electrode of said sixth transistor of said SRAM cell and a controlling electrode of said fifth transistor of said second SRAM cell being connected to said single shared bit line.

46. The SRAM cell of claim 43 wherein said seventh and eighth transistors are minimum geometry transistors.

47. The SRAM of claim 43 wherein the controlled electrodes of said seven and said eighth transistors are serially connected between said word line and said second reference voltage, and wherein the controlling electrodes of said seventh and said eighth transistors are connected to said column select line.

48. The SRAM of claim 43 wherein the controlled electrodes of said seven and said eighth transistors are serially connected between said column select line and said second reference voltage, and wherein the controlling electrodes of said seventh and said eighth transistors are connected to said word line.

* * * * *